(12) United States Patent
Nishizawa et al.

(10) Patent No.: US 8,198,948 B2
(45) Date of Patent: Jun. 12, 2012

(54) VIBRATOR ELEMENT, SENSOR DEVICE, SENSOR, AND ELECTRONIC APPARATUS

(75) Inventors: Ryuta Nishizawa, Suwa (JP); So Ichikawa, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/044,012

(22) Filed: Mar. 9, 2011

(65) Prior Publication Data

US 2011/0227657 A1 Sep. 22, 2011

(30) Foreign Application Priority Data

Mar. 17, 2010 (JP) ................................ 2010-060336
Nov. 5, 2010 (JP) ................................ 2010-248165

(51) Int. Cl.
*H01L 41/00* (2006.01)
*H03B 5/30* (2006.01)
*H03B 5/32* (2006.01)

(52) U.S. Cl. ........ 331/156; 331/158; 310/365; 310/366; 310/367

(58) Field of Classification Search .................. 331/154, 331/156, 158; 310/365–371
See application file for complete search history.

(56) References Cited

U.S. PATENT DOCUMENTS

| | | | |
|---|---|---|---|
| 4,415,827 A | 11/1983 | Chuang | |
| 5,285,127 A * | 2/1994 | Egley et al. | ............... 310/366 |
| 2008/0087083 A1 | 4/2008 | Nishizawa et al. | |

FOREIGN PATENT DOCUMENTS

| | | |
|---|---|---|
| GB | 1425435 | 3/1974 |
| JP | 49-123788 | 11/1974 |
| JP | 57-199311 | 12/1982 |
| JP | 02-032229 | 2/1990 |
| JP | 10-206162 | 8/1998 |
| JP | 2005-197946 | 7/2005 |
| JP | 2006-352771 | 12/2006 |
| JP | 2008-042794 | 2/2008 |
| JP | 2009-005022 | 1/2009 |
| JP | 2009-165164 | 7/2009 |

* cited by examiner

*Primary Examiner* — David Mis
(74) *Attorney, Agent, or Firm* — Harness, Dickey & Pierce, P.L.C.

(57) ABSTRACT

A vibrator element includes: a base part; and a vibrating arm extended from the base part in a first direction, the vibrating arm including a first region, a second region, and a third region sequentially arranged from the base part side in the first direction, the first region to the third region including first electrodes and second electrodes that generate electric fields in second directions perpendicular to the first direction in a plan view and are electrically independent from each other, wherein electric field directions of the first region and the third region and an electric field direction of the second region are opposite to each other, and the vibrating arm is expanded and contracted in the first direction by the electric fields in the second directions, and the vibrating arm is vibrated in third directions as directions perpendicular to the respective first direction and second directions.

11 Claims, 28 Drawing Sheets

FIG. 1A

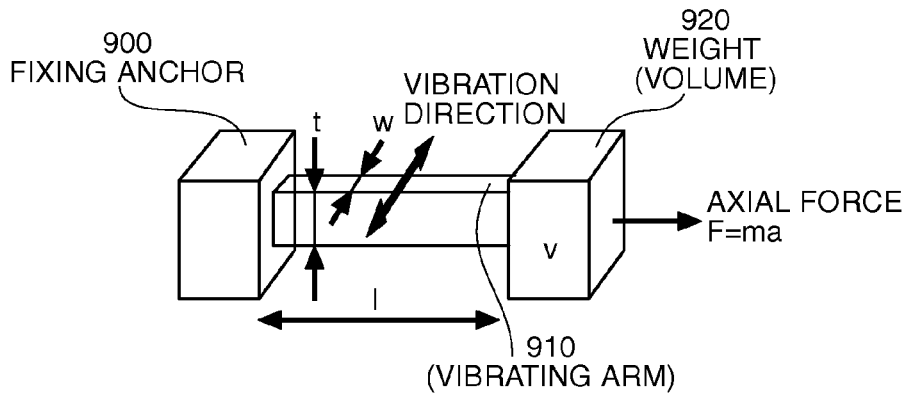

900 FIXING ANCHOR
920 WEIGHT (VOLUME)
VIBRATION DIRECTION
AXIAL FORCE F=ma
910 (VIBRATING ARM)

FIG. 1B (RESONANCE FREQUENCY)

$$f = f_n \sqrt{1 + \frac{m \cdot a \cdot l^2}{\beta^2 \cdot E \cdot I}} \quad \text{----- (1)}$$

$$f_n = \frac{\beta^2}{2\pi \cdot l^2} \sqrt{\frac{E \cdot I}{\rho_{res} \cdot A}} = \frac{\beta^2 \cdot w}{2\pi \cdot l^2} \sqrt{\frac{E}{12 \rho_{res}}} \quad \text{----- (2)}$$

- l : LENGTH OF VIBRATING ARM (BEAM OF OSCILLATOR)
- w : ARM WIDTH OF VIBRATING ARM
   (WIDTH IN VIBRATION DIRECTION)
- t : THICKNESS OF VIBRATING ARM
- m : MASS OF WEIGHT   $m = v \cdot \rho_{mass}$
- a : ACCELERATION INPUT
- $\beta$ : CONSTANT DETERMINED BY SUPPORT CONDITION
   (FOR EXAMPLE, DOUBLE-TURNING-FORK OR DUAL-SUPPORT
   4.730 IN FIRST-ORDER MODE)
- E : YOUNG'S MODULUS OF OSCILLATOR
- I : SECTION OF BEAM OF OSCILLATOR
   SECOND MOMENT   $I = (t \cdot w^3)/12$
- A : SECTIONAL AREA OF BEAM OF OSCILLATOR   $A = t \cdot w$

FIG. 1C (DEVICE SENSITIVITY)

$$\frac{\Delta f}{f_n} = \frac{f - f_n}{f_n} = \sqrt{1 + \frac{m \cdot a \cdot l^2}{\beta^2 \cdot E \cdot I}} - 1 \cong 1 + \frac{1}{2} \frac{m \cdot a \cdot l^2}{\beta^2 \cdot E \cdot I} - 1 = \frac{m \cdot a \cdot l^2}{2\beta^2 \cdot E \cdot I} = \frac{v \cdot \rho_{mass} \cdot l^2}{2 \cdot \beta^2 \cdot E \cdot \frac{w^3 \cdot t}{12}}$$

$$= \underbrace{\frac{6 \cdot \rho_{mass} \cdot a}{\beta^2 \cdot E}}_{\text{DIMENSION-INDEPENDENT}} \underbrace{\frac{v \cdot l^2}{w^3 \cdot t}}_{\text{DIMENSION-DEPENDENT}} \quad \text{----- (3)}$$

FIG. 3A
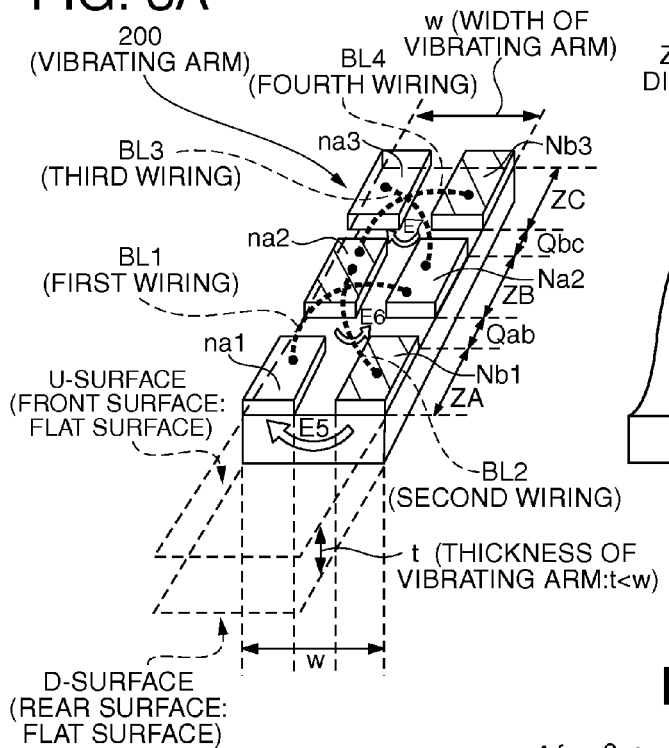
FIG. 3B
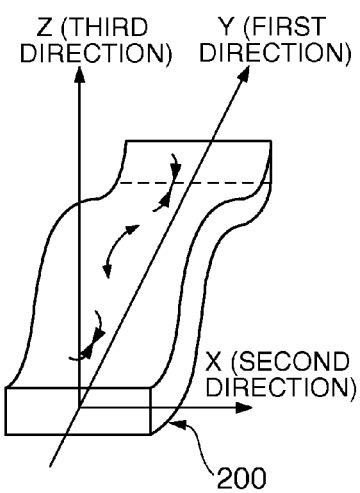
FIG. 3C
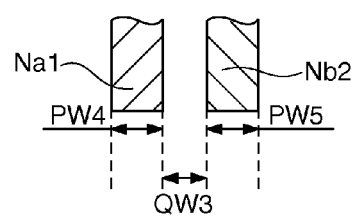
FIG. 3D
$$\frac{\Delta f}{f_n} = \frac{6 \cdot \rho_{mass} \cdot a}{\beta^2 \cdot E} \cdot \frac{v \cdot l^2}{t^3 \cdot w} \quad \text{-----(4)}$$
DIMENSION-INDEPENDENT    DIMENSION-DEPENDENT
FIG. 3E
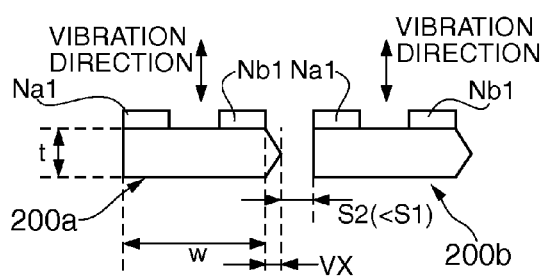
FIG. 3F
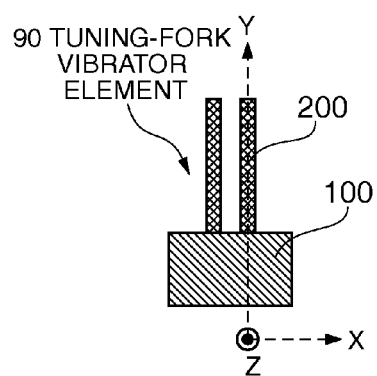

| | $E_x$ | $E_y$ | $E_z$ |
|---|---|---|---|
| $S_x$ (d11) | 2.30850823 | 0.00000000 | 0.00000000 |
| $S_y$ (d12) | -2.28778103 | 0.00000000 | 0.00000000 |
| $S_z$ | -0.02072720 | 0.00000000 | 0.00000000 |
| $S_{yz}$ | 0.85144742 | 0.00000000 | 0.00000000 |
| $S_{xz}$ | 0.00000000 | -0.61031279 | 0.01598160 |
| $S_{xy}$ | 0.00000000 | -4.63299806 | 0.12131932 |

PIEZOELECTRIC CONSTANT (d CONSTANT)
OF EULER ANGLE (0,1.5,0) QUARTZ PLATE

CONDITION:
- ARM WIDTH OF VIBRATING ARM  w ≒ 100μm
- LENGTH OF ARM  l ≒ 2000μm
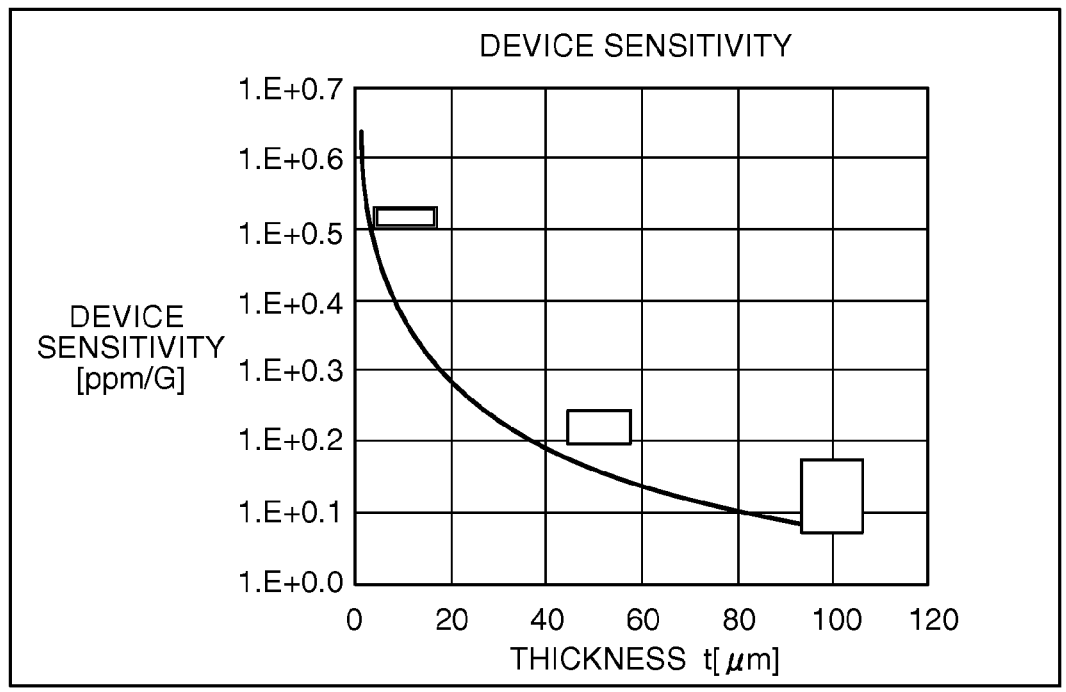
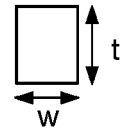
SHAPE OF VIBRATING ARM SECTION
FIG. 5

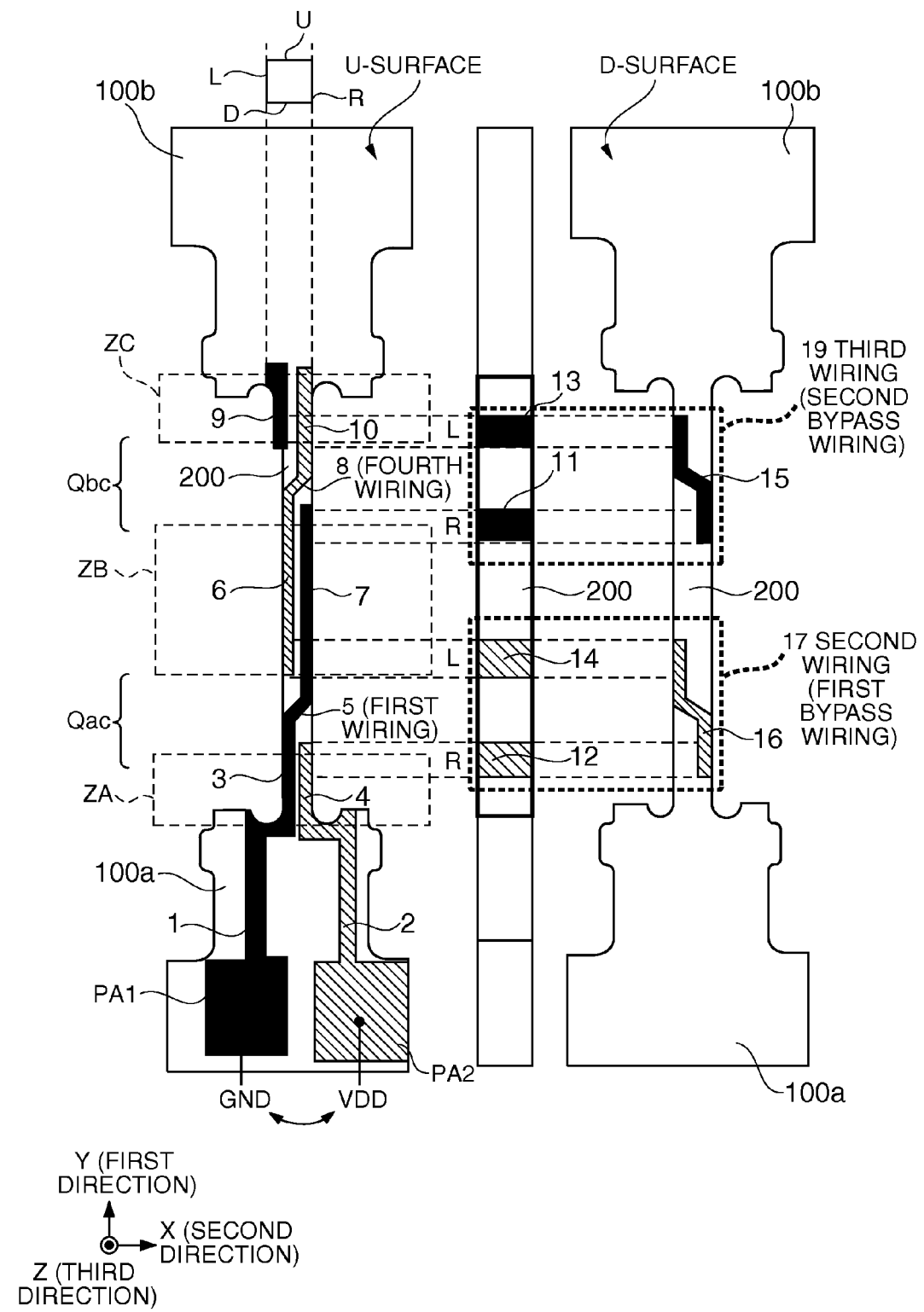

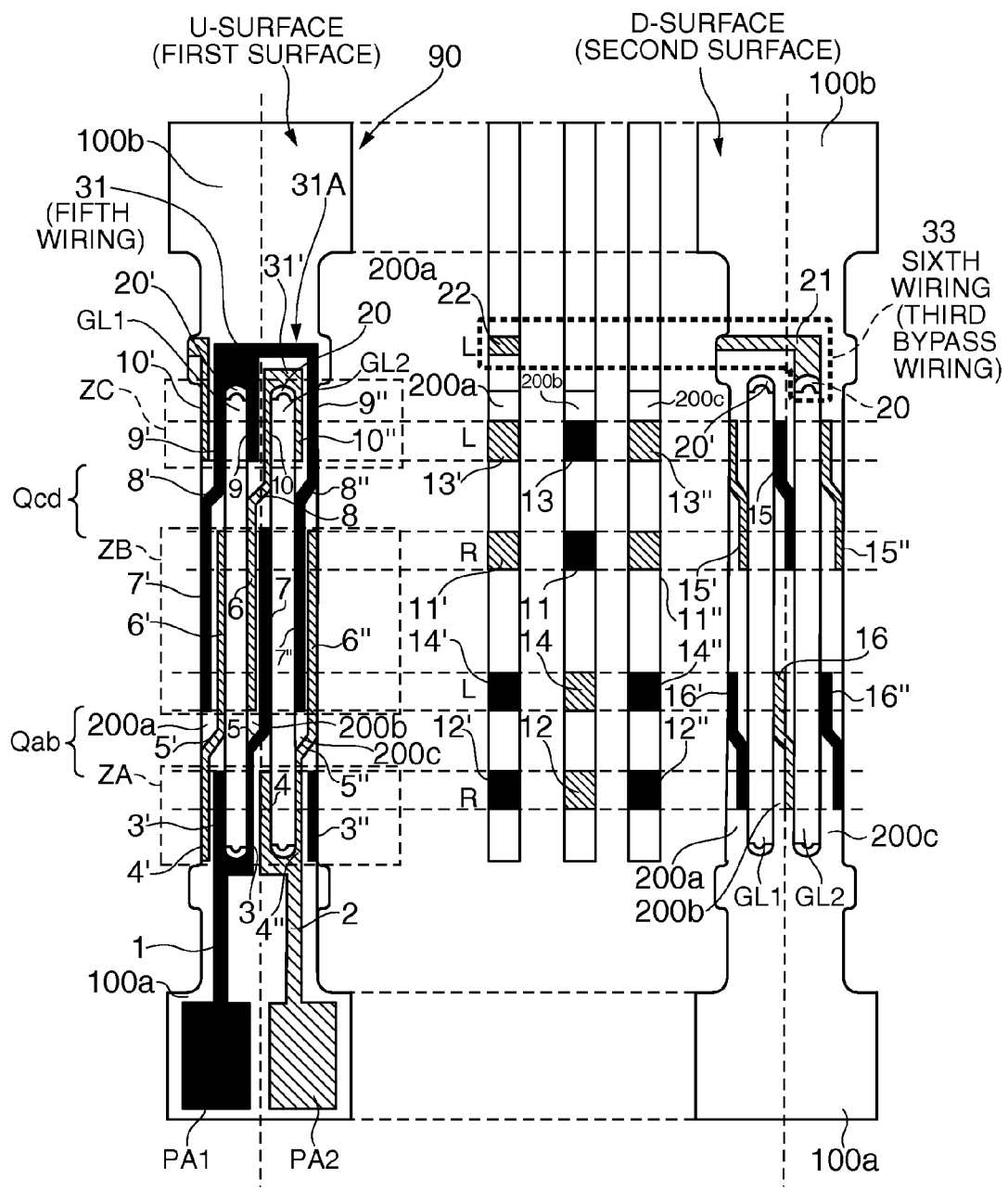

VIBRATOR ELEMENT, SENSOR DEVICE, SENSOR, AND ELECTRONIC APPARATUS

BACKGROUND

1. Technical Field

The present invention relates to a vibrator element, a sensor device, a sensor, and an electronic apparatus.

2. Related Art

A tuning-fork vibrator element (tuning-fork piezoelectric vibrator element) as an example of a vibrator element is a vibrating member that may be a component element of an oscillator, a sensor device, or the like, and has at least one base part and at least one vibrating arm (vibrating beam) of a piezoelectric material articulated (connected) to the base part.

For example, when a voltage (electric field) is applied to quartz crystal as a piezoelectric material, the quartz crystal is deformed. The quartz crystal develops inductive reactance characteristics like a coil in a particular frequency band near its natural frequency. Electronic component with application of this principle is a quartz oscillator.

A tuning-fork quartz oscillator is manufactured by housing the tuning-fork vibrator element in a package and vacuum-sealing the interior of the package, for example. The quartz oscillator is used as a component part of an oscillation circuit, for example.

Further, the tuning-fork vibrator element may also be used as a sensor device (for example, a force sensing device) for detecting a physical quantity (an acceleration, pressure, an angular velocity, an angular acceleration, or the like). Since the quartz crystal has advantageous temperature stability and a high Q-value, a sensor with high accuracy, high stability, and high reliability is realized using the quartz oscillator. An example of using the tuning-fork vibrator element as a force sensing device is disclosed in Patent Document 1 (JP-A-2006-352771), for example.

FIGS. 30A and 30B are diagrams for explanation of a configuration and a principle of the force sensing device described in Non-Patent Document 1 (W. C. Albert, Force sensing using quartz crystal flexure resonators, 38th Annual Frequency Control Symposium 1984, pp 233-239. As shown FIG. 30A, a tuning-fork vibrator element has a base part MT, two vibrating arms (BE1, BE2) connected to the base part MT, and a weight part AR.

The two vibrating arms (BE1, BE2) vibrate at a resonance frequency in directions perpendicular to an extending direction of the respective vibrating arms. In this state, when an acceleration is applied to the weight part AR, for example, the weight part AR bends in an out-of-plane direction due to an inertia force FC(+) (or an inertia force FC(−) in the opposite direction), and thereby, the vibrating arms (BE1, BE2) are expanded and contracted, and the vibration frequency of the vibrating arms (BE1, BE2) changes as shown in FIG. 30B.

The vibration frequency f of the vibrating arms (BE1, BE2) is nearly proportional to the magnitude of the inertia force FC(+) (or the inertia force FC(−)) applied to the weight part AR and nearly linearly changes. Thereby, by detecting the change of the vibration frequency of the vibrating arms (BE1, BE2), the acceleration may be detected.

Recently, the higher functionality and the reduction in size and weight of an electronic apparatus are advanced, and there are needs for further improvements in detection sensitivity of sensor devices and needs for further reduction in size of the oscillators and sensor devices in response. The development of small vibrator elements that fulfill the needs is an important challenge for the future.

Note that, as a quartz crystal plate, for example, a Z-plate (may be referred to as "nearly Z-plate") or an X-plate (may be referred to as "nearly X-plate") is used. The Z-plate (nearly Z-plate) is a quartz crystal plate with a surface (front surface or rear surface) of the crystal plate as a Z-surface (nearly Z-surface) perpendicular (nearly perpendicular) to the optical axis (Z-axis) of the quartz crystal. The Z-surface may be referred to as a surface defined by an electrical axis (X-axis) and a mechanical axis (Y-axis).

Further, the X-plate (nearly X-plate) is a quartz crystal plate with a surface (a front surface or a rear surface) as an X-surface perpendicular (nearly perpendicular) to the electrical axis (X-axis) of the quartz crystal. The X-surface may be referred to as a surface defined by the mechanical axis (Y-axis) and the optical axis (Z-axis).

Downsizing of the tuning-fork vibrator element is described in Patent Document 1, for example.

The tuning-fork vibrator element (piezoelectric vibrator element) described in Patent Document 1 is formed by processing the Z-plate of quartz crystal using photolithography as a semiconductor manufacturing technology.

The direction of the flexural vibration of the vibrating arms is an X-axis direction (a direction along the width of the vibrating arms).

In the technology disclosed in Patent Document 1, downsizing is realized while the resonance frequency of the tuning-fork vibrator element (piezoelectric vibrator element) is maintained by reducing the width of the vibrating arms while shortening the length of the vibrating arms.

Further, suppression of CI-value and suppression of oscillation due to second-order harmonics are realized by forming long grooves along the longitudinal direction of the vibrating arms and employing the vibrating arm shape in which the width dimension of the vibrating arm gradually decreases from the base part toward the leading end, and then, increases.

Patent Document 2 (JP-A-2009-5022) discloses a technology of vibrating arms along the Z-axis direction (the thickness direction of the quartz crystal plate). Note that, in the technology described in Patent Document 2, the quartz crystal plate is only used as an elastic material.

That is, a piezoelectric film is formed on the surfaces of the arm parts made of quartz crystal as the elastic material. As a cross-section structure of the arm parts, a structure in which the piezoelectric film is sandwiched between upper and lower electrodes is employed, and, when a voltage is applied to the upper and lower electrodes, the piezoelectric film flexes along the Z-axis direction.

Further, Patent Document 3 (JP-A-2005-197946) discloses a technology of realizing flat temperature coefficient characteristics by producing vibration B (first-order Z reverse-phase flexural vibration: first-order walk mode) in the Z-axis direction in addition to the vibration A (fundamental harmonic X flexural vibration) in the X-axis direction, coupling the vibration A and the vibration B by nonlinear parametric vibration phenomenon, and compensating for the second-order temperature coefficient of the vibration A.

Furthermore, Patent Document 4 (JP-A-2009-165164) describes a structure in which electrodes are respectively provided on vibrating arm (vibrating rod) front surfaces, rear surfaces, left side surfaces, and right side surfaces in a tuning-fork quartz oscillator (FIGS. 2 and 4 of Patent Document 4 show an example in which grooves are formed in the longitudinal direction of the vibrating arms and electrodes are also formed within the grooves, and further, FIG. 13 describes an electrode arrangement example as a related art).

In addition, Patent Document 5 (JP-A-2008-42794) describes an example of a manufacturing method of manufacturing a tuning-fork quartz oscillator using photolithography.

In order to improve device sensitivity (detection sensitivity) of a sensor device, reduction (downsizing) of the width of the vibrating arms in a vibrator element is effective. However, it is undeniable that, as the width of the vibrating arms is smaller, the distance between the electrodes for applying a voltage (electric field) to the vibrating arms becomes smaller, and short circuit of the electrodes becomes easier to occur. Further, it is also undeniable that the wiring width is forced to be made smaller, and therefore, disconnection of wiring becomes easier to occur.

Furthermore, in the tuning-fork vibrator element having plural vibrating arms, the respective vibrating arms are extended in parallel from the base part toward the first direction. Since the respective vibrating arms vibrate in the width direction of the respective vibrating arms (a second direction perpendicular to the first direction in a plan view, in other words, the arrangement direction of the respective vibrating arms), it is necessary to provide the respective vibrating arms apart at a predetermined distance in the second direction not to inhibit the vibration of one another.

Thereby, reduction in size of the vibrating arms of the tuning-fork vibrator element in the width direction (second direction) (i.e., the reduction of the distances between the respective vibrating arms) have limitations.

Further, in the case where the quartz crystal plate is processed by wet etching, unwanted fin portions (irregular shape portions) are formed on the side surfaces of the respective vibrating arms due to etching anisotropy of the quartz crystal, and the side surfaces of the vibrating arms are not flat in a microscopic sense.

In this case, for setting the distances between the respective vibrating arms, it is necessary to allow for margins (positional margins) in view of the fin portions formed on the side surfaces of the vibrating arms.

In this manner, if the reduction of the width of the vibrating arms is promoted to improve the device sensitivity of the sensor devices, a problem of formation of electrodes and wirings becomes apparent. Further, as downsizing of the vibrator element is promoted, in the tuning-fork quartz vibrator element having plural vibrating arms, also a problem that reduction of the distances between the respective vibrating arms becomes difficult arises.

The quartz vibrator elements (piezoelectric vibrator elements) disclosed in Patent Document 1, Patent Document 4, and Patent Document 5 have a commonality in which the vibrating arm extended in the first direction is flexurally vibrated in the width direction of the vibrating arm. It is undeniable that, if an attempt to further promote the reduction of the width of the vibrating arms and the reduction of the distances between the plural vibrating arms is made, the above described disadvantages become apparent.

Note that Patent Document 2 discloses the vibration of the vibrating arm in the thickness direction of the vibrating arm, however, the vibrating arm in Patent Document 2 does not directly use the piezoelectric effect of the elastic material (quartz crystal plate), but have a special structure for producing flexural vibration by laminating the upper and lower electrodes and the piezoelectric film on the elastic material and using the laminated structure containing the piezoelectric film.

Accordingly, in the case where the quartz crystal plate as the elastic material is also used as a piezoelectric material for producing vibration (that is, a typical quartz vibrator element structure is used), any technology is not disclosed on how the flexural vibration in the thickness direction of the vibrating arm is produced.

Further, Patent Document 3 discloses a technology of flattening the temperature characteristics of the sensor device by secondarily producing the flexural vibration in the thickness direction of the vibrating arm. Note that the vibration in the thickness direction in this case is absolutely the secondary vibration, the fundamental vibration is the traditional flexural vibration in the width direction of the vibrating arm, and the secondary flexural vibration in the thickness direction is only added to the fundamental flexural vibration.

Furthermore, in the technology disclosed in Patent Document 3, there is no study or suggestion on promotion of downsizing in view of improvements in device sensitivity of the sensor device using the vibrator element or promotion of downsizing of the vibrating arm in the width direction of the sensor device.

SUMMARY

An advantage of some aspects of the invention is to improve device sensitivity (hereinafter, may simply be referred to as sensitivity) of a sensor device. Another advantage some aspects of the invention is to promote downsizing of a vibrator element.

(1) A vibrator element according to an aspect of the invention includes a base part, a vibrating arm extending in a first direction with an end connected to the base part, and a first electrode and a second electrode that are provided on the vibrating arm, generate an electric field in a second direction perpendicular to the first direction, and are electrically independent from each other, wherein the vibrating arm is expanded and contracted in the first direction by the electric field in the second direction and the vibrating arm is vibrated in a third direction perpendicular to the respective first direction and second direction.

Further, as another aspect, a vibrator element includes a base part and a vibrating arm extended from the base part in a first direction, the vibrating arm includes a first region, a second region, and a third region sequentially arranged from the base part side in the first direction, the first region to the third region include first electrodes and second electrodes that generate electric fields in second directions perpendicular to the first direction in a plan view and are electrically independent from each other, wherein electric field directions of the first region and the third region and an electric field direction of the second region are opposite to each other, and the vibrating arm is expanded and contracted in the first direction by the electric fields in the second directions, and the vibrating arm is vibrated in third directions as directions perpendicular to the respective first direction and second directions.

In the aspect, the vibration of the vibrating arm is an out-of-plane vibration (the vibration in the third directions), and thus, the factor having the greatest influence on the device sensitivity of a sensor device is the dimension of the thickness t (the dimension in the third direction) of the vibrating arm. Further, the device sensitivity is inversely proportional to the cube of the thickness t of the vibrating arm ($t^3$). Therefore, the smaller the thickness t of the vibrating arm, the more improved the device sensitivity.

Here, the dimension of the thickness t of the vibrating arm may be controlled with high accuracy in the process of processing a piezoelectric material plate (piezoelectric material wafer) as a parent material of the vibrator element. If it is possible to secure the mechanical strength of the vibrator element, the dimension may be made sufficiently thin (that is, thinner than the processing limitation of the width w of the vibrating arm).

Further, the front surface (the first surface) and the rear surface (the second surface) of the piezoelectric material plate (piezoelectric material wafer) are made to be mirror surfaces with high flatness through the processing of lapping (irregularity removing processing using etching), etching (surface roughness removing processing), polishing (mirror-finishing using an abrasive agent), etc. (in this processing process, the thickness t may be made even smaller).

From this, the thickness t of the vibrating arm may be controlled with high accuracy under the condition that the parallelism of the front and rear surfaces is high and processing variations are small.

Furthermore, even when plural vibrating arms are arranged along the second direction (the direction of the widths w of the respective vibrating arms) in parallel, the respective vibrating arms vibrate in the direction of the thicknesses t (the third direction) of the vibrating arms, and thus, when the distance between the adjacent vibrating arms is determined, it is not necessary to consider the amplitude of the vibration of the respective vibrating arms and the distance between the adjacent vibrating arms may be made shorter than that in the related art example. In this respect, downsizing along the second direction of the vibrator element is also realized.

In addition, in the case where outer shape processing of a quartz crystal plate is performed using wet etching, even when fin portions are produced on the surface to be processed (the side surfaces of the vibrating arms), because the vibration direction of the vibrating arms is the third direction (the thickness t direction), any error does not occur in the thickness dimension of the vibrating arms due to the existence of the fin portions. That is, the processing error may be made smaller.

Therefore, according to the aspect, the sensitivity of the sensor device may be improved. Further, downsizing of the vibrator element may be promoted.

Further, in the aspect, in order to vibrate the vibrating arm in the thickness direction (the third direction) in a balanced manner, one vibrating arm is sectioned into a first region, a second region, and a third region.

Furthermore, the directions of the electric fields in the first region and the third region are the same direction and the direction of the electric field in the second region is the opposite direction to the directions of the electric fields in the first region and the third region. Thereby, a balanced out-of-plane vibration may be excited.

(2) In another aspect of the invention, the vibrator element may be configured such that, given that a width in the second directions in the vibrating arm is w and a thickness in the third directions is t, w>t is satisfied.

In the vibrator element according to the aspect, the direction of the flexural vibration of the vibrating arm is, for example, a direction (the third direction: for example, the thickness direction of the vibrating arm) perpendicular to a predetermined crystal surface (for example, the Z-surface for a quartz crystal plate of a Z-plate).

That is, in the aspect, a walk mode (an out-of-plane vibration mode) is employed as the (fundamental) excitation mode of the vibrating arm. Further, the outer dimensions of the vibrating arm are determined so that w>t may be satisfied where the width of the vibrating arm is w and the thickness is t.

By thinning (reducing) the thickness t of the vibrating arm, the device sensitivity may dramatically be improved compared to the case in related art. On the other hand, regarding the width w of the vibrating arm, the value with which formation of highly reliable electrodes and wirings is possible is secured, and thus, any problem of short circuit between electrodes and disconnection of electrodes and wirings does not arise.

That is, by determining the external dimensions of the vibrating arm so that w>t may be satisfied where the width (the width in the second direction) of the vibrating arm is w and the thickness (the thickness in the third direction) of the vibrating arm is t, the device sensitivity may dramatically be improved compared to the case in related art while stable formation of electrodes and wirings is secured.

(3) In another aspect of the invention, the vibrator element may be configured such that the vibrating arm has a first surface perpendicular to the third direction, a second surface opposed to the first surface, a third surface perpendicular to the second direction, and a fourth surface opposed to the third surface, and, in the vibrating arm, the first electrodes of the first region and the third region are provided at the third surface side on the first surface and the second electrodes of the first region and the third region are provided at the fourth surface side on the first surface, in the vibrating arm, the first electrode of the second region is provided at the fourth surface side on the first surface and the second electrode of the second region is provided at the third surface side on the first surface.

In the aspect, an example of electrode arrangements in the respective first region, second region, third region of the vibrating arm is clarified.

In the aspect, it is assumed that the cross-section of the vibrating arm is rectangular. The respective surfaces forming the cross-section of the vibrating arm may be represented by, for example, the first surface (for example, the front surface: the first surface) perpendicular to the third direction, the second surface (for example, the rear surface: the second surface) opposed to the first surface, the third surface (for example, the first side surface) perpendicular to the second direction, and the fourth surface (for example, the second side surface) opposed to the third surface (they are just examples and not limited to the examples).

Both the first electrode and the second electrode for applying an electric field to the vibrating arm are provided on the first surface (for example, the front surface) of the vibrating arm apart from each other.

Specifically, in the first region, the first electrode is provided at the third surface (for example, the left side surface) side on the first surface and the second electrode is provided at the fourth surface (for example, the right side surface) side on the first surface.

In the second region, the first electrode is provided at the fourth surface side on the first surface and the second electrode is provided at the third surface side on the first surface.

In the third region, the first electrode is provided at the third surface side on the first surface and the second electrode is provided at the fourth surface side on the first surface.

According to the electrode arrangement, the directions of the electric fields in the first region and the third region may be the same direction and the direction of the electric field in the second region may be the opposite direction to the directions of the electric fields in the first region and the third region.

(4) In another aspect of the invention, the vibrator element may be configured such that a first wiring for connecting the first electrode of the first region and the first electrode of the second region is provided on the first surface, a second wiring for connecting the second electrode of the first region and the second electrode of the second region is provided via the fourth surface, the second surface, and the third surface, a third wiring for connecting the first electrode of the second region and the first electrode of the third region is provided via the fourth surface, the second surface, and the third surface, and a fourth wiring for connecting the second electrode of the second region and the second electrode of the third region is provided on the first surface.

In the aspect, in the aspect of (3), the arrangement form of the wirings connecting the first electrodes provided in the respective regions and the wirings connecting the second electrodes provided in the respective regions is clarified.

The respective first electrodes provided in the respective first to third regions are connected to one another by the wirings. The respective second electrodes provided in the respective first to third regions are similarly connected to one another by the wirings. Note that, in the first region and the second region, the arrangements of the first electrodes and the second electrodes are reversed and, similarly, in the second region and the third region, the arrangements of the first electrodes and the second electrodes are reversed.

For wiring of the wirings in response to the reverse of the electrode arrangements, it is necessary to cross the wirings connecting the first electrodes and the wirings connecting the second electrodes on the vibrating arm. However, it is difficult to employ a multilayered wiring structure for the manufacture of the vibrator element under the current circumstances, and it may be impossible to form wirings that cross over or under each other on the same plane.

Accordingly, when one wiring is provided on the first surface (the front surface), the other wiring is formed as a bypass wiring that bypasses the first surface via (through) the fourth surface, the second surface, and the third surface, for example.

That is, for example, when one wiring is diagonally extracted on the front surface, the other wiring is diagonally extracted on the rear surface, and the respective wirings cross between the front surface and the rear surface. In other words, the one wiring and the other wiring cross in the plan view seen from the third direction (the vibration direction).

Note that it is preferable that the entire lengths of the wiring connecting the first electrodes (one wiring) and the wiring connecting the second electrodes (the other wiring) are the same.

Thus, it is preferable that, when the wiring connecting the first electrodes (one wiring) bypasses once, the wiring connecting the second electrodes (the other wiring) similarly bypasses once.

For example, it is preferable that, if the wiring bypasses when connecting the first electrode of the first region and the first electrode of the second region, the wiring also bypasses when connecting the second electrode of the second region and the second electrode of the third region.

By making the numbers of bypasses equal, the entire lengths of the wiring connecting the first electrodes and the wiring connecting the second electrodes may be made nearly the same and amounts of voltage drop due to the impedances of the respective wirings are equal.

Therefore, in the case where alternating voltages are applied to the first electrodes and the second electrodes, in the respective regions of the first region, the second region, and the third region, electric fields with the same intensity in the opposite directions are alternately applied. In the respective regions of the vibrating arm, flexions in the same amount may be generated in the opposite directions, and the balance of flexural vibrations may be secured.

According to the aspect, using wirings in the same layer (the wiring structure without using a multilayered wiring structure), in the respective regions of the first region, the second region, and the third region of the vibrating arm, electric fields necessary for excitation of the vibration in the walk mode may be generated.

(5) In another aspect of the invention, the vibrator element may be configured such that the first wiring is diagonally extracted and extends on the first surface, the wiring part provided on the second surface in the second wiring is diagonally extracted and extends, the first wiring and the wiring part provided on the second surface in the second wiring partially cross in a plan view seen from the third direction, the wiring part provided on the second surface in the third wiring is diagonally extracted and extends, the fourth wiring is diagonally extracted and extends on the first surface, and the wiring part provided on the second surface of the third wiring and the fourth wiring partially cross in the plan view seen from the third direction.

In the aspect, a preferred example of a crossing pattern (a crossing pattern in the plan view seen from the third direction) of one wiring connecting the first electrodes and the other wiring connecting the second electrodes is clarified.

As described above, for example, when one wiring is diagonally extracted on the first surface (for example, the front surface), the other wiring is a bypass wiring, the wiring provided on the second surface (for example, the rear surface) of the bypass wiring is diagonally extracted on the second surface, and the respective wirings cross between the front surface and the rear surface, for example.

That is, the one wiring and the other wiring cross in the plan view seen from the third direction (the vibration direction).

As a crossing pattern in the plan view, a crossing pattern in which one wiring on the first surface and the other wiring on the second surface exactly overlap over the entire lengths of the wirings is conceivable.

However, if the crossing pattern is employed, a capacitance value of a parasitic capacitance formed between the one wiring and the other wiring increases and the parasitic capacitance having the large capacitance value may be, for example, a fluctuation factor of the resonance frequency or the like.

Accordingly, in the aspect, in the case where one wiring is diagonally extracted on the first surface in a direction at a predetermined angle relative to the second direction (the width direction of the vibrating arm), for example, the wiring part provided on the second surface of the other bypass wiring is diagonally extracted on the second surface in the direction at a predetermined angle relative to the second direction.

Thereby, in the plan view, the crossing of the one wiring and the other wiring is partial. That is, the parasitic capacitance is generated only near one point at which the straight lines cross (i.e., the part of the crossing point of the X-mark), and thereby, the value of the parasitic capacitance may be suppressed.

(6) In another aspect of the invention, the vibrator element may be configured such that a first node region containing a node of the vibration is provided between the first region and the second region, and a second node region containing a node of the vibration is provided between the second region and the third region.

Further, as another aspect, the first wiring and the second wiring are provided so that the electric field in the second direction may not be generated in the first node region, and the third wiring and the fourth wiring are provided so that the electric field in the second direction may not be generated in the second node region.

As described above, the first node region is provided between the first region and the second region, the second node region is provided between the second region and the third region, and the resonance vibration of the vibrating arm may be regarded as stationary wave having nodes at which no vibration is generated and loops at which the amplitude becomes the maximum between the nodes.

Specifically, the nodes of the vibration are points at which, when the displacement of the vibrating arm is obtained as quadratic derivative coefficients, the quadratic derivative coefficients become zero, and ideally, the points at which no vibration of stationary wave is generated.

Accordingly, in the aspect, in the nodes (node points) of the vibrating arm, wirings (the first wiring and the second wiring, the third wiring and the fourth wiring) are arranged so that the electric field in the second direction may not be applied.

Specifically, for example, if the second wiring (the first bypass wiring) has a wiring pattern opposed to the first wiring on the first surface (the front surface) in the first node region, the first wiring and the second wiring have parts opposed on the first surface, and the electric field (horizontal electric field) along the second direction is applied and unwanted vibration may be generated in the first node region. It is preferable to avoid the situation, and thus, the second wiring is preferably provided so as not to have a wiring pattern opposed to the first wiring on the first surface in the first node region.

Further, it is preferable that, for example, the wiring part of the second wiring on the side surface toward the second surface (the rear surface) along the fourth surface (for example, the right side surface) (the wiring part that runs downward from the front surface side toward the rear surface side on the fourth surface) is formed so as not to overlap with the first node region.

That is, it is preferable that the wiring part of the second wiring on the side surface (for example, the wiring part that runs downward from the front surface side toward the rear surface side on the fourth surface) is linearly formed to connect the first surface and the second surface at the shortest distance before entering the first node region (that is, in a direction perpendicular to both the first surface and the second surface).

(7) In another aspect of the invention, the vibrator element may be configured such that, the vibrator element is provided with a first base part and a second base part as the base part, and n (n is a natural number) vibrating arms with one ends connected to the first base part and the other ends connected to the second base part.

Further, as another aspect, the vibrator element is provided with a first base part and a second base part as the base part, wherein one end of the vibrating arm is connected to the first base part and the other end is connected to the second base part.

In the aspect, as the structure of the vibrator element, a dual-support structure that supports the vibrating arm at both ends is employed. With the dual-support structure, mechanical strength is improved and stable vibration in the walk mode is easier to be realized.

(8) In another aspect of the invention, the vibrator element may be configured such that, as the n (n is a natural number) vibrating arms, m (m is an odd number equal to or more than three) vibrating arms are provided, given that the respective m vibrating arms are the first vibrating arm to the mth vibrating arm, the first vibrating arm to the mth vibrating arm are arranged in juxtaposition along the second direction in the ascending order of m values, the m vibrating arms are sectioned into three groups of vibrating arms, and, assuming that the first vibrating arm to the (m/3)th vibrating arm are the first group of vibrating arms, the (m/3+1)th vibrating arm to the (2m/3)th vibrating arm are the second group of vibrating arms, and the (2m/3+1)th vibrating arm to the mth vibrating arm are the third group of vibrating arms, and the third direction is a positive third direction and a direction opposite to the positive third direction is a negative third direction, when the second regions of the respective first group of vibrating arms and third group of vibrating arms displace in the positive third direction, the second regions of the second group of vibrating arms displace in the negative third direction, and when the second regions of the respective first group of vibrating arms and third group of vibrating arms displace in the negative third direction, the second regions of the second group of vibrating arms displace in the positive third direction.

In the aspect, the odd-number (that is, m (m is an odd number equal to or more than three)) of vibrating arms vibrating in the walk mode are provided.

To stably sustain the vibration in the walk mode, it is preferable to suppress the walk-mode vibration of the vibrating arms from leaking to the base parts.

The base parts of the vibrator element are fixed to a base member (a member forming a part of the package or the like, not shown), for example, using an adhesive agent or the like. If the walk mode in which the vibrating arms vibrate in the direction of the thickness of the vibrating arms is employed, the vibration may leak to the base parts from the vibrating arms and the vibration is disturbed, and inconveniences that separation of the adhesive agent or the like may occur.

In order not to cause the situation, it is preferable to provide the odd-number (odd-number of groups) of vibrating arms in parallel, vibrate the vibrating arms at both ends of the respective vibrating arms (the groups of vibrating arms at both ends) in the same phase, and vibrate the center vibrating arm (the center group of vibrating arms) in the reversed phase.

If the configuration is employed, the vibration of the vibrating arms of the vibrator element is dynamically balanced in the direction of the width w (the second direction) of the vibrating arms in a plan view, and dynamically balanced in the direction of the thickness (the third direction as the vibration direction) of the vibrating arms.

Therefore, the load on the base parts supporting the respective vibrating arms is not excessive and the leak of the vibration is suppressed.

Here, it is assumed that the first group, the second group, and the third group of vibrating arms sequentially arranged along the second direction are provided.

If the second regions of the first group and the third group of vibrating arms displace in the positive third direction, the second regions of the center second group of vibrating arms displace in the negative third direction. In this case, the first group and the third group as the groups at both ends displace in the same phase and balanced in the second direction in the plan view.

Further, the first group and third group and the second group displace in the reversed phases, and the stresses (the stresses on the base parts supporting the respective groups of vibrating arms) due to the displacements of the respective groups in the third direction (the vibration direction) are cancelled out, and balanced also in the third direction.

(9) In another aspect of the invention, the vibrator element may be configured such that a through hole is provided between one vibrating arm and the other vibrating arm of a pair of vibrating arms adjacent to each other included in the n vibrating arms, the through hole has a closed outer shape with the first direction as the extension direction of the vibrating arms as a longitudinal direction in a plan view seen from the third direction, the closed outer shape is line symmetric with respect to a center line along the first direction as a straight line dividing an area determined by the outer shape into two halves, an arrangement of the first electrodes and the second electrodes in the kth (k is one of 1, 2, and 3) region of one vibrating arm of the pair of vibrating arms adjacent to each other and an arrangement of the second electrodes in the kth (k is one of 1, 2, and 3) region of the other vibrating arm of the pair of vibrating arms adjacent to each other form an arrangement in which the first electrodes and the second electrodes overlap each other when the one vibrating arm and the other vibrating arm are folded along the center line.

In the aspect, a preferred example of the electrode arrangement pattern in the adjacent two vibrating arms is clarified.

For example, attention is focused on the kth regions (ones of the first regions, the second regions, the third regions) of the adjacent two vibrating arms. Note that, between the adjacent two vibrating arms, a through hole formed by selective removal at outer shape processing of the piezoelectric plate is formed.

Here, it is assumed that the electrodes of one vibrating arm of the two vibrating arms are arranged in the order of the first electrode and the second electrode along the positive second direction in the plan view in the kth region. In this case, in the aspect, the electrodes of the other vibrating arm are arranged in the order of the second electrode and the first electrode along the positive second direction in the plan view in the kth region.

That is, the electrode arrangement in the plan view of the adjacent vibrating arms is the first electrode, the second electrode, the through hole, the second electrode, the first electrode as a whole. Assuming that the center line divides the area of the through hole into two halves with the extension direction of the vibrating arms as the longitudinal direction, the electrode arrangement is the arrangement line-symmetric with respect to the center line, and also the arrangement in which the first electrodes and the second electrodes overlap each other when the one vibrating arm and the other vibrating arm are folded along the center line.

The arrangement is a particularly effective electrode arrangement in the case where a first voltage supply region (a first bonding pad or the like) that supplies voltages to the first electrodes and a second voltage supply region (a second bonding pad or the like) that supplies voltages to the second electrodes are formed the same base part side.

For example, in order to supply voltages for the first electrodes to the three vibrating arms, for example, a wiring pattern in which wirings for the first electrodes are trifurcated from the first bonding pad and wirings for the second electrodes are similarly trifurcated from the second bonding pad is considered. In this case, it is necessary that the extracted respective wirings are allowed to reach the respective vibrating arms, however, because it may be impossible to use crossings over and under the wirings by the multilayered wiring, if the wiring pattern is employed, downsizing of the vibrator element may be inhibited for the necessity of securing the wiring regions.

Accordingly, for example, the wiring is bifurcated from the first bonding pad, and the respective wirings are allowed to reach the two (the first vibrating arm, the second vibrating arm) of the three vibrating arms. It may be impossible to directly connect the first electrodes of the third vibrating arm to the first bonding pad.

Accordingly, voltages are supplied to the first electrodes of the third vibrating arm in a path via at least one of the first vibrating arm and the second vibrating arm (a path from the second base part side opposite to the first base part in which the first bonding pad is provided).

When the path reaching the third vibrating arm via at least one of the first vibrating arm and the second vibrating arm is formed, a penetration via formed on the inner side surface at the second base part side of the through hole provided between the first vibrating arm and the second vibrating arm may be used. The penetration via may be used as a contact plug connecting the electrodes on the front surface (the first surface) and the electrodes on the rear surface (the second surface).

By also making the penetration via in consideration, the electrode arrangement in the plan view of the adjacent vibrating arms is the first electrode, the second electrode, the through hole (the penetration via), the second electrode, the first electrode as a whole. The second electrode of the first vibrating arm and the second electrode of the second vibrating arm are connected to the common penetration via, and the configuration is not particularly problematic.

If the electrode arrangement in the plan view of the adjacent vibrating arms is the first electrode, the second electrode, the through hole (the penetration via), the first electrode, the second electrode, there is a problem that the second electrode of the first vibrating arm and the first electrode of the second vibrating arm at the different potential are connected to the common penetration via.

To avoid the problem, it is necessary to pattern the penetration via and separate the penetration via into a first part connected to the second electrode of the first vibrating arm and a second part connected to the first electrode of the second vibrating arm. In this case, the patterning step of the penetration via is added, and the manufacturing load is increased.

As described above, in the aspect, by also making the penetration via in consideration, the electrode arrangement in the plan view of the adjacent vibrating arms is the first electrode, the second electrode, the through hole (the penetration via), the second electrode, the first electrode as a whole.

Thereby, the second electrode of the first vibrating arm and the second electrode of the second vibrating arm may be connected to the common penetration via.

Therefore, patterning for dividing the penetration via into two is unnecessary, and, in this respect, the manufacturing load may be reduced.

(10) In another aspect of the invention, the vibrator element may be configured such that, as the n (n is a natural number) vibrating arms, m (m is an odd number equal to or more than three) vibrating arms are provided, as the m vibrating arms, three (m=3) vibrating arms are provided, given that the respective vibrating arms are a first vibrating arm, a second vibrating arm, and a third vibrating arm, the first vibrating arm, the second vibrating arm, and the third vibrating arm are arranged in this order along the second direction, a first through hole is provided between the first vibrating arm and the second vibrating arm, a second through hole is provided between the second vibrating arm and the third vibrating arm, in the first base part, a first voltage supply region for supplying voltages to the first electrodes and a second voltage supply region for supplying voltages to the second electrodes are provided, the first voltage supply region and the second voltage supply region are adjacently provided along the second direction on the first surface of the first base part, a first extraction wiring extracted from the first voltage supply region is furcated, one of the furcated first extraction wiring is connected to the first electrode of the first region in the first vibrating arm, the other of the furcated first extraction wiring is connected to the first electrode of the first region in the second vibrating arm, a second extraction wiring extracted from the second voltage supply region is furcated, one of the furcated second extraction wiring is connected to the second electrode of the first region in the second vibrating arm, the other of the furcated second extraction wiring is connected to the second electrode of the first region in the third vibrating arm, the first electrode of the third region of the first vibrating arm and the first electrode of the third region of the second vibrating arm are electrically connected to the first electrode of the third region in the third vibrating arm by a fifth wiring on the first surface, the second electrode of the third region of the second vibrating arm and the second electrode of the third region of the third vibrating arm are electrically connected to the second electrode of the third region of the first vibrating arm by a sixth wiring as a third bypass wiring, and the sixth wiring is a wiring via a penetration via provided to cover an inner wall surface at the second base part side of the second through hole, a wiring part on the second surface articulated to the penetration via, and a wiring part on the third surface articulated to the connection wiring on the second surface.

In the aspect, in the case where there are three vibrating arms, a preferred conductor pattern example for supplying voltages for the first electrodes and voltages for the second electrodes to the respective three vibrating arms is clarified.

In the aspect, both the first voltage supply region (the first bonding pad or the like) that supplies voltages to the first electrodes and the second voltage supply region (the second bonding pad or the like) that supplies voltages to the second electrodes are formed at the first base part side of the vibrator element.

As has been explained in the above described aspect of (9), for example, in order to supply voltages for the first electrodes to the three vibrating arms, it is often difficult to employ a wiring pattern in which wirings for the first electrodes are trifurcated from the first voltage supply region and wirings for the second electrodes are trifurcated from the second voltage supply region under the situation in which the use of multi-layered wiring may be impossible.

Accordingly, the wiring extracted from the first voltage supply region provided in the first base part is furcated and voltages are supplied to the first electrode of the first region of the first vibrating arm and the first electrode of the first region of the second vibrating arm via the respective furcated wirings.

Since it may be impossible to supply voltages from the first voltage supply region directly to the first electrodes of the third vibrating arm, other paths for supplying the voltages to the first electrodes of the third vibrating arm are provided.

The other paths are paths via the first electrodes of the respective first vibrating arm and second vibrating arm. The first electrodes of the respective first, second, third regions in the respective first vibrating arm and second vibrating arm are electrically connected to each other.

Further, the first electrodes of the first vibrating arm and the first electrodes of the second vibrating arm are commonly connected in the penetration via of the inner wall surface at the second base part (the base part with no bonding pad) side of the first through hole and the wiring pattern nearby. Therefore, the fifth wiring is extracted from the common connection region, and the fifth wiring is connected to the first electrode of the third region of the third vibrating arm.

The fifth wiring may be a wiring provided on the front surface (the first surface), for example. Here, the first electrodes of the respective first, second, third regions in the third vibrating arm are electrically connected to each other, and, if a voltage is supplied to the first electrode of the third region, necessary voltages may be supplied to the first electrodes of the second region and the first region.

In this manner, necessary voltages may be supplied to the first electrodes of the respective regions of the third vibrating arm via the first electrodes of the respective first vibrating arm and second vibrating arm.

Regarding the second electrodes, electric connection between the second electrodes of the respective vibrating arms is secured based on the same idea.

That is, the wiring extracted from the second voltage supply region is furcated and the respective furcated wirings are supplied to the respective second electrode of the first region of the second vibrating arm and second electrode of the first region of the third vibrating arm.

The second electrodes of the respective first, second, third regions in the respective first vibrating arm and second vibrating arm are electrically connected to each other, the second electrode of the third region in the second vibrating arm and the second electrode of the third region in the third vibrating arm are commonly connected in the penetration via formed on the inner wall surface at the second base part side of the second through hole and the wiring pattern nearby.

Accordingly, via the penetration via, the wiring part is extracted from the rear surface (the second surface) and a path further via the wiring part on the third surface is secured. The path is the sixth wiring as the third pass wiring, and a necessary voltage may be supplied to the second electrode of the third region in the first vibrating arm via the sixth wiring (the third pass wiring).

In this manner, according to the aspect, even in the case where both the voltage supply region for the first electrodes and the voltage supply region for the second electrodes are formed at the first base part side surface, necessary voltages may efficiently be supplied to the first electrodes and the second electrodes of the respective three vibrating arms.

Especially, the voltage supply paths to the second electrodes of the first vibrating arm are secured using the penetration via formed on the inner wall surface at the second base part side of the second through hole as the bypass wiring for connection between arms, and thus, a reasonable wiring pattern may be provided.

Further, the penetration via provided on the inner wall surface at the base part side of the through hole is naturally formed in the manufacturing process of the vibrator element, and no special manufacturing step is necessary for the formation.

Specifically, for example, if a conductor film is formed by sputtering, a conductor layer is formed on the inner side surface of the through hole, if the side surface of the vibrating arm is patterned for forming a side surface wiring pattern of the vibrating arm, as a result, a penetration via pattern is left on the inner wall surface at the base part side of the through hole. Therefore, the number of manufacturing steps is not increased.

(11) In another aspect of the invention, the vibrator element uses quartz crystal.

The vibrator element of the aspect is a quartz vibrator element using quartz crystal as a piezoelectric material. As a quartz crystal plate, either of a Z-plate (including a nearly Z-plate) or an X-plate (including a nearly X-plate) may be used.

Note that the Z-plate has an advantage of easy processing when the outer shape is processed by wet etching.

According to the aspect, by utilizing advantageous temperature stability and a high Q-value of the quartz crystal, a vibrator element with high stability, high accuracy, and high resolution (N of S/N can be suppressed) may be realized.

Further, by setting the excitation mode to the walk mode and arranging the shapes and the layout pattern of electrodes and wirings, the sensitivity of the sensor device may significantly be improved using wirings in the same layer with little manufacturing load.

That is, since the device sensitivity of the sensor device is inversely proportional to the cube of the thickness t of the vibrating arm and the thickness t may be made thinner than the dimension of the limit of the width w of the vibrating arm, S of S/N may be increased.

Accordingly, using the vibrator element of the aspect, the small and highly accurate sensor device with high resolution (acceleration sensor device, pressure sensor device, or the like) is realized.

Furthermore, since the vibration in the walk mode is generated utilizing the piezoelectric property of the quartz crystal itself, it is not necessary to separately provide a piezoelectric film unlike the technology described in the above described Patent Document 2.

Therefore, the number of steps of manufacturing is reduced, the manufacturing process may be simplified, and the manufacturing burden (manufacturing load) of the vibrator element is reduced.

In addition, by setting the excitation mode to the walk mode, the influence by the processing error due to etching anisotropy of the quartz crystal (fin portions) may be reduced.

That is, in related art, the projection direction of the fin portions and the vibration direction are the same, however, when the walk mode is employed, the projection direction of the fin portions and the vibration direction are different (the vibration direction is perpendicular to the projection direction of the fin portions), and it is not necessary to anticipate the margin in consideration of the fin portions when the distance between the adjacent vibrating arms is set.

This contributes to downsizing of the vibrator element. Further, the processing management of the vibrator element is facilitated.

Further, the shape and size of the fin portions vary in response to the manufacturing condition or the like.

When the projection direction of the fin portions and the vibration direction are the same as in related art, variations in size of the fin portions (the projecting lengths or the like) are variations in width w of the vibrating arm as a parameter having the greatest influence on the detection sensitivity of the sensor device.

That is, variations at etching processing of the vibrating arm affect the width w of the vibrating arm as a parameter most effective (important) for improvements in device sensitivity.

On the other hand, in the case where the walk mode is employed, the parameter having the greatest influence on the detection sensitivity of the sensor device changes from "width w of vibrating arm" to "thickness t of vibrating arm". Therefore, even when the fin portions are produced at processing of the vibrating arm, the thickness t of the vibrating arm as the most important parameter is not affected.

The thickness t of the vibrating arm is determined by the thickness of the quartz crystal plate (wafer). The thickness of the quartz crystal plate may be controlled with high accuracy when the plate is cut out from a quartz crystal. Further, the front surface and the rear surface of the quartz crystal plate are typically mirror-finished through processing of polishing etc. and sufficient flatness is secured.

Accordingly, the thickness t of the vibrating arm has an extremely small processing error on the wafer surface (that is, the wafer has a uniform thickness in any location) and the thickness t of the vibrating arm of the vibrator element formed by processing of the wafer may be controlled with extremely high accuracy because manufacturing variations are small.

In this manner, by employing the walk mode, substantial manufacturing variations of the vibrator element may be reduced. This contributes to realization of the ultra-miniature vibrator element that can perform highly accurate vibration, for example.

Therefore, according to the aspect, for example, a small and highly accurate quartz oscillator (having a configuration formed by fixing the base part of the quartz vibrator element to the base member and containing it in a package, reducing the pressure within the package, and air-tightly sealing it) may be realized.

Further, using the quartz vibrator element, a small and highly sensitive (highly accurate) sensor device (acceleration sensor device, pressure sensor device, or the like) may be realized.

(12) A sensor device according to another aspect of the invention includes any one of the above described vibrator elements.

According to the aspect, a force sensing sensor device (for example, an acceleration sensor device or a pressure sensor device) may be realized.

In the case of the pressure sensor device, a base part of a vibrator element is connected (fixed) to a diaphragm (a diaphragm that deforms in response to pressure) as an elastic material. Further, in the case of an acceleration sensor, a mass part (a weight part) is connected (fixed) to an elastic material (for example, an elastic beam, a spring, or the like), for example, and a base part of a vibrator element is connected (fixed) to the mass part.

In a state in which the vibrator element is excited in the walk mode, when a physical quantity (pressure or acceleration) of a target of measurement changes, and accordingly, if the mass part (weight part) connected to the elastic material (for example, the diaphragm) displaces, the vibrating arm expands and contracts along the extension direction of the vibrating arm, and the frequency of the resonance vibration changes. The change in the frequency of the vibration is converted into an electric signal and detected as a change in direct-current level of the detection signal or the like using a detection circuit, for example, and thereby, the physical quantity may be measured.

Since the vibrator element is small and designed to effectively improve the detection sensitivity, a small sensor device with high sensitivity (high resolution) may be realized.

(13) A sensor according to another aspect of the invention includes the sensor device and a container that contains the sensor device.

For example, an acceleration sensor is realized by placing an acceleration sensor device (including a mass part, an elastic part, and a vibrator element with a base part fixed to the mass part) within the package (container), reducing the pressure within the package, and air-tightly sealing it (just an example, not limited to the structure).

Further, a pressure sensor is realized by placing a pressure sensor device (including a diaphragm as an elastic material and a vibrator element with a base part fixed to the diaphragm) within a container and partitioning a hollow part within the container into two regions (a first hollow region and a second hollow region) by the diaphragm (just an example, not limited to the structure).

According to the configuration, when a difference is produced between the pressure in the first hollow region and the pressure in the second hollow region, the diaphragm deforms in response to the pressure difference and the vibration frequency of the vibrator element changes.

(14) An electronic apparatus according to another aspect of the invention includes any one of the above described vibrator elements.

According to the aspect, the electronic apparatus including a small sensor with good detection sensitivity may be provided.

BRIEF DESCRIPTION OF THE DRAWINGS

The invention will be described with reference to the accompanying drawings, wherein like numbers reference like elements.

FIGS. 1A to 1C are diagrams for explanation of detection sensitivity of an acceleration sensor.

FIGS. 3A to 3F are diagrams for explanation of an example of a configuration of a main part of a vibrating arm and an example of a vibration behavior in a vibrator element employing a walk mode as an excitation mode.

FIG. 5 shows an example of changes of sensitivity of a sensor device when the sectional shape (the ratio of width w to thickness t) of the vibrating arm is changed.

FIGS. 7A to 7C are diagrams for explanation of a specific example of the electrode arrangement in the vibrator element shown in FIGS. 6A to 6C.

FIGS. 18A to 18C are diagrams for explanation of a specific example of an electrode arrangement in the vibrator element shown in FIG. 17.

DESCRIPTION OF EXEMPLARY EMBODIMENTS

Before explanation of embodiments, regarding a vibrator element having a structure in related art (a structure in which a vibrating arm vibrates in the width direction of the vibrating arm), problems that would become apparent when downsizing (miniaturization) is promoted will briefly be explained using FIGS. 1A to 1C and FIGS. 2A to 2E.

FIGS. 1A to 1C are diagrams for explanation of detection sensitivity of an acceleration sensor. As shown in FIG. 1A, an acceleration sensor having a structure including a fixing anchor 900, a vibrating arm 910, and a weight 920 is considered.

Given that the width of the vibrating arm 910 is w, the thickness is t, the length is l, and the volume of the weight 920 is v, the vibrating arm 910 vibrates in a direction of the width w at a resonance frequency f. When an acceleration is applied to the weight 920 and an axial force F (=ma) is produced, the vibration frequency (resonance frequency) f of the vibrating arm 910 changes.

The resonance frequency f of the vibrating arm 910 is expressed by the equation (1) in FIG. 1B. The fn in the equation (1) is expressed by the equation (2). The detection sensitivity of the acceleration sensor (the device sensitivity of the sensor device) is expressed by the equation (3) of FIG. 1C. The equation (3) contains a dimension-independent term and a dimension-dependent term.

The dimension-independent term is $(v \cdot l^2)/(w^3 \cdot t)$, and the device sensitivity is inversely proportional to the cube of the width w of the vibrating arm ($w^3$). That is, as the width w in the vibration direction becomes smaller, the vibrating arm becomes easier to vibrate, and this contributes to improvements in detection sensitivity.

Therefore, the smaller the width w of the vibrating arm, the more the device sensitivity is improved (for example, when w is reduced to half, the device sensitivity is improved to eight times).

FIGS. 2A to 2E are diagrams for explanation of a problem that would become apparent in the case where downsizing (miniaturization) of a vibrator element having a structure in related art is promoted. Note that the findings explained as below are obtained as results of the study before the invention by the inventors of the invention.

Figure 2A:
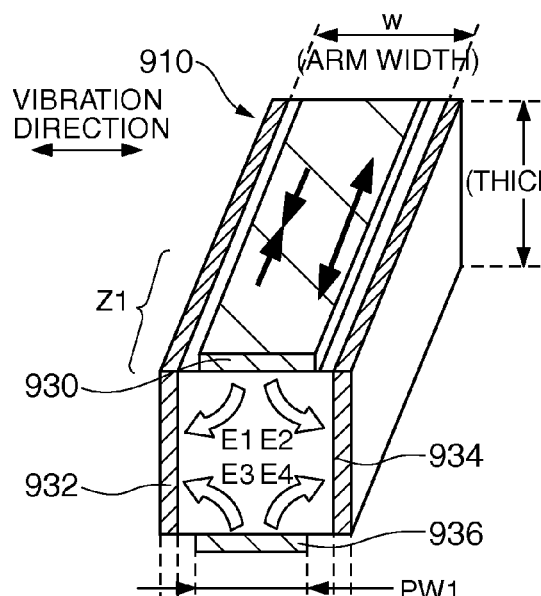
FIGS. 2A to 2E are diagrams for explanation of a problem that would become apparent in the case where downsizing (miniaturization) of a vibrator element having a structure in related art is promoted.
Figure 2B:
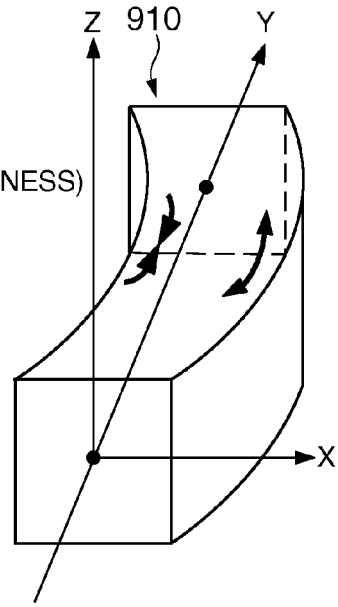
Figure 2C:
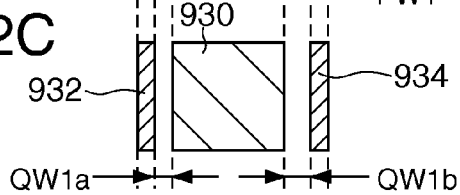

FIG. 2A is a perspective view of a main part of one vibrating arm in a vibrator element in related art, FIG. 2B shows a vibration behavior of the vibrating arm, FIG. 2C shows an electrode arrangement of the vibrating arm of FIG. 2A in a plan view seen from a perpendicular direction to the front surface (upper surface) of the vibrating arm.

Figure 2D:
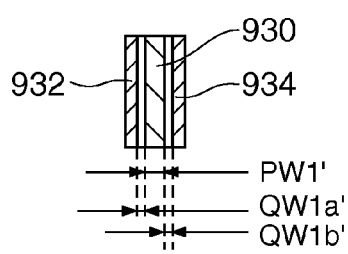
Figure 2E:
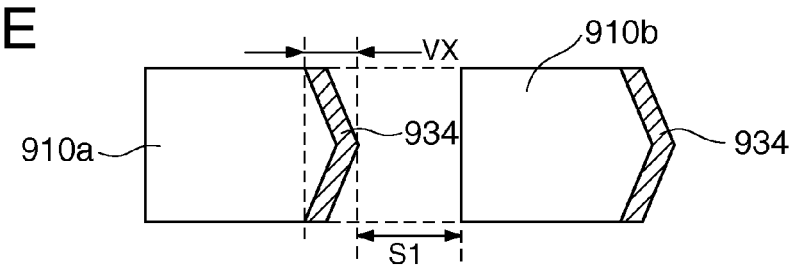

Further, FIG. 2D shows an electrode arrangement in the plan view when downsizing of the vibrating arm shown in FIG. 2C is promoted, and FIG. 2E shows inconveniences in the case where two vibrating arms are provided when fin portions (irregular shape portions) are formed in the vibration direction of the respective vibrating arms (here, +X-axis direction).

The vibrating arm 910 shown in FIG. 2A is formed by processing a quartz Z-plate. The crystal axis of the quartz crystal is as shown in FIG. 2B.

In FIG. 2A, the width of the vibrating arm 910 is w and the thickness is t. Further, as the electrode arrangement shown in FIG. 2A, an electrode arrangement in related art described in FIG. 13 of the above described Patent Document 4 is employed.

An upper electrode 930 is provided on the front surface (upper surface) of the vibrating arm 910, a lower electrode 936 is provided on the rear surface (lower surface), a left side electrode 932 is provided on the left side surface, and a right side electrode 934 is provided on the right side surface.

Electric fields E1 to E4 have electric field components in the X-axis directions (the +X-axis direction and the −X-axis direction). By the application of the electric fields, the vibrating arm contracts and expands as shown by thick arrows in FIG. 2A, and consequently, as shown in FIG. 2B, the vibrating arm 910 flexes in the +X-axis direction, for example.

As shown in FIG. 2C, the width of the upper electrode 930 is PW1, the distance between the left side electrode 932 and the upper electrode 930 is QW1a, and the distance between the right side electrode 934 and the upper electrode 930 is QW1b.

As shown in FIG. 2D, if downsizing (miniaturization) of the vibrating arm 910 is promoted, the width of the upper electrode 930 is reduced to PW1', the distance between the left side electrode 932 and the upper electrode 930 is reduced to QW1a', and the distance between the right side electrode 934 and the upper electrode 930 is reduced to QW1b'.

Accordingly, disconnection of the upper electrode 930 (may be regarded as wiring) becomes easier to occur, and a short-circuit failure between the left side electrode 932 and the upper electrode 930 and a short-circuit failure between the right side electrode 934 and the upper electrode 930 become easier to occur.

Therefore, in view of stable formation of electrodes and wirings, the reduction of the width w of the vibrating arm 910 is limited.

Further, as shown in FIG. 2E, in the case where adjacent two vibrating arms (910a, 910b) are provided, because the direction (X-axis direction) in which the respective vibrating arms (910a, 910b) are arranged and the vibration direction ((X-axis direction) in which the respective vibrating arms (910a, 910b) are the same, it is necessary to provide the distance S1 between the respective vibrating arms (910a, 910b) with a margin so that the respective vibrating arms (910a, 910b) may not be in contact with each other.

This inhibits the reduction of the distance between the adjacent vibrating arms (910a, 910b).

Furthermore, when processing of the outer shape of the quartz crystal plate is performed using wet etching as a general processing method, fin portions (irregular shape portions) projecting in the +X-axis direction of the vibrating arms (910a, 910b) are formed due to anisotropy of the quartz crystal as shown in FIG. 2E.

Note that the fin portions are also formed in the −X-axis direction, however, only the fin portions projecting in the +X-axis direction are shown for convenience of explanation. This is the same in the following drawings.

The projection direction of the fin portions is the direction of the width w of the respective vibrating arms (910a, 910b), and thus, when the fin portions are formed, errors are caused in the width w of the respective vibrating arms (910a, 910b).

That is, in the case of using wet etching, errors are caused due to manufacturing variations in the width w of the vibrating arms as a parameter having the greatest influence on the device sensitivity of the sensor device that has been explained in the equation (3) of FIG. 1C.

As below, preferred embodiments of the invention will be explained in detail. Note that the embodiments described as below do not unduly limit the subject matter of the invention described in claims, and all of the configurations explained in the embodiments are not necessarily essential as solving means of the invention.

First Embodiment

In the embodiment, as an excitation mode of the vibrating arm in the vibrator element, a walk mode (the mode in which the vibrating arm vibrates in its thickness direction) is employed.

Further, in order to vibrate the vibrating arm in the thickness direction in a balanced manner, one vibrating arm is sectioned into a first region, a second region, and a third region, and furthermore, a first node region containing a node of vibration (resonance) is provided between the first region and the second region, and a second node region containing a node of vibration (resonance) is provided between the second region and the third region.

As below, explanation will be made with reference to FIGS. 3A to 3F. FIGS. 3A to 3F are diagrams for explanation of an example of a configuration of a main part of a vibrating arm and an example of a vibration behavior in a vibrator element employing a walk mode as an excitation mode.

FIG. 3A is a perspective view of a main part of one vibrating arm in the vibrator element employing the walk mode, FIG. 3B shows the example of the vibration behavior of the vibrating arm, and FIG. 3C shows an arrangement in a plan view of two electrodes Na1, Nb1 formed on a first region ZA of the vibrating arm in FIG. 3A.

FIG. 3D shows an equation (equation 4) showing sensitivity of the sensor device in the case where the walk mode is employed. FIG. 3E shows a state in which, in the case where two vibrating arms are provided, fin portions (irregular shape portions) are produced in a direction perpendicular to the vibration direction of the respective vibrating arms (here, in the +X-axis direction).

FIG. 3F is a plan view of a vibrator element 90 (with two vibrating arms) having a cantilever structure. The vibrator element 90 has at least one vibrating arm 200 connected to at least one base part 100. The vibrator element 90 is formed by processing a piezoelectric material plate.

As a piezoelectric material, for example, quartz crystal, lithium tantalate, lithium niobate, or the like may be used. In the following explanation, the case of using quartz crystal will be explained as an example.

As the quartz crystal plate, either the Z-plate or the X-plate may be used, however, here, the case of using the Z-plate easily processed by wet etching will be explained. The direction of the crystal axis of the quartz crystal in this example is as shown in FIGS. 3B and 3F.

One vibrating arm 200 shown in FIG. 3A is extended in the Y-axis direction (referred to as "first direction"). When plural vibrating arms 200 are provided, the respective vibrating arms are extended apart at predetermined distances in parallel, for example.

Here, the direction (the X-axis direction and the direction of the width w of the vibrating arm 200) perpendicular to the first direction (Y-axis direction) as an extension direction of the vibrating arm 200 is "second direction", and the direction (the Z-axis direction and the direction of the thickness t of the vibrating arm 200) perpendicular to both of the first direction and the second direction is the third direction.

The front surface (first surface), for example, of the vibrating arm 200 is the surface perpendicular to the third direction, the rear surface (second surface), for example, is the surface opposed to the first surface. Further, the left side surface (third surface), for example, of the vibrating arm 200 is the surface perpendicular to the second direction, and the right side surface (fourth surface), for example, is the surface opposed to the third surface.

The electric field in the first direction (X-axis direction: more specifically, +X-axis direction and the −X-axis direction) is applied to the vibrating arm 200 of quartz crystal, and the vibrating arm 200 expands and contracts along the first direction as the extension direction of the vibrating arm 200. Thereby, a flexural vibration (a vibration in the walk mode) is generated in the third direction as the direction of the thickness t of the vibrating arm 200.

Further, on the front surface (the first surface or the upper surface) of the vibrating arm 200, a first electrode Na and a second electrode Nb electrically independent of each other are provided.

In order to generate the stationary-wave vibration as shown in FIG. 3B in a balanced manner, it is preferable to provide vibration peaks, vibration valleys, and vibration nodes.

Accordingly, in the example shown in FIG. 3A, one vibrating arm 200 is sectioned into a first region ZA, a second region ZB, a third region ZC in the plan view on the front surface, and a first node region Qab containing a node of the vibration (resonance) is provided between the first region ZA and the second region ZB and a second node region Qbc containing a node of the vibration (resonance) is provided between the second region ZB and the third region ZC.

Further, pairs of first electrodes (Na1, Na2, Na3, respectively) and second electrodes (Nb1, Nb2, Nb3, respectively) are provided for application of the electric fields in the second direction in the first region ZA, the second region ZB, the third region ZC, respectively.

In the notation of the electrodes, "Na1" shows the first electrode provided in the first region, "Na2" shows the first electrode provided in the second region, and "Na3" shows the first electrode provided in the third region.

The respective first electrodes (Na1, Na2, Na3) are electrically connected to one another by a first wiring BL1 and a third wiring BL3. To the first electrodes (Na1, Na2, Na3), alternating voltages are applied via a voltage supply region such as a bonding pad (not shown in FIG. 3A), for example.

Similarly, in the notation of the electrodes, "Nb1" shows the second electrode provided in the first region, "Nb2" shows the second electrode provided in the second region, and "Nb3" shows the second electrode provided in the third region.

The respective second electrodes (Nb1, Nb2, Nb3) are electrically connected to one another by a second wiring BL2 and a fourth wiring BL4. To the second electrodes (Nb1, Nb2, Nb3), alternating voltages are applied via a voltage supply region such as a bonding pad (not shown in FIG. 3A), for example.

As shown by white arrows in FIG. 3A, it is preferable to make the direction of an electric field E5 in the first region ZA and the direction of an electric field E7 in the third region ZC "same direction" and the direction of the electric field E6 in the second region ZB "opposite direction" to the direction of the electric field E5 and the electric field E7.

For example, in the case where "vibration peak" is produced in the second region ZB located at the center of the vibrating arm 200, "vibration valleys" are produced in the first region ZA and the third region ZC located at both ends, and, in the case where "vibration peaks" are produced in the first region ZA and the third region ZC, "vibration valley" is produced in the second region ZB, and thereby, the vibrating arm 200 may stably and reasonably be vibrated in a balanced manner.

The above described "same direction" and "opposite direction" may be expressed by "positive (+) second direction" and "negative (−) second direction".

That is, the direction of the electric field is the direction of the width w (second direction) of the vibrating arm 200, and the second direction may divisionally be considered as the positive (+) second direction (+X-axis direction) and negative (−) second direction (−X-axis direction).

In the following explanation, the direction of the electric field may be divisionally expressed into the positive (+) second direction (+X-axis direction) and negative (−) second direction (−X-axis direction).

Further, the expressions of "vibration peak" and "vibration valley" are used for specifically representing the vibration state, and these terms have no special meaning.

For example, if the quartz vibrator element of the Z-plate is taken as an example, the case where the vibrating arm flexurally vibrates in the positive (+) Z-axis direction (positive third direction) is expressed by "vibration peak" for convenience and the case where the vibrating arm flexurally vibrates in the negative (−) Z-axis direction (negative third direction) is expressed by "vibration valley" for convenience.

Furthermore, the first node region Qab exists between the first region ZA and the second region ZB and the second node region Qbc exists between the second region ZB and the third region ZC. Thereby, the resonance vibration of the vibrating arm 200 is regarded as stationary wave having nodes at which no vibration is produced and loops at which the amplitude becomes the maximum between the nodes, and stable stationary-wave (fundamental-wave) resonance vibration is realized.

Note that, specifically, the nodes of the vibration may be points at which, when the displacement of the vibrating arm is obtained as quadratic derivative coefficients, the quadratic derivative coefficients become zero.

As shown in FIG. 3A, for example, when the electric fields E5, E7 in the positive second direction are generated between the first electrode Na1 and the second electrode Nb1 in the first region ZA and the first electrode Na3 and the second electrode Nb3 in the third region ZC, the electric field E6 in the negative second direction is generated between the first electrode Na2 and the second electrode Nb2 in the second region ZB.

On the other hand, when the electric fields in the negative second direction are generated between the first electrode Na1 and the second electrode Nb1 in the first region ZA and the first electrode Na3 and the second electrode Nb3 in the third region ZC, the electric field in the positive second direction is generated between the first electrode Na2 and the second electrode Nb2 in the second region ZB.

In this manner, when contraction forces (arrows at both ends in FIG. 3B) are produced in the first region ZA and the third region ZC, an expansion force (the arrow at the center in FIG. 3B) is produced in the second region ZB, and vibration valleys are produced in the first region ZA and the third region ZC and a vibration peak is produced in the second region ZB.

Similarly, when expansion forces are produced in the first region ZA and the third region ZC, a contraction force is produced in the second region ZB, and vibration peaks are produced in the first region ZA and the third region ZC and a vibration valley is produced in the second region ZB.

Here, the case of using the vibrator element for detection of a physical quantity is considered. As in the related art example, when the vibration direction of the vibrating arm is the direction of the width w (second direction) of the vibrating arm, the factor having the greatest influence on the device sensitivity of the sensor device using the vibrator element is the dimension of the width w of the vibrating arm (equation (3) in FIG. 1C).

That is, the device sensitivity is inversely proportional to the cube of the width w of the vibrating arm ($w^3$), for example, (that is, as the width w in the vibration direction becomes smaller, the vibrating arm becomes easier to vibrate, and this contributes to improvements in detection sensitivity).

Therefore, the smaller the width w of the vibrating arm, the more the device sensitivity is improved (for example, when w is reduced to half, the device sensitivity is improved to eight times).

However, as has been explained using FIGS. 2A to 2E, when the reduction of the width w of the vibrating arm is promoted, a problem that stable formation of electrodes and wirings in manufacturing becomes difficult (short circuit between electrodes may occur, disconnection may occur due to the smaller wiring width, or the like) becomes apparent.

On the other hand, in the embodiment, the vibration direction of the vibrating arm 200 is the direction (±Z-axis direction) of the thickness t of the vibrating arm 200. Accordingly, the dimension-dependent term shown at the right end of the equation (3) in FIG. 1C is modified to the equation (4) in FIG. 3D.

That is, the factor having the greatest influence on the device sensitivity of the sensor device is the dimension of the thickness t of the vibrating arm. In other words, according to the equation (4) in FIG. 3D, the device sensitivity is inversely proportional to the cube of the thickness t of the vibrating arm ($t^3$). Therefore, the smaller (thinner) the thickness t of the vibrating arm, the more improved the device sensitivity.

Here, the dimension of the thickness t of the vibrating arm 200 may be controlled with high accuracy in the process of processing the quartz crystal plate (quartz wafer) as a parent material of the vibrator element. If it is possible to secure the mechanical strength of the vibrator element, the dimension may be made thinner than the processing limitation of the width w of the vibrating arm.

Further, the front surface (the first surface: the U-surface in FIG. 3A) and the rear surface (the second surface: the D-surface in FIG. 3A) of the quartz crystal plate are made to be mirror surfaces with high flatness (flat surfaces) through the processing of lapping (irregularity removing processing using etching), etching (surface roughness removing processing), polishing (mirror-finishing using an abrasive agent), etc., and thus, the parallelism of the front and rear surfaces is high and processing variations are small.

Thus, the thickness t of the vibrating arm 200 may be controlled with high accuracy.

Therefore, for example, given that the limit value of the reduction of the width w of the vibrating arm 200 (the value with which formation of highly reliable electrodes and wirings is possible) is "w1", the thickness t of the vibrating arm 200 may be set to "t1" smaller than "w1".

As described above, since the vibration direction of the vibrating arm 200 is the direction of the thickness t and the device sensitivity is inversely proportional to the cube of the thickness t of the vibrating arm, the device sensitivity may dramatically be improved by making the thickness t of the vibrating arm 200 even smaller than "w1" as the limit value in related art, for example.

On the other hand, as shown in FIG. 3C, regarding the width w of the vibrating arm 200, the value ("w1") with which formation of highly reliable electrodes and wirings is possible is secured, and thus, for example, the electrode width PW4 of the first electrode Na1 may be made to be a width with a sufficient margin compared to the example of FIG. 2D.

Similarly, the electrode width PW5 of the second electrode Nb1 may be made to be a width with a sufficient margin compared to the example of FIG. 2D. Further, the distance QW3 between the first electrode Na1 and the second electrode Nb1 may be made to be a sufficient length.

Therefore, any problem of short circuit between electrodes and disconnection of electrodes and wirings does not arise.

That is, by determining the external dimensions of the vibrating arm 200 so that w>t may be satisfied where the width (the width in the second direction) of the vibrating arm 200 is w and the thickness (the thickness in the third direction) is t, the device sensitivity may dramatically be improved compared to the case in related art while stable formation of electrodes and wirings is secured.

As described above, given that the minimum processing dimension of the width w of the vibrating arm 200 in view of the stable formation of electrodes and wirings is w1, the dimension design to make the width w of the vibrating arm 200 w≧w1 is preferable.

Further, as shown in FIG. 3E, even when plural vibrating arms 200a, 200b are arranged along the second direction (the direction of the widths w of the respective vibrating arms) in parallel, the respective vibrating arms 200a, 200b vibrate in the direction of the thickness t (the third direction) of the vibrating arms 200a, 200b, and thus, when the distance between the adjacent vibrating arms 200a, 200b is determined, it is not necessary to consider the amplitudes of the vibrations of the respective vibrating arms 200a, 200b.

Thereby, the distance between the adjacent vibrating arms 200a, 200b may be made shorter than in the related art example. In this respect, downsizing of the vibrator element in the second direction is also realized.

Furthermore, in the case where outer shape processing of the quartz crystal plate is performed using wet etching, on the surface to be processed (the side surfaces of the vibrating arms 200a, 200b), for example, even when fin portions projecting in the +X-axis direction (projection lengths VX) are produced, because the vibration direction of the vibrating arms 200a, 200b is the direction of the thickness t, any error does not occur in the dimension of the thickness t of the vibrating arms 200*a*, 200*b* due to the existence of the fin portions. That is, the processing error may be made smaller.

In this manner, by employing the structure of the vibrating arm in FIG. 3A, for example, the sensitivity of the sensor device may be improved. Further, downsizing of the vibrator element may be promoted.

Furthermore, layouts of electrodes and wirings with margins may be employed, and thus, the load at manufacturing (manufacturing load) may be reduced.

Figures 4A, 4B:
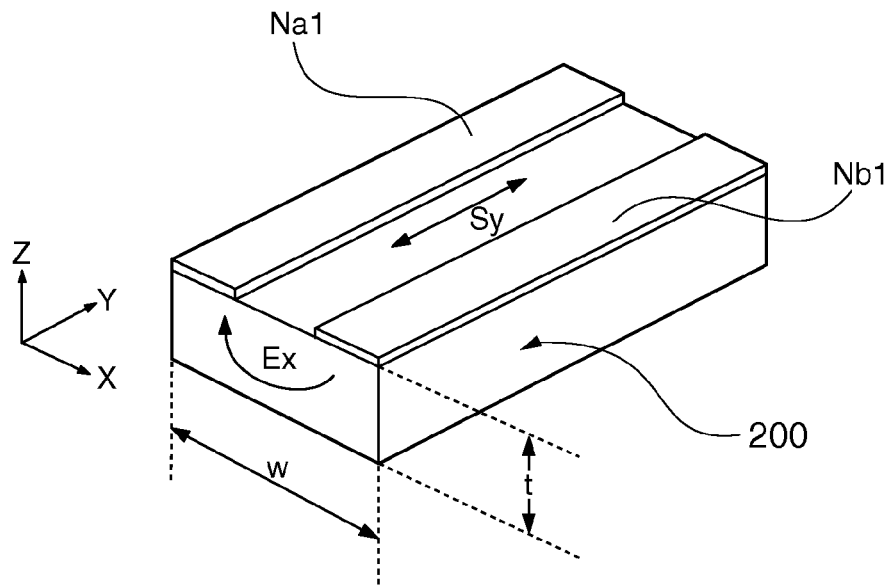
FIGS. 4A and 4B are diagrams for explanation of piezoelectric constants in a quartz vibrating arm of a Z-plate.

FIGS. 4A and 4B are diagrams for explanation of the relation among a piezoelectric constants, electric fields, and distortions in a quartz vibrating arm of a Z-plate.

In FIG. 4B, Ex, Ey, Ez show electric fields in the respective directions and Sx, Sy, Sz show distortions in the respective directions. The positive values of Sx, Sy, Sz show expansions and the negative values show contractions.

As shown in FIG. 4B, the Z-plate has d11 and d12 showing high numeric values as piezoelectric constants corresponding to the electric field Ex in the second direction (X-axis direction).

The d11 is a piezoelectric constant related to the magnitude of the distortion Sx in the X-axis direction generated in response to the electric field Ex in the X-axis direction, and the d12 is a piezoelectric constant related to the magnitude of the distortion Sy in the first direction (the Y-axis direction) generated likewise.

As shown in FIG. 4A, in the embodiment, by applying the electric field Ex in the X-axis direction to the vibrating arm 200 of the Z-plate using the piezoelectric constant d12, expansion and contraction are efficiently generated in the extension direction (the Y-axis direction, the first direction) of the vibrating arm 200.

Specifically, by applying the electric field Ex along the X-axis direction in the −X-axis direction (from right to left on the paper), the distortion Sy is generated in the Y-axis direction and contraction is generated in the Y-axis direction.

As a result, the vibrating arm 200 flexes toward the positive side (upward on the paper) of the third direction (Z-axis direction).

On the other hand, by applying the electric field Ex along the X-axis direction in the +X-axis direction (from left to right on the paper), the distortion Sy is generated in the Y-axis direction and expansion is generated in the Y-axis direction.

As a result, the vibrating arm 200 flexes toward the negative side (downward on the paper) of the third direction.

From the operation, by alternately changing the application direction (−X-axis direction, +X-axis direction) of the electric field Ex in the X-axis direction, the vibration (vibration in the third direction, out-of-plane vibration) in the walk mode may be generated in the vibrating arm 200.

FIG. 5 shows an example of changes of sensitivity of the sensor device when the sectional shape (the ratio of width w to thickness t) of the vibrating arm is changed.

In the example in FIG. 5, the arm width w of the vibrating arm is set to about 100 μm and the length l of the vibrating arm is set to about 2000 μm, and, under the condition, the thickness t of the vibrating arm is changed in a range from 0 to 100 μm and the corresponding device sensitivity is measured.

According to FIG. 5, it is known that the thinner the thickness t of the vibrating arm, the more improved the device sensitivity.

Therefore, the excitation mode of the vibrating arm is set to the walk mode and the thickness t of the vibrating arm is reduced while being controlled with high accuracy, the device sensitivity may be made higher to a sufficient value. Thus, the small and highly sensitive sensor device may be realized.

Note that, by using the quartz crystal plate, the highly stable and highly accurate vibrator element with high resolution (N of S/N can be suppressed) may be realized utilizing advantageous temperature stability and a high Q-value.

Further, by setting the excitation mode to the walk mode and arranging the shapes and the layout pattern of electrodes and wirings, the sensitivity of the sensor device may significantly be improved using wirings in the same layer (wiring without using a multilayered wiring structure) with little manufacturing load.

That is, since the device sensitivity of the sensor device is inversely proportional to the cube of the thickness t of the vibrating arm and the thickness t may be sufficiently thinner, S of S/N may be increased.

Therefore, using the vibrator element of the embodiment, the small and highly accurate sensor device with high resolution (acceleration sensor device, pressure sensor device, or the like) is realized.

Further, since the vibration in the walk mode is generated utilizing the piezoelectric property of the quartz crystal itself, it is not necessary to separately provide a piezoelectric film unlike the technology described in the above described Patent Document 2. Therefore, the number of steps of manufacturing is reduced, the manufacturing process may be simplified, and the manufacturing burden (manufacturing load) of the vibrator element is reduced.

Furthermore, by setting the excitation mode to the walk mode, the influence by the processing error due to etching anisotropy of the quartz crystal (fin portions) may be reduced.

That is, in related art, the projection direction of the fin portions and the vibration direction are the same, however, when the walk mode is employed, the projection direction of the fin portions and the vibration direction are different (the vibration direction is perpendicular to the projection direction of the fin portions), and it is not necessary to anticipate the margin in consideration of the fin portions when the distance between the adjacent vibrating arms is set.

This contributes to downsizing of the vibrator element. Further, the processing management of the vibrator element is facilitated.

In addition, the shape and size of the fin portions vary in response to the manufacturing condition or the like. When the projection direction of the fin portions and the vibration direction are the same as in related art, variations in size of the fin portions (the projecting lengths or the like) are variations in width w of the vibrating arm.

That is, variations at etching processing of the vibrating arm affect the width w of the vibrating arm as a parameter having the greatest influence on the detection sensitivity of the sensor device (a parameter most effective for improvements in device sensitivity, the most important parameter).

On the other hand, in the case where the walk mode is employed, the parameter having the greatest influence on the detection sensitivity of the sensor device changes from "width w of vibrating arm" to "thickness t of vibrating arm". Therefore, even when the fin portions are produced at processing of the vibrating arm, the thickness t of the vibrating arm as the most important parameter is not affected.

The thickness t of the vibrating arm is determined by the thickness of the quartz crystal plate (wafer). The thickness of the quartz crystal plate may be controlled with high accuracy when the plate is cut out from a quartz crystal.

Further, the front surface and the rear surface of the quartz crystal plate are typically mirror-finished through processing of polishing etc. and sufficient flatness is secured. Therefore, the thickness t of the vibrating arm has an extremely small processing error on the wafer surface (that is, the wafer has a uniform thickness in any location) and the thickness t of the vibrating arm of the vibrator element formed by processing of the wafer may be controlled with extremely high accuracy because manufacturing variations are small.

In this manner, by employing the walk mode, manufacturing variations of the main part of the vibrator element may be reduced. This contributes to realization of the ultra-miniature vibrator element that can perform highly accurate vibration.

Therefore, using the quartz vibrator element, for example, a small and highly sensitive quartz oscillator may be realized. As a configuration example of the quartz oscillator, for example, there is a configuration formed by fixing the base part of the quartz vibrator element to the base member and containing it in a package, reducing the pressure within the package, and air-tightly sealing it.

Further, using the quartz vibrator element, a small and highly sensitive (highly accurate) sensor device (acceleration sensor device, pressure sensor device, or the like) may be realized.

Second Embodiment

In the embodiment, for a vibrator element, a dual-support structure that supports a vibrating arm at both ends is employed. In the embodiment, a vibrator element having one vibrating arm (a single-beam vibrator element) will be explained.

Figures 6A, 6B, 6C:
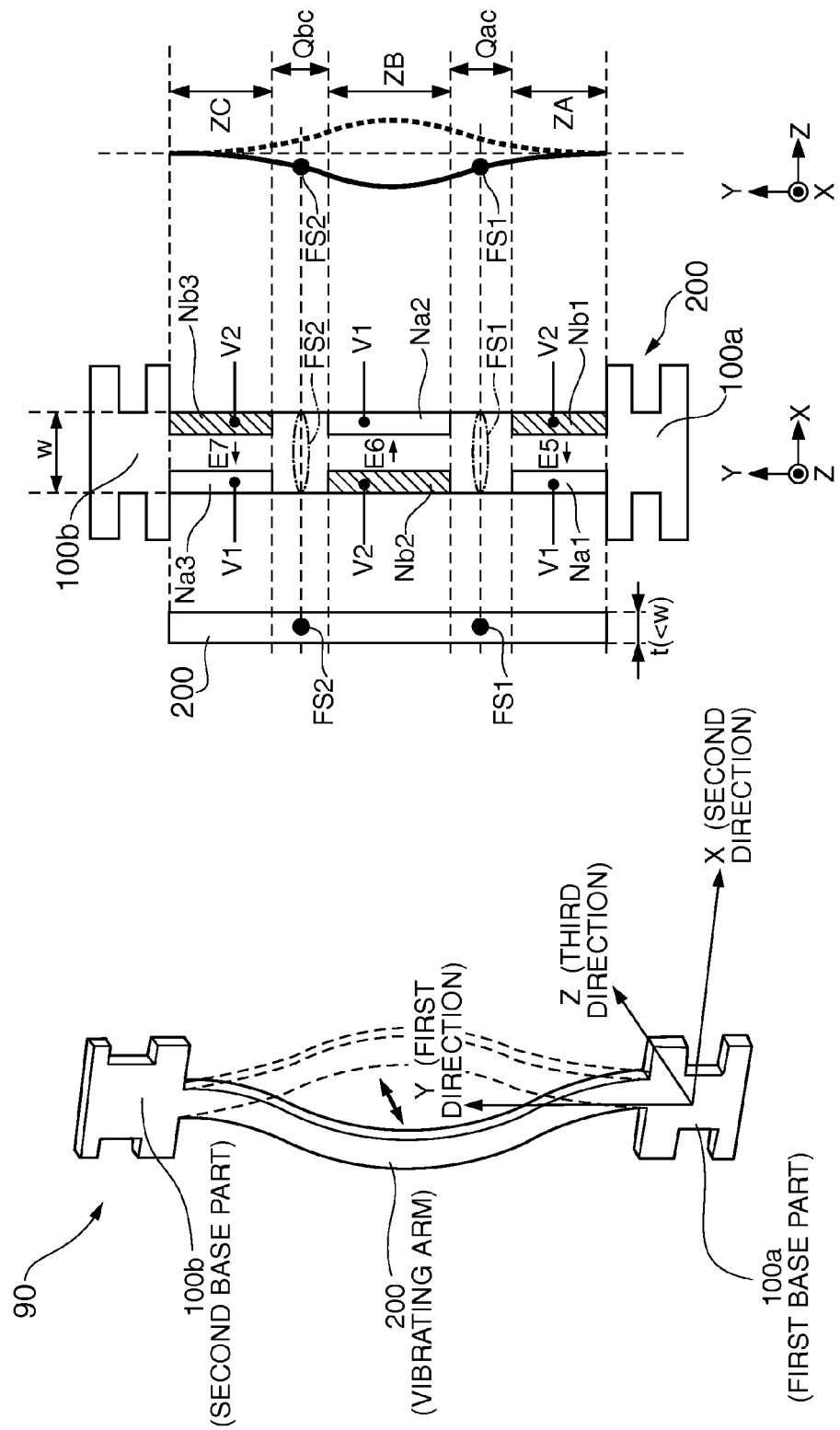
FIGS. 6A to 6C are diagrams for explanation of examples of a structure, an electrode arrangement, and an operation of a vibrating arm of an example of the vibrator element (an example of a single-beam configuration).

FIGS. 6A to 6C are diagrams for explanation of examples of a structure, an electrode arrangement, and an operation of a vibrating arm of an example of the vibrator element (an example of a single-beam configuration).

A vibrator element 90 shown in FIG. 6A has a first base part 100a and a second base part 100b as base parts. One vibrating arm 200 extends along the Y-axis direction (the first direction).

When an electric field is applied along the width direction (the X-axis direction: the second direction) of the vibrating arm 200, expansion and contraction are generated in the Y-axis direction (the first direction) of the vibrating arm 200. As a result, a vibration in the walk mode is excited, and the vibrating arm 200 vibrates in the Z-axis direction (the third direction).

One end of the one vibrating arm 200 is connected to the first base part 100a and the other end is connected to the second base part 100b. The vibrator element 90 shown in FIG. 6A is formed by processing a quartz Z-plate, for example. The directions of the respective crystal axes of the quartz crystal are as described in FIG. 6A.

The excitation mode of the vibrating arm 200 is the walk mode and the vibrating arm 200 vibrates in the Z-axis directions (the positive Z-axis direction and the negative Z-axis direction).

Regarding the vibrator element 90, mechanical strength is improved by employing the dual-support structure for supporting the vibrating arm at both ends, and stable vibration in the walk mode becomes easier to be realized.

FIG. 6B shows an arrangement example of a first electrode Na and a second electrode Nb on the front surface (the first surface, the upper surface) of the vibrating arm 200.

As is the case of the above described embodiment, the vibrating arm 200 is sectioned into a first region ZA, a second region ZB, a third region ZC in the order from the first base part 100a in the plan view on the front surface, and a first node region Qab containing a node (a first node part FS1) of the vibration (resonance) is provided between the first region ZA and the second region ZB and a second node region Qbc containing a node (a second node part FS2) of the vibration (resonance) is provided between the second region ZB and the third region ZC.

Further, pairs of first electrodes Na and second electrodes Nb are provided for application of the electric fields in the second direction in the first region ZA, the second region ZB, the third region ZC, respectively.

That is, the first electrode Na1 is provided at the left side surface side and the second electrode Nb1 is provided at the right side surface side of the front surface (the first surface, the upper surface) of the first region ZA. Further, the first electrode Na2 is provided at the right side surface side and the second electrode Nb2 is provided at the left side surface side of the front surface of the second region ZB (that is, the arrangement of the respective electrodes in the second region ZB is opposite to the arrangement of the respective electrodes in the first region ZA).

Further, the first electrode Na3 is provided at the left side surface side and the second electrode Nb3 is provided at the right side surface side of the front surface of the third region ZC (the arrangement of the respective electrodes in the third region ZC is the same as the arrangement of the respective electrodes in the first region ZA).

In FIG. 6B, the potential of the first electrodes Na1 to Na3 is a potential V1, the potential of the second electrodes Nb1 to Nb3 is a potential V2, and there is a relationship of potential V2>potential V1.

The direction of the electric field E5 in the first region ZA and the direction of the electric field E7 in the third region ZC are the same and they are opposite to the direction of the electric field E6 in the second region ZB.

FIG. 6C shows a state of the vibration (the vibration in the walk mode) of the vibrating arm 200 seen from the X-axis direction (for example, +X-axis direction).

In the state shown in FIG. 6B, the vibration as shown by a thick solid line in FIG. 6C is generated. When the voltages applied to the respective first electrodes Na1 to Na3 and the second electrodes Nb1 to Nb3 are exchanged for each other, the vibration shown by a thick dotted line in FIG. 6C is generated.

In FIG. 6C, the FS1 and the FS2 show the nodes of the vibration. The FS1 is the first node part and the FS2 is the second node part. Note that the nodes of the vibration are points at which, when the displacement of the vibrating arm is obtained as quadratic derivative coefficients, the quadratic derivative coefficients become zero.

Next, using FIGS. 7A to 7C, a specific example of the electrode arrangement in the vibrator element shown in FIGS. 6A to 6C will be explained.

FIGS. 7A to 7C are diagrams for explanation of the specific example of the electrode arrangement in the vibrator element shown in FIGS. 6A to 6C. Note that, as shown at the upper side of FIG. 7A, the cross-section of the vibrating arm 200 has a rectangular shape.

For convenience of explanation, the front surface (the first surface, the upper surface) of the vibrating arm 200 is denoted by U, the rear surface (the second surface, the lower surface) opposed to the front surface is denoted by D, the first side surface (the left side surface, the third surface) connecting the front surface and the rear surface is denoted by L, and the second side surface (the right side surface, the fourth surface) opposed to the first side surface (the left side surface) is denoted by R.

FIG. 7A shows a conductor pattern on the front surface, FIG. 7B shows a conductor pattern on the side surfaces (the left side surface and the right side surface), and FIG. 7C shows a conductor pattern on the rear surface. Note that FIG.

7C is a perspective view from the front surface. The conductor patterns are provided on the side surfaces and the rear surfaces for the following reason.

That is, the position of the first electrode and the position of the second electrode are opposite between the first region Za and the second region ZB. Therefore, it is necessary to cross the wirings. However, it is difficult to use multilayered wiring under the existing circumstances, it is necessary to realize crossing of the wirings in the same layer.

Accordingly, one wiring is provided on the front surface (the first surface) and the other wiring is a bypass wiring via the side surface (the third surface or the fourth surface) and the rear surface (the second surface).

Thereby, the one wiring and the other wiring may be crossed without using multilayered wiring (in the plan view seen from the third direction, one wiring and the other wiring are crossed at a distance on the front surface and the rear surface).

Note that, in the above explained example in FIG. 6B, the first electrode for applying a voltage to the vibrating arm is denoted by Na (Na1 to Na3) and the second electrode is denoted by Nb (Nb1 to Nb3), however, in FIGS. 7A to 7C, it is necessary to explain more specific electrode patterns and wiring patterns in detail, and thus, the reference signs 1 to 16 are assigned to the electrodes and the wirings.

Further, the conductor pattern integrally formed with the first electrode Na (the conductor pattern electrically connected, and, hereinafter, referred to as the first conductor pattern) is shown by being blackened.

Furthermore, the conductor pattern integrally formed with the second electrode Nb (the conductor pattern electrically connected, and, hereinafter, referred to as the second conductor pattern) is shown by being shaded.

In addition, on the front surface of the first base part 100a, two voltage supply regions (connection terminal regions such as bonding pads) PA1 (first voltage supply region) and PA2 (second voltage supply region) are provided. The first voltage supply region PA1 is a voltage supply region for the first conductor pattern (the blackened pattern) and the second voltage supply region PA2 is a voltage supply region for the second conductor pattern (the shaded pattern).

As below, the first conductor pattern and the second conductor pattern will specifically be explained.

As shown in FIG. 7A, to connect the first electrode 3 in the first region ZA and the first electrode 7 in the second region ZB, the first wiring 5 is provided in the first node region Qab. The first wiring 5 is a wiring provided on the front surface (the first surface: the U-surface).

On the other hand, the second wiring 17 for connecting the second electrode 4 in the first region ZA and the second electrode 6 in the second region ZB is a first bypass wiring formed to contain (via) the wiring 12 on the right side surface (the fourth surface: the R-surface), the wiring 16 on the rear side surface (the second surface: the D-surface), and the wiring 14 on the left side surface (the third surface: the L-surface).

That is, the second conductor pattern bypasses once.

The numbers of bypasses of crossings in the respective first conductor pattern and second conductor pattern are desirably the same from the point of view that entire lengths of the respective conductor patterns are made substantially equal.

Accordingly, next, the first conductor pattern is bypassed.

That is, to connect the second electrode 6 in the second region ZB and the second electrode 10 in the third region ZC, the fourth wiring 8 is provided in the second node region Qbc. The fourth wiring 8 is a wiring provided on the front surface.

On the other hand, the third wiring 19 for connecting the first electrode 7 in the second region ZB and the first electrode 9 in the third region ZC is a second bypass wiring formed to contain (via) the wiring 11 on the right side surface, the wiring 15 on the rear side surface, and the wiring 13 on the left side surface.

As described above, for example, when the first wiring 5 contained in the first conductor pattern is provided on the first surface (front surface), the second wiring 17 contained in the second conductor pattern is the first bypass wiring that bypasses the first surface via the respective wirings 12, 16, 14 provided on the fourth surface (R), the second surface (D), and the third surface (L), for example.

That is, in the case where one wiring of the wirings necessary to be crossed is diagonally extracted on the front surface (U), the other wiring is diagonally extracted on the rear surface (D), and the respective wirings are crossed at a distance on the front surface and the rear surface.

Therefore, the one wiring and the other wiring are crossed in the plan view seen from the third direction (the vibration direction: the Z-axis direction).

Note that, as described above, it is preferable not to provide a difference in the numbers of bypasses of crossings between the first conductor pattern (the blackened pattern) and the second conductor pattern (the shaded pattern).

By making the number of bypasses equal between the respective conductor patterns, the entire lengths of the first conductor pattern and the second conductor pattern may be made substantially equal, and the amounts of voltage drops by the impedances of the respective wirings become equal.

Therefore, in the case where alternating voltages are applied to the first electrodes (3, 7, 9) and the second electrodes (4, 6, 10), for example, in the first region ZA, the electric field from the first electrode 3 toward the second electrode 4 (the electric field in the +X-axis direction) and the electric field from the second electrode 4 toward the first electrode 3 (the electric field in the −X-axis direction) are equal in intensity.

Similarly, in the second region ZB, the electric field from the first electrode 7 toward the second electrode 6 (the electric field in the −X-axis direction) and the electric field from the second electrode 6 toward the first electrode 7 (the electric field in the +X-axis direction) are equal in intensity.

Similarly, in the third region ZC, the electric field from the first electrode 9 toward the second electrode 10 (the electric field in the +X-axis direction) and the electric field from the second electrode 10 toward the first electrode 9 (the electric field in the −X-axis direction) are equal in intensity.

That is, in the respective regions of the first region ZA, the second region ZB, and the third region ZC, the electric fields having the same intensity in the opposite directions are alternately applied, the same amounts of flexion may be generated in the opposite directions (the +Z-axis direction and the −Z-axis direction) in the respective regions (ZA to ZC) of the vibrating arm 200 and the balance (the balance between peak and valley) of the flexural vibration in the walk mode may be secured.

In this manner, using the wirings in the same layer (wiring without using a multilayered wiring structure), in the respective regions of the first region ZA, the second region ZB, and the third region ZC of the vibrating arm 200, the electric fields necessary for excitation of the vibration in the walk mode (the electric fields E5 to E7 shown in FIG. 3A) may be generated.

Figure 8:
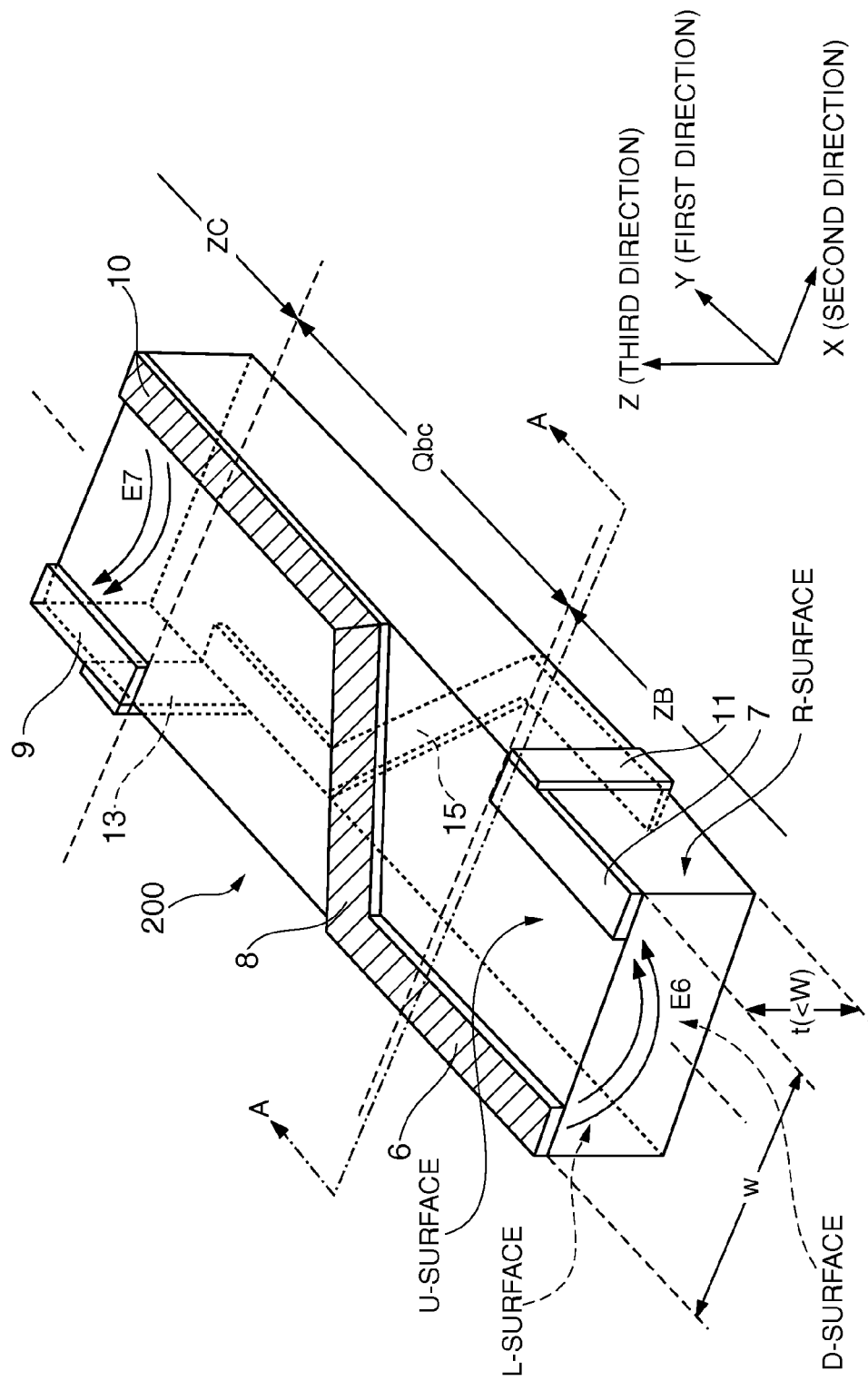
FIG. 8 is a perspective view showing a conductor pattern (a pattern of electrodes and wirings) in a second region, a second node region, and a third region of the vibrating arm shown in FIGS. 7A to 7C.

FIG. 8 is a perspective view showing a conductor pattern (a pattern of electrodes and wirings) in the second region, the second node region, and the third region of the vibrating arm shown in FIGS. 7A to 7C.

In FIG. 8, the same reference signs are assigned to the parts in common with FIGS. 7A to 7C. Note that the sectional view along A-A line of the vibrating arm 200 shown in FIG. 8 is shown in FIG. 13M.

As described above, the second electrode 6 in the second region ZB, the fourth wiring 8, and the second electrode 10 in the third region ZC are formed on the front surface (the U-surface: the first surface) of the vibrating arm 200, and these electrodes and wiring form the second conductor pattern.

On the other hand, the first electrode 7 of the second region ZB and the first electrode 9 in the third region ZC are electrically connected by the third wiring 19 (the second bypass wiring, see FIGS. 7A to 7C).

The third wiring 19 (the second bypass wiring) includes the wiring (the right side surface wiring) 11 formed on the right side surface (the R-surface: the fourth surface), the wiring (the rear surface wiring) 15 formed on the rear surface (the D-surface: the second surface), and the wiring (the left side surface wiring) 13 formed on the left side surface (the L-surface: the third surface).

Note that, in FIGS. 7A to 7C, the first conductor pattern is the blackened pattern, however, the pattern is not blackened for the perspective view in FIG. 8.

Figure 9:
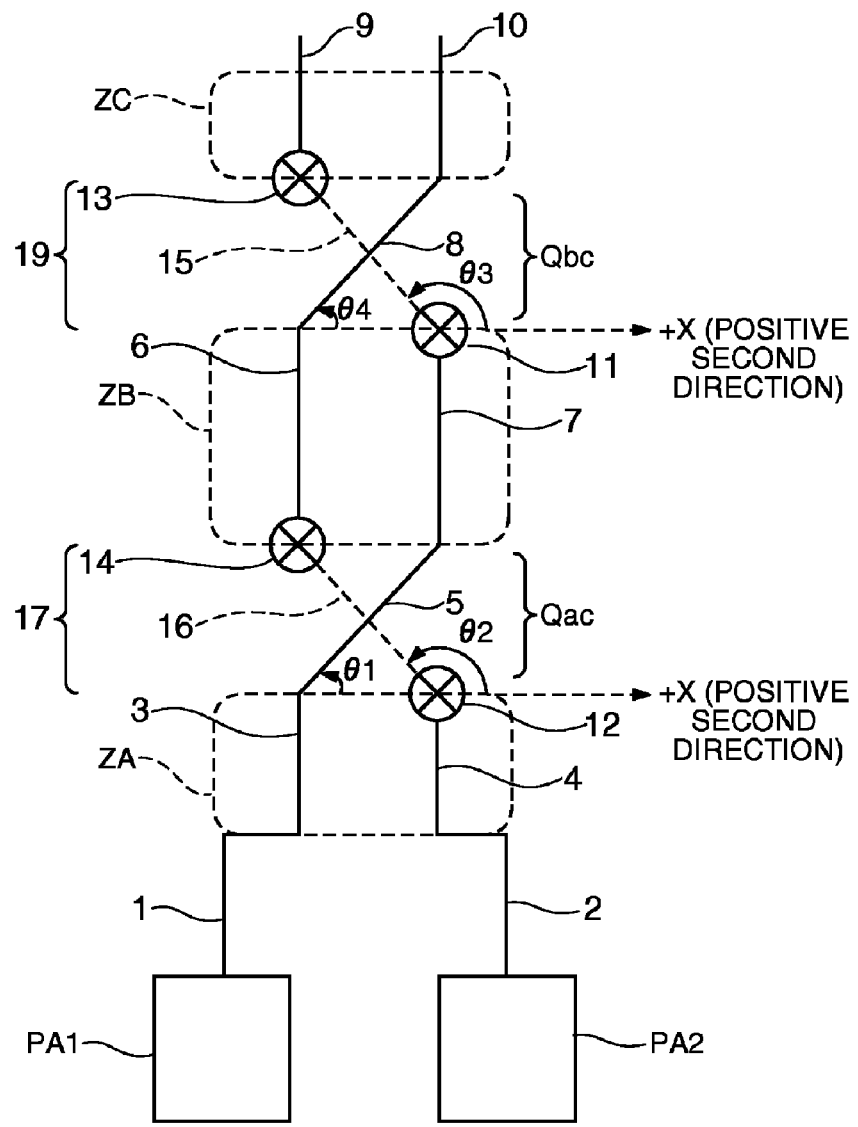
FIG. 9 shows a first conductor pattern and a second conductor pattern in the vibrating arm shown in FIGS. 7A to 7C and 8.

FIG. 9 shows the first conductor pattern and the second conductor pattern in the vibrating arm shown in FIGS. 7A to 7C and 8.

In FIG. 9, the same reference signs are assigned to the parts in common with FIGS. 7A to 7C and 8. In FIG. 9, electrodes and wirings (3, 4, 5, 6, 7, 8, 9, 10) on the front surface of the vibrating arm 200 are shown by solid lines and wirings (16, 15) on the rear surface are shown by dotted lines.

Further, side surface wirings (the right side surface wirings 12, 11 and the left side surface wirings 14, 13) for connecting the wirings on the front surface and the wirings on the rear surface are shown by encircled X-marks.

As below, in the shapes of wirings in the first conductor pattern (connected to the first voltage supply region PA1) and the second conductor pattern (connected to the second voltage supply region PA2) shown in FIG. 9 will specifically be explained.

In FIG. 9, the first wiring 5 (the wiring connecting the first electrode 3 in the first region ZA and the first electrode 7 in the second region ZB) is diagonally extracted in a direction at a predetermined angle $\theta 1$ ($\theta 1 < 90°$) relative to the second direction (for example, the +X-direction) and linearly extends from the third surface (the left side surface) side toward the fourth surface (the right side surface) side on the first surface (the front surface) of the vibrating arm 200.

Of the second wiring 17 (the wiring connecting the second electrode 4 in the first region ZA and the second electrode 6 in the second region ZB and the first bypass wiring including the wiring parts 12, 16, 14), the wiring part 16 provided on the second surface (the rear surface) is diagonally extracted in a direction at a predetermined angle $\theta 2$ ($\theta 2 > 90°$: preferably, $180° - \theta 2 \approx \theta 1$) relative to the second direction (for example, the +X-direction) and linearly extends from the fourth surface (the right side surface) side toward the third surface (the left side surface) side.

Thereby, in the plan view seen from the third direction (the Z-axis direction: the vibration direction), the first wiring 5 and the wiring part 16 provided on the second surface (the rear surface) of the second wiring 17 (the first bypass wiring 12, 16, 14) partially cross (that is, they cross only near the crossing point of the X-mark).

Further, of the third wiring 19 (the wiring connecting the first electrode 7 in the second region ZB and the first electrode 9 in the third region ZC and the second bypass wiring including the wiring parts 11, 15, 13), the wiring part 15 provided on the second surface (the rear surface) is diagonally extracted in a direction at a predetermined angle $\theta 3$ ($\theta 3 > 90°$) relative to the second direction (for example, the +X-direction) and linearly extends from the fourth surface (the right side surface) side toward the third surface (the left side surface) side.

Furthermore, in the first surface (front surface), the fourth wiring 8 (the wiring connecting the second electrode 6 in the second region ZB and the second electrode 10 in the third region ZC) is diagonally extracted in a direction at a predetermined angle $\theta 4$ ($\theta 4 < 90°$: preferably, $180° - \theta 3 \approx \theta 4$) relative to the second direction (for example, the +X-direction) and linearly extends from the third surface (the left side surface) side toward the fourth surface (the right side surface) side.

Thereby, in the plan view seen from the third direction (the Z-axis direction: the vibration direction), the wiring part 15 provided on the second surface (the rear surface) of the third wiring 19 (the second bypass wiring 11, 15, 13) and the fourth wiring 8 partially cross (that is, they cross only near the crossing point of the X-mark).

Next, a preferred aspect of the crossing of the wirings in the plan view will be explained using FIGS. 10A and 10B.

Figure 10A:
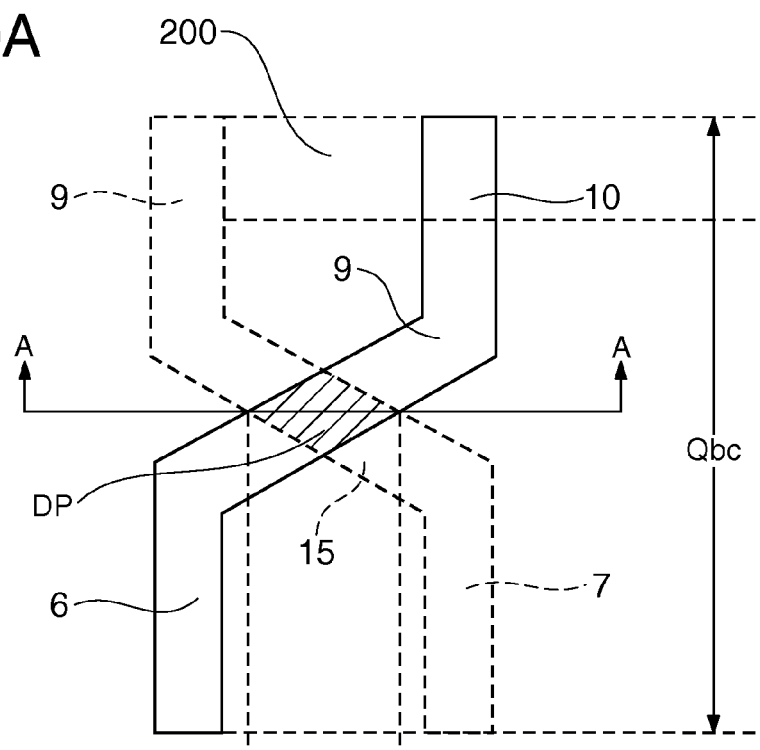
FIGS. 10A and 10B are diagrams for explanation of a preferred aspect of crossings of the first conductor pattern and the second conductor pattern.
Figure 10B:
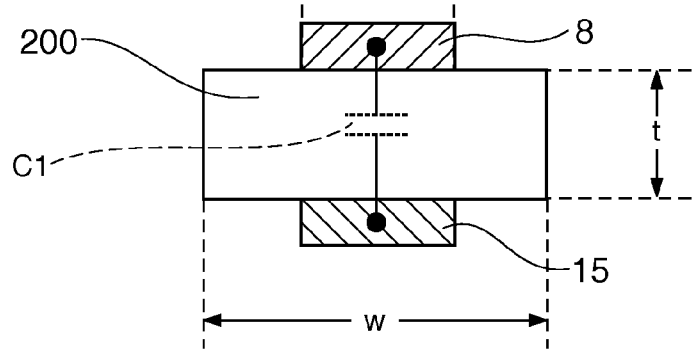

FIGS. 10A and 10B are diagrams for explanation of the preferred aspect of crossing of the first conductor pattern and the second conductor pattern. FIG. 10A shows a conductor pattern in the plan view in the second node region Qbc of the vibrating arm 200 shown in FIGS. 8 and 9. FIG. 10B is a sectional view along A-A line of the vibrating arm 200 shown in FIG. 10A.

As described above, in the case where the wiring forming the first conductor pattern (one wiring) is diagonally extracted on the front surface (the first surface), the wiring forming the second conductor pattern (the other wiring) is the bypass wiring, the wiring part provided on the rear surface (the second surface) of the bypass wiring is diagonally extracted on the rear surface (the second surface), and the respective wirings cross between the front surface and the rear surface. That is, the one wiring and the other wiring cross in the plan view seen from the third direction (vibration direction).

As a crossing pattern in the plan view, an crossing pattern in which one wiring on the front surface (on the first surface) and the other wiring on the rear surface (the second surface) exactly overlap is conceivable.

For example, in the case where one wiring is linearly extracted from left to right and the other wiring is linearly extracted from right to left to overlap each other, they cross (overlap) over the entire lengths of the wirings.

However, if the crossing pattern is employed, a capacitance value of a parasitic capacitance (capacitance C1 in FIG. 10B) formed between the one wiring and the other wiring increases and the parasitic capacitance C1 having the large capacitance value may be, for example, a fluctuation factor of the resonance frequency or the like.

Accordingly, as shown in FIG. 10A, in the case where one wiring is diagonally and linearly extracted in a direction at a predetermined angle relative to the second direction (the width direction of the vibrating arm 200) on the front surface (the first surface), the wiring part provided on the rear surface (the second surface) of the other bypass wiring is diagonally and linearly extracted in a direction at a predetermined angle relative to the second direction on the rear surface (the second surface). In the plan view, crossing of the one wiring and the other wiring is partial.

That is, as shown in FIG. 10B, the parasitic capacitance C1 is generated only near one point at which the one linear wiring and the other linear wiring cross (i.e., near the crossing point of the X-mark).

Thereby, because the overlapping parts in the plan view are small, the capacitance value of the parasitic capacitance C1 may be suppressed.

Further, in the conductor pattern shown in FIG. 9, it is preferable that the first wiring 5 and the second wiring 17 (the first bypass wiring 12, 16, 14) are provided not to generate electric fields (horizontal electric fields) in the second directions (the +X-axis direction, the −X-axis direction) in the first node region Qab, and the third wiring 19 (the second bypass wiring 11, 15, 13) and the fourth wiring 8 are provided not to generate electric fields in the second directions in the second node region Qbc.

As described above, the first node region Qab exists between the first region ZA and the second region ZB of the vibrating arm 200 and the second node region Qbc exists between the second region ZB and the third region ZC, and the resonance vibration of the vibrating arm 200 may be regarded as stationary wave having nodes at which no vibration is generated and loops at which the amplitude becomes the maximum between the nodes.

Specifically, the nodes of the vibration are points at which, when the displacement of the vibrating arm is obtained as quadratic derivative coefficients, the quadratic derivative coefficients become zero, and ideally, the points at which no vibration of stationary wave is generated.

Accordingly, in the vicinities of the nodes of the vibrating arm 200 (in the first node part FS1 and the second node part FS2 shown in FIGS. 6B and 6C and their vicinities), wirings are preferably arranged so that the electric fields in the second directions may not be applied. Specifically, consideration is given to arrangement of the first wiring 5 and the second wiring 17 (the first bypass wiring 12, 16, 14) and the third wiring 19 (the second bypass wiring 11, 15, 13) and the fourth wiring 8.

In the above explained example shown in FIG. 8, in the first node region Qab and the second node region Qbc, consideration is given so that electric fields may not be generated in the second directions (the +X-axis direction, the −X-axis direction).

Figure 11A:
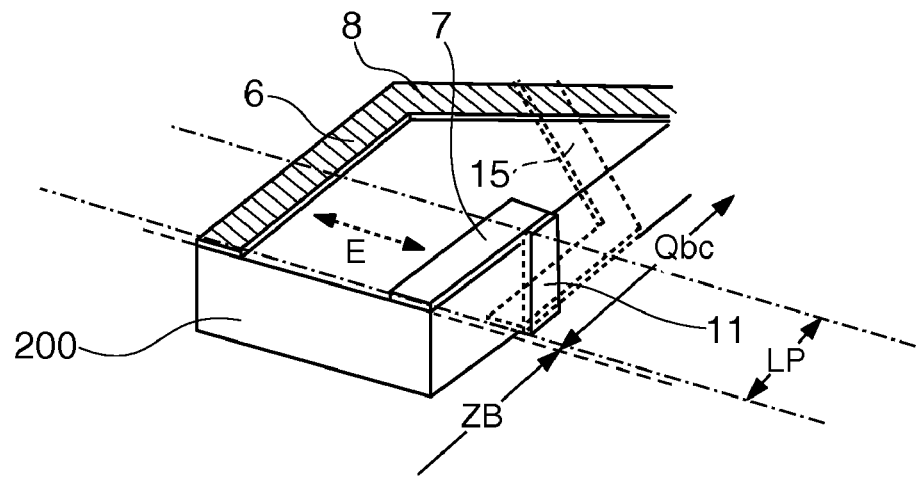
FIGS. 11A and 11B show an example in which an electric field in a second direction is generated in the node region of the vibrating arm.
Figure 11B:
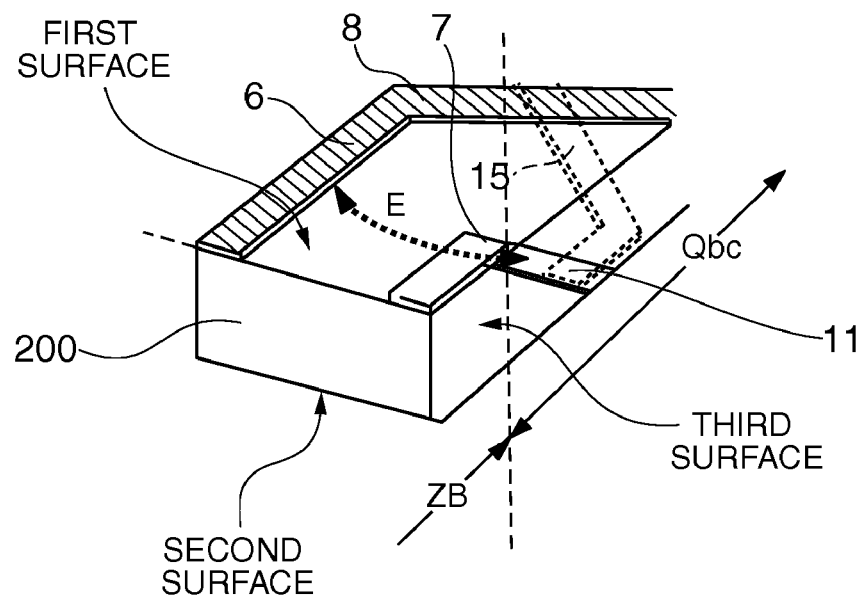

FIGS. 11A and 11B show an example in which an electric field in the second direction is generated in the node region of the vibrating arm.

In the example of FIG. 11A, the first electrode 7 provided on the front surface (the first surface) in the second region ZB of the vibrating arm 200 enters onto the front surface of the second node region Qbc.

As a result, on the front surface, an overlapping part (opposed part) LP is produced between the second electrode 6 and the first electrode 7, and unwanted electric field E in the second direction is generated in the overlapping part.

Further, in the example of FIG. 11B, in the second region ZB of the vibrating arm 200, the wiring part 11 provided on the right side surface (the fourth surface) has a pattern tilted downward from the front surface (the first surface) toward the rear surface (the second surface).

Therefore, there is a possibility that the unwanted electric field E in the second direction is generated between the second electrode 6 and the wiring part 11 entering the second node region Qbc.

On the other hand, in the example of FIG. 8, the first electrode 7 provided on the front surface (the first surface) in the second region ZB of the vibrating arm 200 terminates within the second region ZB and the wiring part 11 has a pattern perpendicular to the front surface and the rear surface (the second surface), and, as a result, the wiring part 11 does not enter the second node region Qbc.

Therefore, because no unwanted electric field is generated, no unwanted vibration is generated in the second node region Qbc.

Next, an example of a manufacturing method of a vibrator element will be explained using FIGS. 12A to 12G and FIGS. 13H to 13M.

FIGS. 12A to 12G and FIGS. 13H to 13M are diagrams for explanation of one example of the manufacturing method of the vibrator element.

Figure 12A:
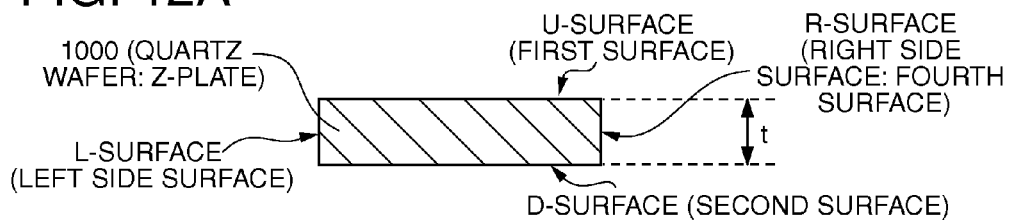
FIGS. 12A to 12G are diagrams for explanation of one example of a manufacturing method of the vibrator element.

At the step in FIG. 12A, a Z-plate wafer is cut out from a quartz crystal, and processing of lapping (irregularity removing processing using etching), etching (surface roughness removing processing), polishing (mirror-finishing using an abrasive agent), etc., for example, is performed on the front surface (the first surface) and the rear surface (the second surface) of the wafer.

Thereby, a Z-plate wafer 1000 of quartz crystal (hereinafter, referred to as "wafer") having the thickness t correctly controlled and the mirrored front surface and rear surface with high flatness is obtained.

Figure 12B:
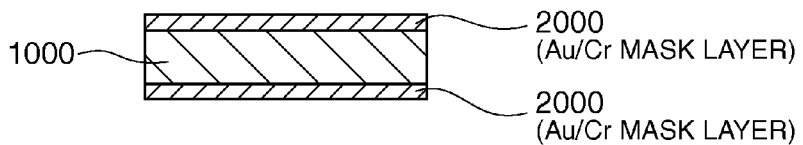

At the step in FIG. 12B, masks for outer shape processing 2000 in which Au/Cu are laminated, for example, are formed on the front surface and the rear surface of the wafer 1000.

Figure 12C:
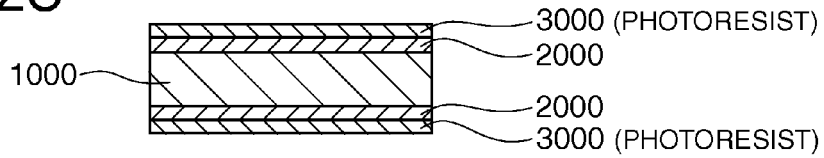

At the step in FIG. 12C, photoresists 3000 are formed on the front surface and the rear surface of the wafer 1000.

Figure 12D:
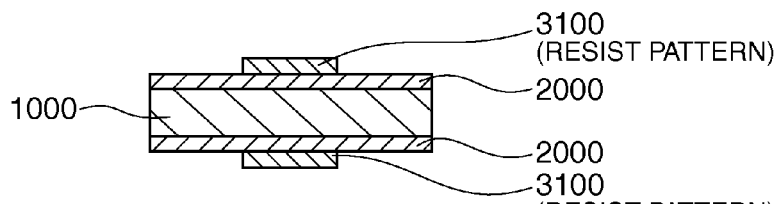

At the step in FIG. 12D, the photoresists 3000 are patterned. As a result, resist patterns 3100 are formed.

Figure 12E:
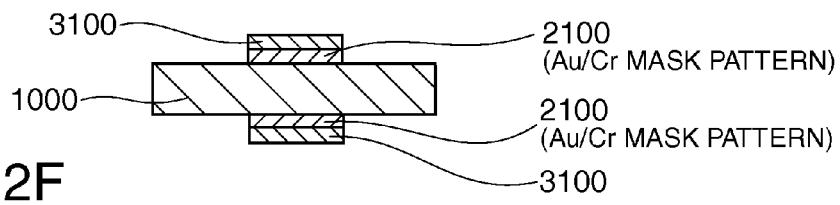

At the step in FIG. 12E, the masks for outer shape processing 2000 are patterned.

Figure 12F:
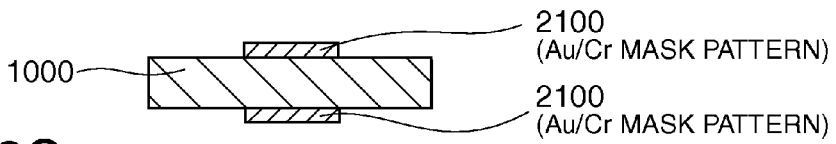

At the step in FIG. 12F, the resist patterns 3100 are removed. Thereby, patterned mask patterns for outer shape processing 2100 are obtained on the front surface and the rear surface of the wafer 1000.

Figure 12G:
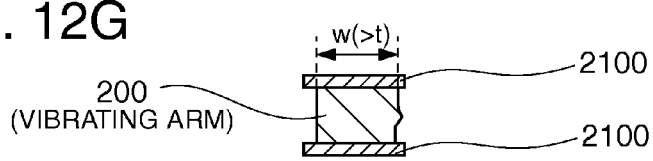

At the step in FIG. 12G, using the patterned mask patterns for outer shape processing 2100, for example, the outer shape of the wafer 1000 is processed by wet etching, for example. Thereby, for example, the outer shape of the vibrator element 90 as shown in FIG. 6A is obtained. Note that, at the step in FIG. 12G, for convenience of explanation, the shape of the cross-section of one vibrating arm 200 shown in FIG. 6A is shown.

As explained above, the width w of the vibrating arm 200 is set larger than the thickness t of the vibrating arm 200 (the thickness t of the wafer 1000 in FIG. 12A). By setting the width w of the vibrating arm 200 larger, electrodes and wirings are easier to be formed and the possibility of short circuit between electrodes and disconnection of electrodes and wirings is reduced.

On the other hand, by making the thickness t of the vibrating arm 200 thinner (smaller), the vibrating arm 200 becomes easier to flex in the vibration direction (the third direction: the Z-axis direction), and thereby, the detection sensitivity of a physical quantity of the sensor device formed by using the vibrator element is significantly improved.

Further, if outer shape processing of quartz crystal is performed by wet etching, fin portions are formed in the Y-axis direction, however, in the embodiment, because the walk mode is employed, the fin portions do not affect the detection sensitivity of the sensor device.

Subsequently, reference will be made to FIGS. 13H to 13M.

Figure 13H:
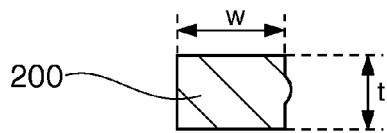
FIGS. 13H to 13M are diagrams for explanation of the example of the manufacturing method of the vibrator element.

At the step in FIG. 13H, the mask patterns for outer shape processing 2100 remaining in FIG. 12G are removed.

Thereby, the outer shape of the vibrator element as shown in FIG. 6A, for example, is obtained. Regarding the width w and the thickness t of the vibrating arm 200, w/t is satisfied.

Figure 13I:
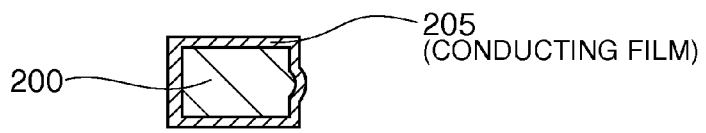

At the step in FIG. 13I, the conductor material is sputtered. On the respective front surface (the first surface), rear surface (the second surface), left side surface (the third surface), and right side surface of the vibrating arm 200 (the fourth surface), a conducting film 205 is formed.

Figure 13J:
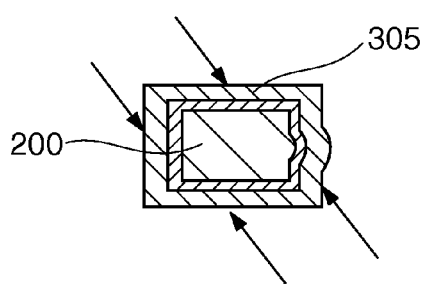

At the step in FIG. 13J, a resist film 305 is formed, and a pattern is burned on the resist film 305 by oblique exposure (for example, reduced projection exposure).

Figure 13K:
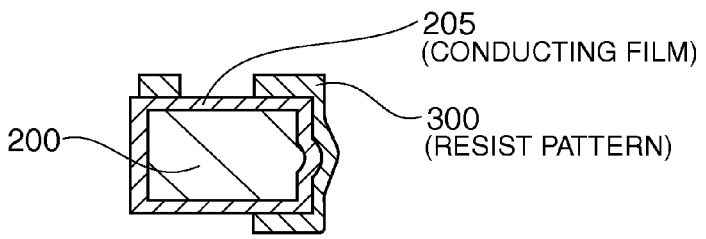

At the step in FIG. 13K, unnecessary parts of the resist film 305 are removed by etching, and the resist film 305 is patterned. As a result, a resist pattern 300 is obtained.

Figure 13L:
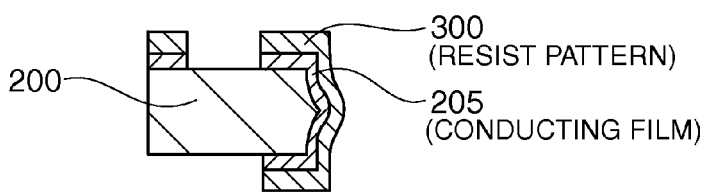
Figure 13M:
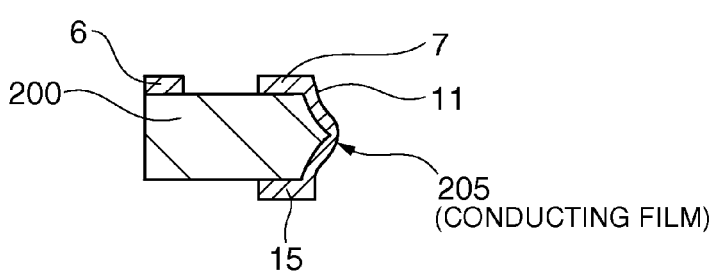

At the step in FIG. 13L, using the resist pattern 300, the conducting film 205 is patterned.

At the step in FIG. 13M, the resist pattern 300 is removed. Thereby, the electrode 6, the electrode 7, the rear-surface electrode 15, and the wiring part 11 (the sectional structure along A-A line in FIG. 8) are obtained.

Third Embodiment

In the embodiment, as a vibrator element, a double-tuning-fork vibrator element having a double-beam structure with two vibrating arms will be explained.

Figure 14:
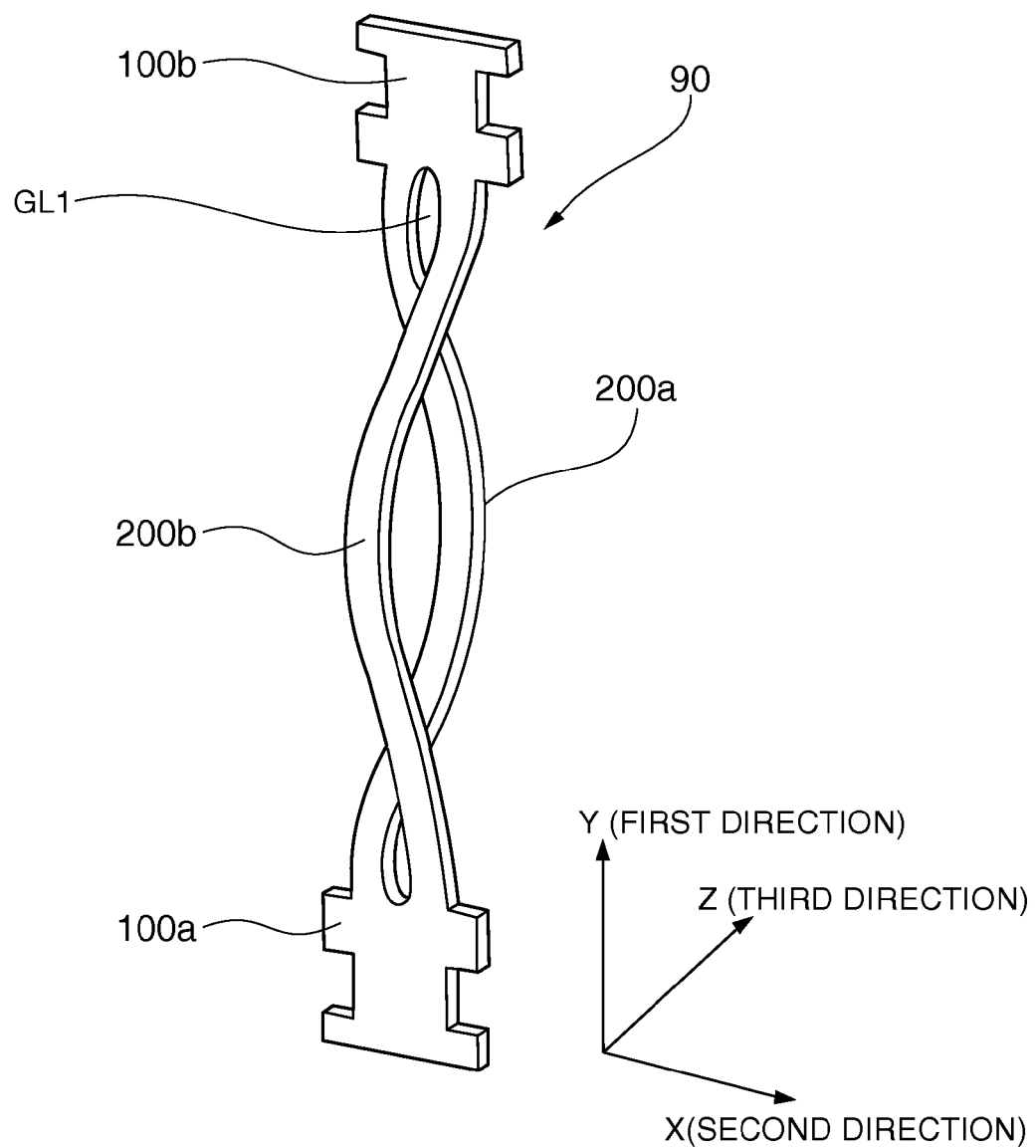
FIG. 14 is a perspective view showing another example of the vibrator element (an example of a double-beam configuration) vibrating in the walk mode.

FIG. 14 is a perspective view of a double-tuning-fork vibrator element having a double-beam structure vibrating in the walk mode.

As shown in FIG. 14, a double-tuning-fork vibrator element 90 includes a first base part 100a, a second base part 100b, a first vibrating arm 200a with one end fixed to the first base part 100a and the other end fixed to the second base part 100b, and a second vibrating arm 200b with one end fixed to the first base part 100a and the other end fixed to the second base part 100b.

Both the first vibrating arm 200a and the second vibrating arm 200b are held between the first base part 100a and the second base part 100b and extended out in the first direction (the Y-axis direction) in parallel to each other.

A through hole GL1 is provided between the first vibrating arm 200a and the second vibrating arm 200b. The through hole GL1 is formed by selectively removing a part of the quartz Z-plate.

The respective first vibrating arm 200a and second vibrating arm 200b vibrate in the third directions (the Z-axis directions: the +Z-axis direction and the −Z-axis direction). In the respective vibrating arms 200a, 200b, the vibration directions of the corresponding regions (the respective first regions ZA to third regions ZC) are opposite to each other. Thereby, the respective two vibrating arms 200a, 200b vibrate in the behavior like walking of a human.

Next, using FIGS. 15A to 15C, a specific example of an electrode arrangement in the double-tuning-fork vibrator element shown in FIG. 14 will be explained.

Figures 15A, 15B, 15C:
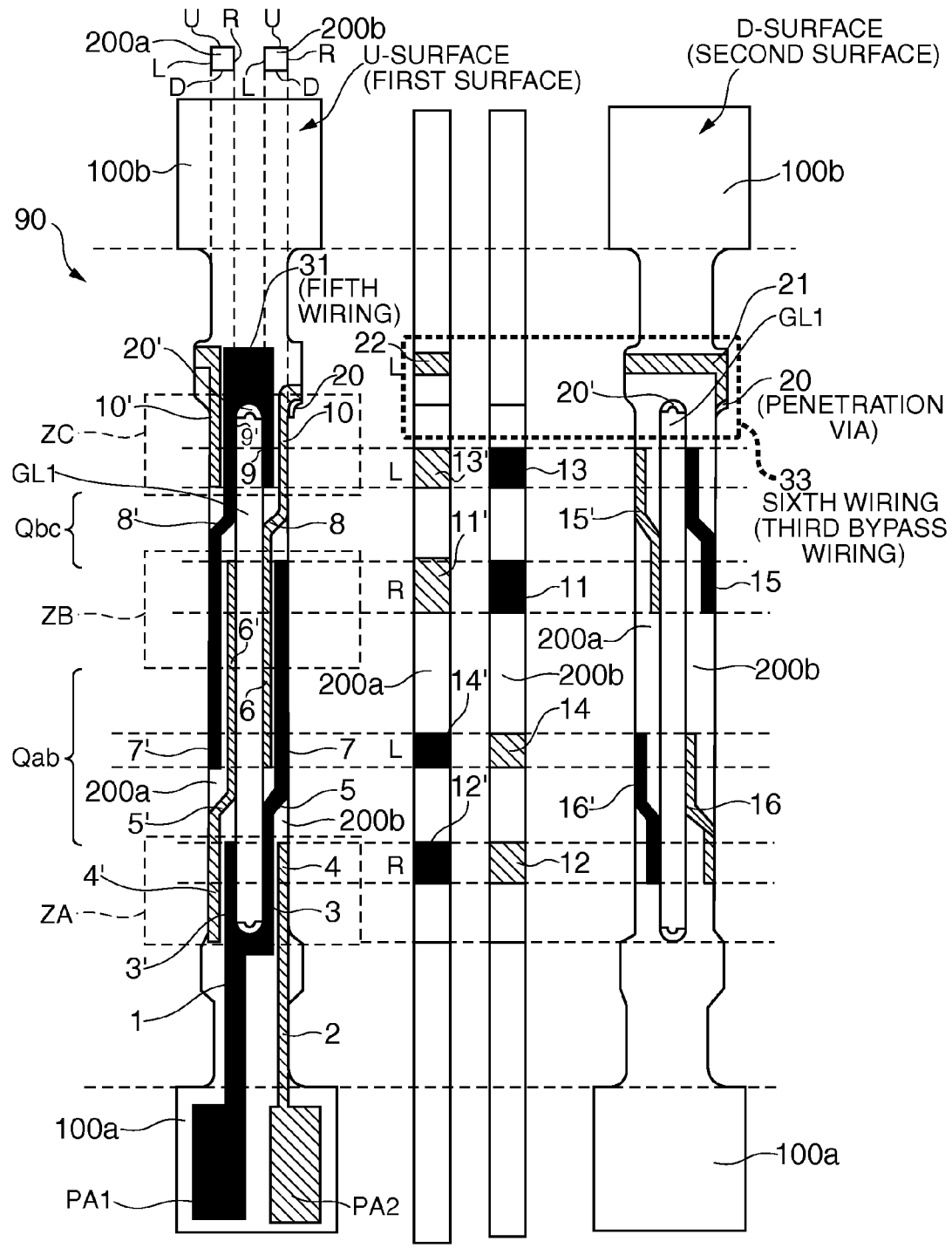
FIGS. 15A to 15C are diagrams for explanation of a specific example of an electrode arrangement in the vibrator element shown in FIG. 14.

FIGS. 15A to 15C are diagrams for explanation of the specific example of the electrode arrangement in the double-tuning-fork vibrator element shown in FIG. 14. FIG. 15A shows a conductor pattern on the front surface, FIG. 15B shows a conductor pattern on the side surfaces (the left side surface and the right side surface), and FIG. 15C shows a conductor pattern on the rear surface. Note that FIG. 15C is a perspective view from the front surface.

The respective FIGS. 15A to 15C correspond to the respective FIGS. 7A to 7C. Note that, in the embodiment, there are two vibrating arms and the vibration directions of the corresponding regions (the respective first regions ZA to third regions ZC) in the respective vibrating arms (the first vibrating arm 200a, the second vibrating arm 200b) are opposite to each other. Accordingly, it is necessary to form the conductor patterns so that the respective first vibrating arm 200a, second vibrating arm 200b may vibrate in the opposite directions to each other.

As methods of forming conductor patterns in the respective two vibrating arms, there are the following two methods.

The first method is a method of bifurcating the wiring patterns extracted from the respective first voltage supply region PA1 and second voltage supply region PA2 and using ones of the bifurcated wirings as extraction wirings for the first vibrating arm 200a and the others as extraction wirings for the second vibrating arm 200b.

If the method is employed, the conductor patterns necessary for driving of the respective two vibrating arms (200a, 200b) may be formed by applying the conductor pattern shape for one vibrating arm that has been explained in FIGS. 7A to 7C to the respective two vibrating arms (200a, 200b).

The second method is a method of connecting one vibrating arm (200a) and the other vibrating arm (200b) with a wiring for connection between arms at the second base part 100b side where the respective voltage supply regions (PA1, PA2) are not formed, and supplying voltages necessary for generation of an electric field to the one vibrating arm (200a) via the other vibrating arm (200b) and the wiring for connection between arms, for example.

In the example in FIGS. 15A to 15C, as a method of forming the conductor patterns, the first method and the second method are used in combination.

As below, the conductor patterns in FIGS. 15A to 15C will be explained. Basically, they are the same as the conductor patterns shown in FIGS. 7A to 7C. Note that, in the embodiment, the number of vibrating arms is two, and accordingly, electrodes and wirings are added.

The parts as added electrodes and wirings corresponding to the electrodes and the wirings shown in FIGS. 7A to 7C are shown with prime marks to the common signs. For example, the parts assigned with the signs of 3' to 16' are the electrode parts and the wiring parts newly added.

Further, in the conductor patterns in FIGS. 15A to 15C, a fifth wiring 31 and a sixth wiring (a third bypass wiring) 33 are newly added. The fifth wiring 31 and the sixth wiring 33 function as a wiring for connection between arms.

The fifth wiring 31 is a wiring formed on the front surface (first surface) connecting the first electrode 9 and the first electrode 9' in the third region ZC. The fifth wiring 31 is not necessarily provided for supply of a voltage to the first electrode, however, it contributes to homogenization of the potential of the first conductor pattern.

The fifth wiring 31 is the wiring on the front surface (first surface), and, on the other hand, the sixth wiring (the third bypass wiring) 33 is formed as a bypass wiring via the other surfaces (the second surface to the fourth surface) than the first surface, and thereby, crossing (crossing apart on the front surface and the rear surface) of them is realized.

As below, specific explanation will be made. First, attention is focused on the connection parts between the first base part 100a and the respective vibrating arms (200a, 200b) in FIG. 15A. Regarding the first conductor pattern (the pattern blackened as the conductor pattern containing the first electrodes), a wiring 1 extracted from the first voltage supply region PA1 is divided into two electrodes (two wirings) 3, 3'.

One electrode 3 of the bifurcated wirings is used as a wiring for the second vibrating arm 200b, and the other electrode 3' is used as a wiring for the first vibrating arm 200a.

On the other hand, regarding the second conductor pattern (the pattern shaded as the conductor pattern containing the second electrodes), a wiring 2 extracted from the second voltage supply region PA2 is not divided, but used as a wiring for the second vibrating arm 200b.

It may be impossible to provide an extraction line to directly connect the second voltage supply region PA2 and the second electrodes (10', 6', 4') of the first vibrating arm 200a, and thus, it may be impossible to directly supply voltages from the second voltage supply region PA2.

Accordingly, voltages are supplied to the second electrodes (10', 6', 4') of the first vibrating arm 200a via the sixth wiring (the third bypass wiring) 33 provided at the second base part 110b side.

Here, attention is focused on the connection parts between the second base part 100b and the respective vibrating arms (200a, 200b) in FIGS. 15A to 15C. The sixth wiring (the third bypass wiring) 33 is shown by being surrounded by a dotted line in FIGS. 15B and 15C.

The sixth wiring (the third bypass wiring) 33 is a wiring for connection between arms for connecting the second electrode 10 for the second vibrating arm 200b and the second electrode 10' for the first vibrating arm 200a in the third region ZC. The sixth wiring (the third bypass wiring) 33 includes a penetration via 20, a wiring part 21 on the rear surface (the second surface) 21, and a wiring part 22 on the left side surface (the third surface) as component elements.

The penetration via 20 is formed on the wall surface of the projecting region provided in the right end part of the third region ZC. Note that a penetration via 20' is also formed on the inner wall surface at the second base part 100b side of the through hole GL1 and a penetration via (no sign is assigned) is formed on the inner wall surface at the first base part 100a side of the through hole GL1, however, they are not used in particular.

The penetration vias (20, 20', etc.) are naturally formed in the manufacturing process of the double-tuning-fork vibrator element. That is, by forming the conductor films by sputtering or the like, the conductor films are formed on the outer side surfaces of the base parts, the inner side surfaces of the through holes, etc. Further, to form the side surface wiring patterns of the vibrating arms, for example, if the side surfaces of the vibrating arms are patterned using diagonal exposure as shown in FIG. 13J, consequently, the penetration vias (20, 20', etc.) are not removed, but left.

That is, in the case where one vibrating arm is regarded as a hexahedron having the front surface (the first surface), the rear surface (the second surface), the left side surface (third surface), the right side surface (fourth surface), the forward surface (the fifth surface), and the backward surface (the sixth surface), light may be applied (the pattern may be burned) by one exposure on the front surface (the first surface), the rear surface (the second surface), the left side surface (third surface), and the right side surface (fourth surface).

However, it may be impossible to perform exposure on the forward surface (the fifth surface) and the backward surface (the sixth surface) perpendicular to the four surfaces (the first surface to the fourth surface). Accordingly, patterning is performed on the four surfaces by exposure, the conductors formed on the surfaces corresponding to the forward surface (the fifth surface) and the backward surface (the sixth surface) are not removed, but left.

The conductor parts referred to as the penetration vias (20, 20', etc.) are naturally formed in the manufacturing process of the double-tuning-fork vibrator element by photolithography, and no special manufacturing step is necessary for the formation. Therefore, the number of manufacturing steps is not increased.

In the embodiment, the voltage supply path to the second electrode 10' of the first vibrating arm 200a is secured using the penetration via 20 as the bypass wiring for connection between arms for connecting the second electrode 10 for the second vibrating arm 200b and the second electrode 10' for the first vibrating arm 200a in the third region ZC, and efficient and reasonable wiring patterns (conductor patterns) are realized.

Figures 16A, 16B:
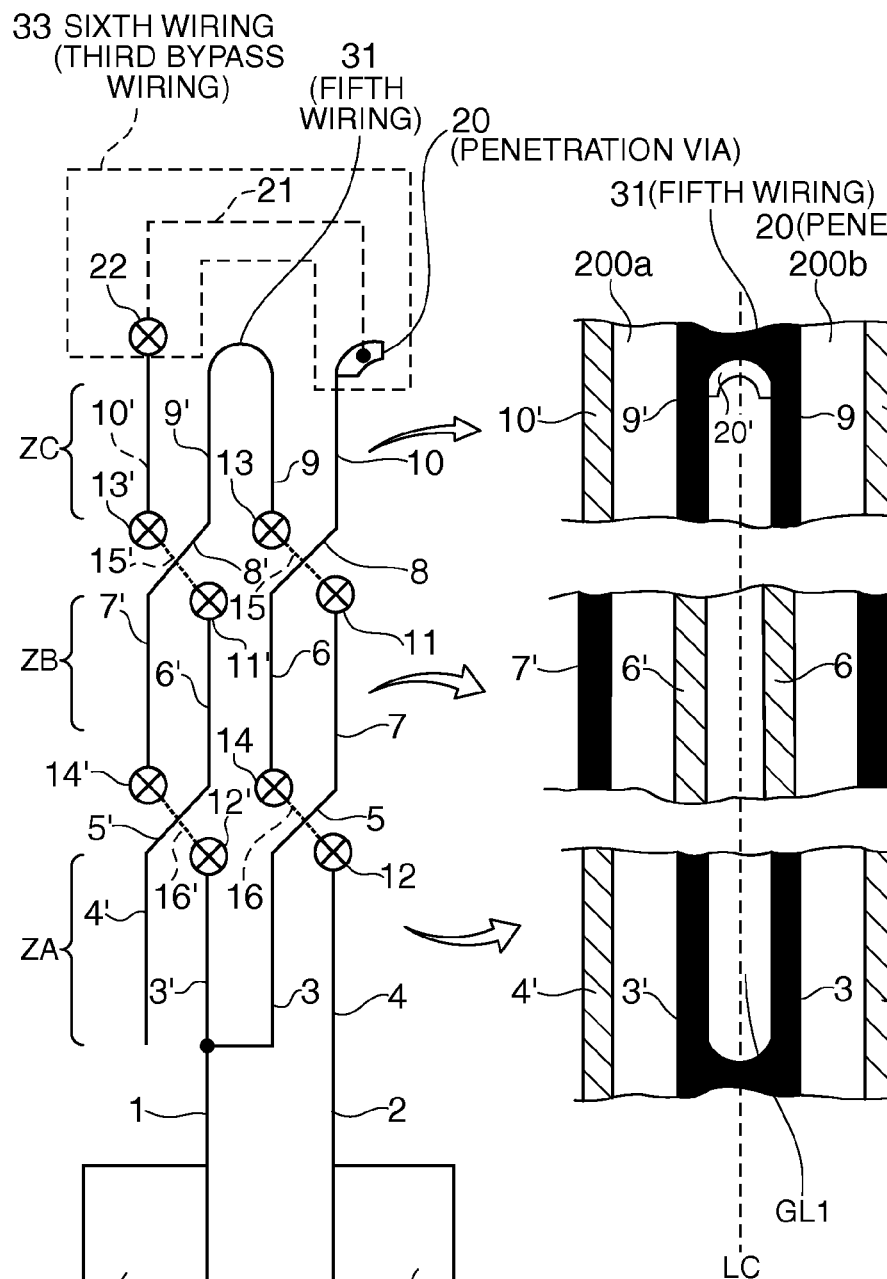
FIGS. 16A and 16B are diagrams for explanation of a first conductor pattern and a second conductor pattern and their symmetry in the vibrator element shown in FIGS. 15A to 15C.

FIGS. 16A and 16B are diagrams for explanation of the first conductor pattern and the second conductor pattern and their symmetry in the double-tuning-fork vibration reed shown in FIGS. 15A to 15C.

In FIGS. 16A and 16B, the same reference signs are assigned to the parts in common with FIGS. 15A to 15C.

In FIG. 16A, the electrodes or wirings (1 to 10, 31, 3' to 10') on the front surface (the U-surface: the first surface) of the vibrating arms (200a, 200b) are shown by solid lines.

Further, the wirings (16, 15, 16', 15', 21) on the rear surface (the D-surface, the second surface) are shown by dotted lines.

Furthermore, the side surface wirings (the right side surface wirings 12, 11, 12', 11' and the left side surface wirings 14, 13, 14', 13', 22) for connecting the wirings on the front surface and the wirings on the rear surface are shown by encircled X-marks.

In FIG. 16B, the arrangements of the first electrodes (3', 7', 9') and the second electrodes (4', 6', 10') of the first vibrating arm 200a and the first electrodes (3, 7, 9) and the second electrodes (4, 6, 10) of the second vibrating arm 200b of the respective first region (ZA) to third region (ZC) are shown. All of these electrodes are formed on the front surface (the first surface).

A through hole GL1 is provided between the first vibrating arm 200a and the second vibrating arm 200b. The through hole GL1 has a closed outer shape with the first direction as the extension direction of the respective vibrating arms 200a, 200b as a longitudinal direction in a plan view (a plan view on the first surface) seen from the third direction (the Z-axis direction).

That is, the through hole has the closed outer shape determined by a pair of straight lines extending along the longitudinal direction and opposed to each other and semicircular curves at the first base part 100a and the second base part 100b sides connecting both ends of the pair of straight lines.

The closed outer shape is line-symmetric with respect to a center line LC along the first direction as a straight line dividing an area determined by the outer shape into two halves.

Further, the arrangement of the first electrodes and the second electrodes (4' and 3', 7' and 6', 10' and 9') in the kth (k is one of 1, 2, and 3) region of one vibrating arm (200a) of the pair of vibrating arms (200a, 200b) adjacent to each other and the arrangement of the first electrodes and the second electrodes (3 and 4, 6 and 7, 9 and 10) in the kth region of the other vibrating arm (200b) form an arrangement in which the first electrodes and the second electrodes overlap each other when the one vibrating arm (200a) and the other vibrating arm (200b) are folded along the center line LC.

That is, the electrode arrangement in which, in the first region ZA, the second electrodes 4' and 4 overlap and the first electrodes 3' and 3 overlap, in the second region ZB, the first electrodes 7' and 7 overlap and the second electrodes 6' and 6 overlap, and, in the third region ZC, the second electrodes 10' and 10 overlap and the first electrodes 9' and 9 overlap is employed.

By employing the electrode arrangement, a patterning step for dividing the penetration vias 20 and 20' into two is not necessary, and, in this respect, increase in the number of steps is suppressed. This will be explained specifically using FIG. 19B in the next embodiment.

Fourth Embodiment

Figure 17:
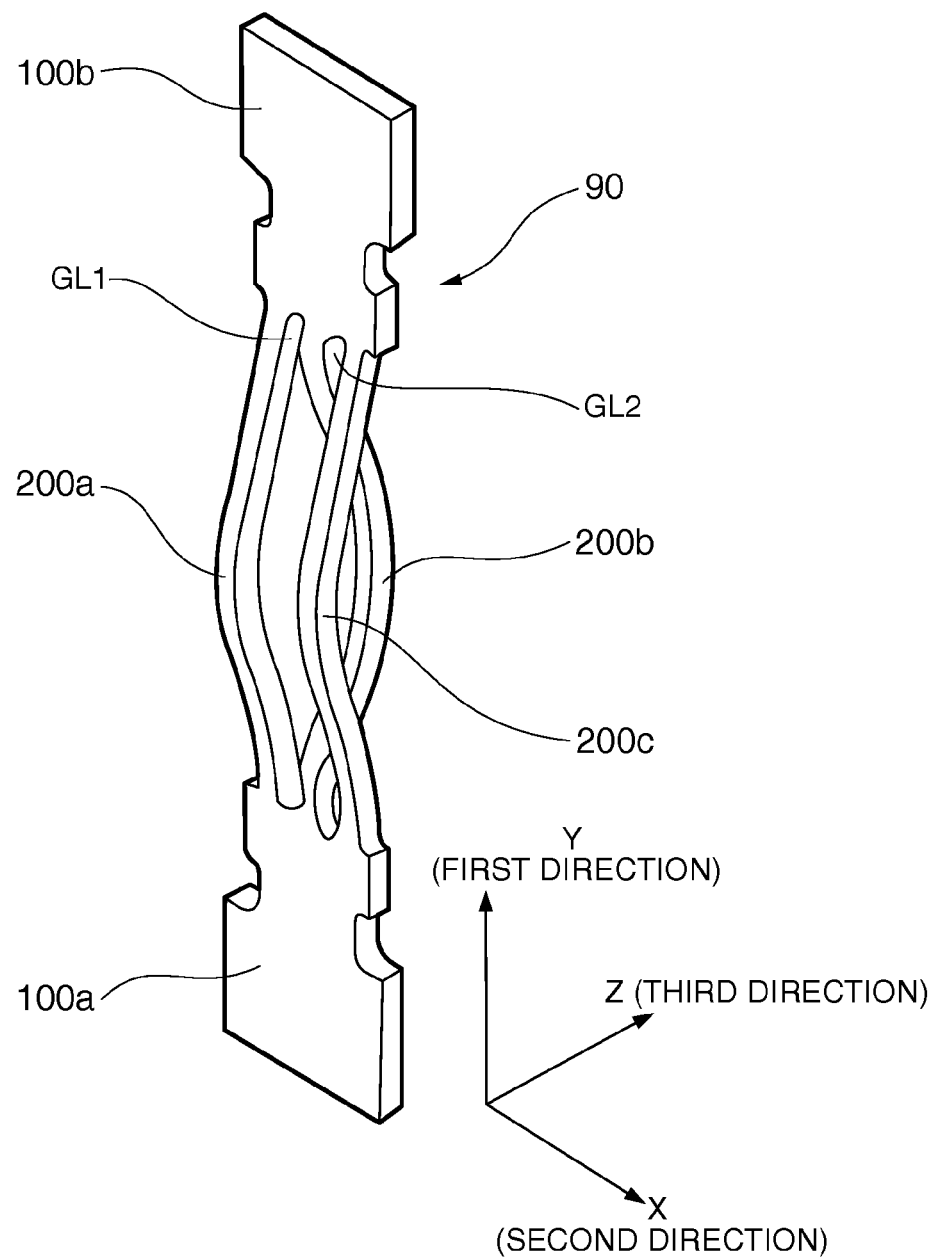
FIG. 17 is a perspective view showing another example of the vibrator element (an example of a triple-beam configuration) vibrating in the walk mode.

In the embodiment, as a vibrator element, a double-tuning-fork vibrator element having a triple-beam structure with three vibrating arms will be explained. FIG. 17 is a perspective view of a double-tuning-fork vibrator element having a triple-beam structure vibrating in the walk mode.

A double-tuning-fork vibrator element 90 as shown in FIG. 17 includes a first base part 100a, a second base part 100b, a first vibrating arm 200a with one end fixed to the first base part 100a and the other end fixed to the second base part 100b, a second vibrating arm 200b with one end fixed to the first base part 100a and the other end fixed to the second base part 100b, and a third vibrating arm 200c with one end fixed to the first base part 100a and the other end fixed to the second base part 100b.

The respective first vibrating arm 200a to third vibrating arm 200c are held between the first base part 100a and the second base part 100b and extended in the first direction (the Y-axis direction) in parallel to each other.

A through hole (a first through hole) GL1 is provided between the first vibrating arm 200a and the second vibrating arm 200b, and a through hole (a second through hole) GL2 is provided between the second vibrating arm 200b and the third vibrating arm 200c. The through holes GL1, GL2 are formed by selectively removing parts of a quartz Z-plate. The respective first vibrating arm 200a to third vibrating arm 200c vibrate in the third directions (the Z-axis directions: the +Z-axis direction (the positive third direction) and the −Z-axis direction (the negative third direction)).

For example, when the second regions ZB of the first vibrating arm 200a and the third vibrating arm 200c displace in the positive third direction, the second region ZB of the second vibrating arm 200b displaces in the negative third direction.

Further, when the second regions ZB of the first vibrating arm 200a and the third vibrating arm 200c displace in the negative third direction, the second region ZB of the second vibrating arm 200b displaces in the positive third direction.

The three vibrating arms are provided in FIG. 17, however, m (m is an odd number equal to or more than three) vibrating arms may be provided. In this case, the first vibrating arm to the mth vibrating arm are arranged in juxtaposition along the second direction in the ascending order of m values, the m vibrating arms are sectioned into three groups of vibrating arms, and the first vibrating arm to the (m/3)th vibrating arm are the first group of vibrating arms, the (m/3+1)th vibrating arm to the (2m/3)th vibrating arm are the second group of vibrating arms, and the (2m/3+1)th vibrating arm to the mth vibrating arm are the third group of vibrating arms.

Here, when the second regions of the first group of vibrating arms and the third group of vibrating arms displace in the positive third direction, the second regions ZB of the second group of vibrating arms displace in the negative third direction, and when the second regions of the first group of vibrating arms and the third group of vibrating arms displace in the negative third direction, the second regions ZB of the second group of vibrating arms displace in the positive third direction.

By providing the odd-number of vibrating arms vibrating in the walk mode, the vibration in the walk mode may be stabilized. Therefore, in the case where the vibrating arms are excited in the walk mode, it is preferable to provide the odd-number of vibrating arms.

As below, advantages of providing the odd-number of vibrating arms will be explained.

In order to stably sustain the vibration in the walk mode, it is preferable to suppress the walk-mode vibration of the respective vibrating arms (the respective three vibrating arms 200a to 200c in the example of FIG. 17) from leaking to the respective base parts 100a, 100b.

The respective base parts 100a, 100b of the double-tuning-fork vibrator element 90 are fixed to a base member (a member forming a part of the package or the like, not shown), for example, using an adhesive agent, for example.

If the walk mode in which the respective vibrating arms 200a to 200c vibrate in the direction of the thickness t (the third direction) is employed, the vibration may leak to the respective base parts 100a, 100b sides from the respective vibrating arms 200a to 200c and the vibration is disturbed, and inconveniences that separation of the adhesive agent or the like may occur.

In order not to cause the situation, it is preferable to provide the odd-number (odd-number of groups) of vibrating arms in parallel, vibrate the vibrating arms at both ends of the respective vibrating arms (the groups of vibrating arms at both ends) in the same phase, and vibrate the center vibrating arm (the center group of vibrating arms) in the reversed phase.

If the configuration is employed, the vibration of the vibrating arms of the double-tuning-fork vibrator element is dynamically balanced in the direction of the width w (the second direction) of the vibrating arms and dynamically balanced in the direction of the thickness t (the third direction) of the vibrating arms in the plan view.

Therefore, the load on the base parts supporting the respective vibrating arms is not excessive and the leak of the vibration is suppressed.

That is, assuming that the first group, the second group, and the third group of vibrating arms sequentially arranged along the second direction are provided, if the second regions of the first group and the third group of vibrating arms displace in the positive third direction, the second regions of the center second group of vibrating arms displace in the negative third direction.

In this case, the first group and the third group as the groups at both ends displace in the same phase and balanced in the second direction (arrangement direction) in the plan view. Further, the first group and third group and the second group displace in the reversed phase, and the stresses (the stresses on the base parts supporting the respective groups of vibrating arms) due to the displacements of the respective groups in the third direction (the vibration direction) are cancelled out, and balanced also in the vibration direction.

Next, using FIGS. 18A to 18C, a specific example of an electrode arrangement in the double-tuning-fork vibrator element shown in FIG. 17 will be explained.

FIGS. 18A to 18C are diagrams for explanation of the specific example of the electrode arrangement in the double-tuning-fork vibrator element shown in FIG. 17. FIG. 18A shows a conductor pattern on the front surface, FIG. 18B shows a conductor pattern on the side surfaces (the left side surface and the right side surface), and FIG. 18C shows a conductor pattern on the rear surface. Note that FIG. 18C is a perspective view from the front surface.

The respective FIGS. 18A to 18C correspond to the above explained respective FIGS. 15A to 15C. Note that, in the embodiment, there are three vibrating arms and, regarding the vibration directions of the corresponding regions (the first regions ZA to the third regions ZC) in the respective vibrating arms (the first vibrating arm 200*a*, the second vibrating arm 200*b*, the third vibrating arm 200*c*), the first vibrating arm 200*a* and the third vibrating arm 200*c* vibrate in the same direction and the second vibrating arm 200*b* vibrates in the opposite direction.

Accordingly, it is necessary to form the conductor patterns so that the respective vibrating arms (the first vibrating arm 200*a*, the second vibrating arm 200*b*, the third vibrating arm 200*c*) vibrate in the above described manner.

The conductor patterns used in FIGS. 18A to 18C are based on the above explained conductor patterns in FIGS. 15A to 15C, and the design method for forming the conductor patterns is common.

That is, the design method (the first method) of bifurcating the wiring patterns extracted from the respective first voltage supply region PA1 and second voltage supply region PA2 and the method (the second method) of connecting one vibrating arms (200*a*, 200*b*) and the other vibrating arm (200*c*) with a wiring for connection between arms at the second base part 100*b* side where the respective voltage supply regions (PA1, PA2) are not formed, and supplying voltages necessary for generation of vibration via the wiring for connection between arms are used in combination.

Note that, in the example of FIG. 18A to FIG. 18C, the number of vibrating arms is three and also the extraction wiring 2 extracted from the second voltage supply region PA2 is also bifurcated. Accordingly, electrodes and wirings are further added in the example of FIG. 18A to FIG. 18C.

The parts as added electrodes and wirings corresponding to the electrodes and the wirings shown in FIGS. 15A to 15C are shown with double prime marks to the common signs. For example, the parts assigned with the signs of 3" to 16" and the wiring 31' are the electrode parts and the wiring parts newly added.

Note that the wiring 31' is a wiring for connection between arms for connecting the second electrode 10 of the third region ZC of the second vibrating arm 200*b* and the second electrode 10" of the third region ZC of the third vibrating arm 200*c*, and corresponds to the fifth wiring 31.

Further, the fifth wiring 31 is the wiring for connection between arms for connecting the first electrode 9' of the first vibrating arm 200*a*, the first electrode 9 of the second vibrating arm 200*b*, and the first electrode 9" of the third vibrating arm 200*c* in the third regions ZC, and formed on the front surface (first surface) of the vibrating arms.

The fifth wiring 31 includes a wiring part 31A linearly extracted in the second direction for connecting the first electrode 9' of the first vibrating arm 200*a*, the first electrode 9 of the second vibrating arm 200*b*, and the first electrode 9" of the third vibrating arm 200*c*, and the necessary wiring for voltage supply.

On the other hand, the sixth wiring 33 (the wiring in the part shown by being surrounded by a dotted line in FIGS. 18B and 18C) is a bypass wiring (the third bypass wiring) via a penetration via 20, a wiring part 21 on the second surface 21, and a wiring part 22 on the left side surface (the third surface).

The fifth wiring 31 is the wiring on the front surface (first surface), and, on the other hand, the sixth wiring (the third bypass wiring) 33 is formed as a bypass wiring via the other surfaces (the second surface to the fourth surface) than the first surface, and thereby, crossing (crossing apart on the front surface and the rear surface) of them is realized.

The configuration of the double-tuning-fork vibrator element shown in FIGS. 18A to 18C will be summarized as below.

That is, the double-tuning-fork vibrator element 90 has three vibrating arms, and the respective vibrating arms are arranged in juxtaposition in the order of the first vibrating arm 200*a*, the second vibrating arm 200*b*, and the third vibrating arm 200*c* along the positive second direction (the direction from left to right on the paper, the +X-axis direction).

The through hole GL1 is provided between the first vibrating arm 200*a* and the second vibrating arm 200*b*, and the through hole GL2 is provided between the second vibrating arm 200*b* and the third vibrating arm 200*c*.

On the first base part 100*a*, the first voltage supply region PA1 for supplying voltages to the first electrodes (the first conductor pattern: the blackened pattern) and the second voltage supply region PA2 for supplying voltages to the second electrodes (the second conductor pattern: the shaded pattern) are provided.

The first voltage supply region PA1 and the second voltage supply region PA2 are arranged on the first surface (for example, the front surface) of the first base part 100*a* adjacently along the second direction.

The first extraction wiring 1 extracted from the first voltage supply region PA1 is bifurcated, and one of the first extraction wiring 1 is connected to the first electrode 3' of the first region ZA in the first vibrating arm 200*a*, and the other of the first extraction wiring 1 is connected to the first electrode 3 of the first region ZA in the second vibrating arm 200*b*.

The second extraction wiring 2 extracted from the second voltage supply region PA2 is bifurcated, and one of the second extraction wiring 2 is connected to the second electrode 4 of the first region ZA in the second vibrating arm 200*b*, and the other of the second extraction wiring 2 is connected to the second electrode 4" of the first region ZA in the third vibrating arm 200*c*.

Further, the first electrode 9' of the third region ZC of the first vibrating arm 200*a* and the first electrode 9 of the third region ZC of the second vibrating arm 200*b* are electrically connected by the first electrode 9" of the third region ZC in the third vibrating arm 200*c* and the fifth wiring 31.

On the other hand, the second electrode 10 of the third region ZC of the second vibrating arm 200*b* and the second electrode 10" of the third region ZC of the third vibrating arm 200*c* are electrically connected by the second electrode 10' of the third region ZC of the first vibrating arm 200*a* and the sixth wiring (the third bypass wiring) 33.

The sixth wiring (the third bypass wiring) 33 is a wiring via the penetration via (having a function of a contact plug) 20 provided to cover the inner wall surface of the second base part side 100*b* of the through hole GL2, the wiring part 21 on the second surface (the rear surface) articulated to the penetration via 20, and the side surface wiring 22 on the third surface (the left side surface) articulated to the wiring part 21.

As described above, for example, in order to supply voltages for the first electrodes to the three vibrating arms, for example, a wiring pattern in which wirings for the first electrodes are trifurcated from the first bonding pad and wirings for the second electrodes are trifurcated from the second bonding pad is difficult to be employed under the situations in which the use of multilayer wiring may be impossible.

Accordingly, the wiring 1 extracted from the first voltage supply region PA1 provided in the first base part 100*a* is bifurcated and voltages are supplied to the first electrode 3' of the first region ZA of the first vibrating arm 200*a* and the first electrode 3 of the first region ZA of the second vibrating arm 200*b* via the respective bifurcated wirings.

It may be impossible to supply a voltage directly from the first voltage supply region PA1 to the first electrode 3" of the third vibrating arm 200c, and thus, other paths for supplying voltages to the first electrodes (3", 7", 9") of the third vibrating arm 200c are provided.

The other paths are paths via at least one first electrodes (9', 9) of the first vibrating arm 200a and the second vibrating arm 200b.

The first electrodes (3' and 7' and 9', 3 and 7 and 9) of the respective first, second, third regions (ZA to ZC) in the respective first vibrating arm 200a and second vibrating arm 200b are electrically connected to one another.

Further, the first electrode 9' in the third region ZC of the first vibrating arm 200a and the first electrode 9 in the third region ZC of the second vibrating arm 200b are commonly connected in the penetration via 20' of the inner wall surface at the second base part 100b side of the through hole GL1 and the fifth wiring pattern 31 nearby.

Therefore, a wiring 31A is extracted from the commonly connected part and the wiring 31A is connected to the first electrode 9" of the third region ZC of the third vibrating arm 200c.

Regarding the third vibrating arm 200c, the first electrodes (3" and 7" and 9") of the respective first, second, third regions (ZA to ZC) are electrically connected to one another. Therefore, if a voltage is supplied to the first electrode 9" of the third region ZC, necessary voltages may be supplied to the first electrodes (7" and 3") of the second region ZB and the first region ZA.

Regarding the second electrodes, the electric connection between the second electrodes of the respective vibrating arms is secured based on the same idea.

That is, the wiring 2 extracted from the second voltage supply region PA2 is bifurcated and the respective furcated wirings are supplied to the respective second electrode 4 of the first region ZA of the second vibrating arm 200b and second electrode 4" of the first region ZA of the third vibrating arm 200c.

The second electrodes (4 and 6 and 10, 4" and 6" and 10") of the respective first, second, third regions (ZA to ZC) in the respective second vibrating arm 200b and third vibrating arm 200c are electrically connected to one another.

Further, the second electrode 10 of the third region ZC in the second vibrating arm 200b and the second electrode 10" of the third region ZC in the third vibrating arm 200c are commonly connected by the penetration via 20 formed on the inner wall surface at the second base part 100b side of the through hole GL2 and the pattern 31' around.

Further, via the penetration via 20, the wiring part 21 (the rear surface wiring part) is extracted from the second surface (the rear surface) and a path further via the wiring part 22 on the third surface (the left side surface) is secured. The path is the sixth wiring (the third pass wiring) 33, and necessary voltages may be supplied to the second electrodes (4' and 6' and 10') in the first vibrating arm 200a via the sixth wiring (the third pass wiring) 33.

As described above, even in the case where both the first voltage supply region PA1 for the first electrodes and the second voltage supply region PA2 for the second electrodes are formed at the first base part 100a side, necessary voltages may efficiently be supplied to the first electrodes and the second electrodes of the respective three vibrating arms 200a to 200c.

Especially, the voltage supply path to the second electrodes of the first vibrating arm 200a is secured using the penetration via 20 formed on the inner wall surface at the second base part 100b side of the through hole GL1 as the bypass wiring for connection between arms (the sixth wiring 33), and thus, a reasonable wiring pattern may be formed.

Figures 19A, 19B:
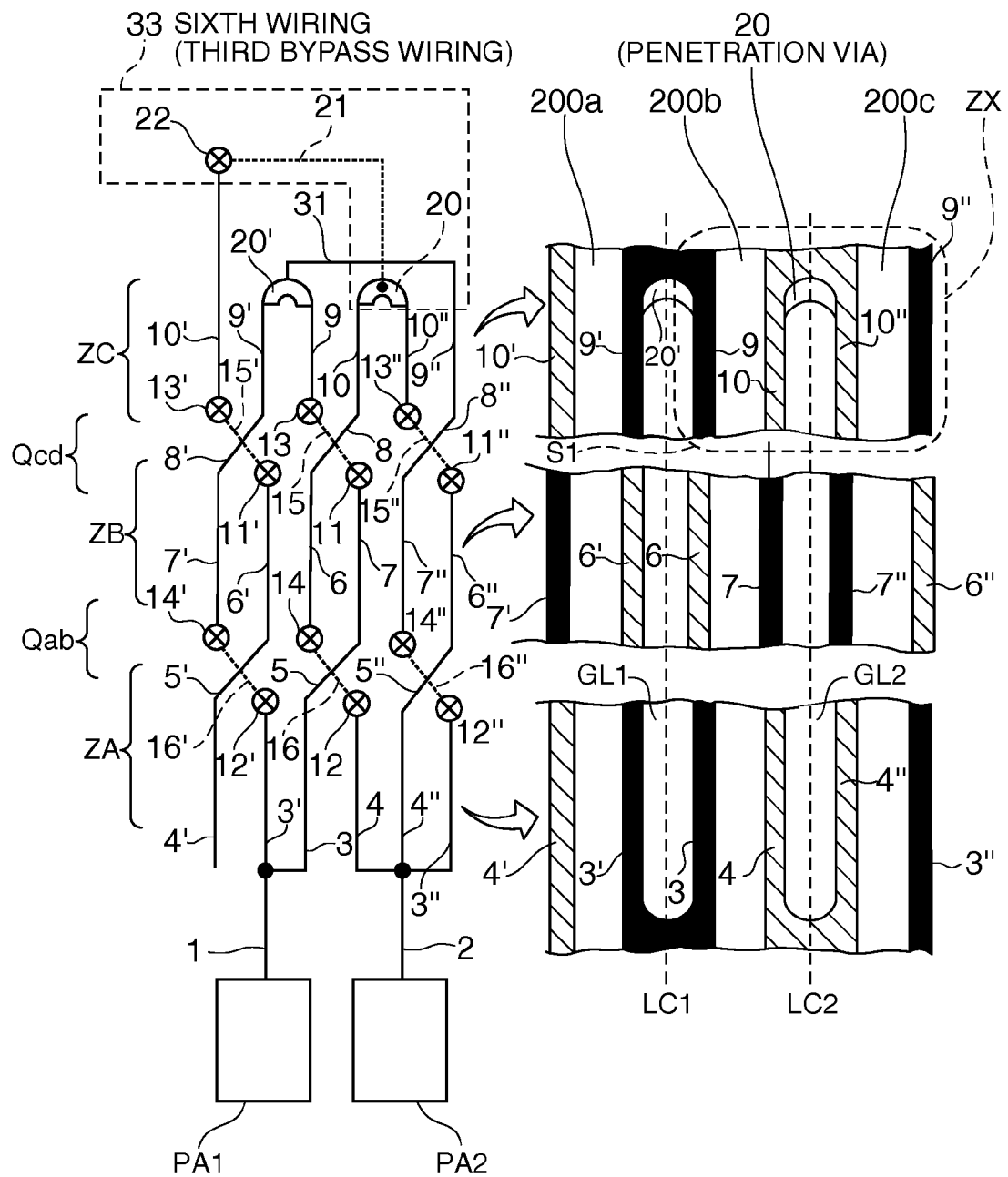
FIGS. 19A and 19B are diagrams for explanation of a first conductor pattern (blackened pattern) and a second conductor pattern (shaded pattern) and their symmetry in the tuning-fork vibrator element shown in FIGS. 18A to 18C.

FIGS. 19A and 19B are diagrams for explanation of a first conductor pattern (blackened pattern) and a second conductor pattern (shaded pattern) and their symmetry in the double-tuning-fork vibration reed shown in FIGS. 18A to 18C.

In FIGS. 19A and 19B, the same reference signs are assigned to the parts in common with FIGS. 18A to 18C.

In FIG. 19A, the wirings (1 to 10, 31, 3' to 10', 3" to 10") on the front surface (the U-surface: the first surface) of the respective vibrating arms (200a, 200b, 200c) are shown by solid lines.

Further, the wirings (16, 15, 16', 15', 21, 16", 15") on the rear surface (the D-surface: the second surface) are shown by dotted lines.

Furthermore, the side surface wirings (the right side surface wirings 12, 11, 12', 11', 11", 12" and the left side surface wirings 14, 13, 14', 13', 22, 14", 13") for connecting the wirings on the front surface and the rear surface are shown by encircled X-marks.

In FIG. 19B, in the respective first region (ZA) to the third region (ZC), arrangements of the first electrodes (3', 7', 9') and the second electrodes (4', 6', 10') of the first vibrating arm 200a, the first electrodes (3, 7, 9) and the second electrodes (4, 6, 10) of the second vibrating arm 200b, and the first electrodes (3", 7", 9") and the second electrodes (4", 6", 10") of the third vibrating arm 200c are shown.

As illustrated, a through hole GL1 is provided between the first vibrating arm 200a and the second vibrating arm 200b, and the through hole GL1 has a closed outer shape with the first direction as the extension direction of the respective vibrating arms 200a, 200b as a longitudinal direction in a plan view seen from the third direction (the Z-axis direction).

That is, the through hole has the closed outer shape determined by a pair of straight lines extending along the longitudinal direction and opposed to each other and semicircular curves at the first base part 100a and the second base part 100b sides connecting both ends of the pair of straight lines.

The closed outer shape is line-symmetric with respect to a center line LC1 along the first direction as a straight line dividing an area determined by the outer shape into two halves.

Further, the arrangement of the first electrodes and the second electrodes (3' and 4', 7' and 6', 9' and 10') in the kth (k is one of 1, 2, and 3) region of one vibrating arm (200a) of the pair of vibrating arms (200a, 200b) adjacent to each other and the arrangement of the first electrodes and the second electrodes (3 and 4, 7 and 6, 9 and 10) in the kth region of the other vibrating arm (200b) form an arrangement in which the first electrodes and the second electrodes overlap each other when the one vibrating arm (200a) and the other vibrating arm (200b) are folded along the center line LC1.

That is, the electrode arrangement in which, in the first region ZA, the second electrodes 4' and 4 overlap and the first electrodes 3' and 3 overlap, in the second region ZB, the first electrodes 7' and 7 overlap and the second electrodes 6' and 6 overlap, and, in the third region ZC, the second electrodes 10' and 10 overlap and the first electrodes 9' and 9 overlap is employed.

Similarly, a through hole GL2 is provided between the second vibrating arm 200b and the third vibrating arm 200c, and the through hole GL2 has a closed outer shape with the first direction as the extension direction of the respective vibrating arms 200b, 200c as a longitudinal direction in the plan view seen from the third direction (the Z-axis direction).

The closed outer shape is line-symmetric with respect to a center line LC2 along the first direction as a straight line dividing an area determined by the outer shape into two halves.

Further, the arrangement of the first electrodes and the second electrodes (3 and 4, 7 and 6, 9 and 10) in the kth (k is one of 1, 2, and 3) region of one vibrating arm (200b) of the pair of vibrating arms (200b, 200c) adjacent to each other and the arrangement of the first electrodes and the second electrodes (3" and 4", 7" and 6", 9" and 10") in the kth region of the other vibrating arm (200c) form an arrangement in which the first electrodes and the second electrodes overlap each other when the one vibrating arm (200b) and the other vibrating arm (200c) are folded along the center line LC2.

That is, the electrode arrangement in which, in the first region ZA, the first electrodes 3 and 3" overlap and the second electrodes 4 and 4" overlap, in the second region ZB, the second electrodes 6 and 6" overlap and the first electrodes 7 and 7" overlap, and, in the third region ZC, the first electrodes 9' and 9 overlap and the second electrodes 10 and 10" overlap is employed.

By employing the electrode arrangement, a patterning step for dividing the penetration vias 20 and 20' into two is not necessary, and, in this respect, increase in the number of steps is suppressed. This will be explained specifically using FIGS. 20A to 20H.

FIGS. 20A to 20H are diagrams for explanation of an advantage of a line-symmetric arrangement of first electrodes and second electrodes with respect to a center line.

Figure 20A:
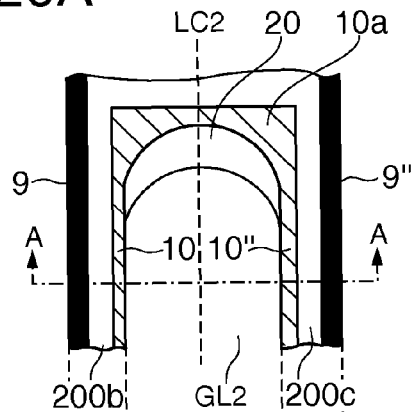
FIGS. 20A to 20H are diagrams for explanation of an advantage of a line-symmetric arrangement of first electrodes and second electrodes with respect to a center line.

FIG. 20A extracts and shows a region ZX surrounded by a dotted line in FIG. 19B. FIGS. 20B to 20E show a manufacturing process of a sectional structure along A-A line of two vibrating arms (200b, 200c) shown in FIG. 20A.

Figure 20F:
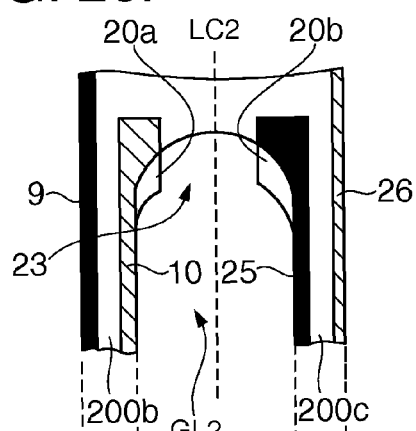
Figure 20B:
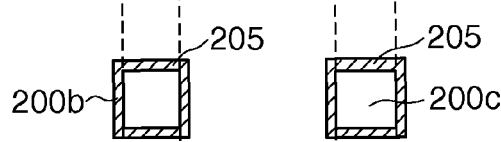
Figure 20C:
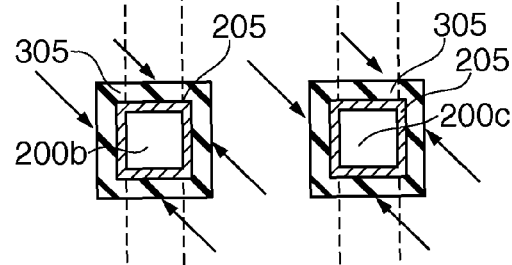
Figure 20G:
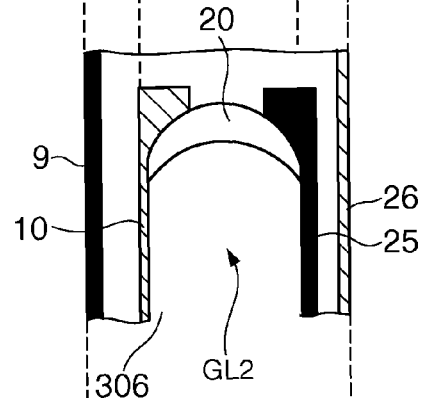
Figure 20D:
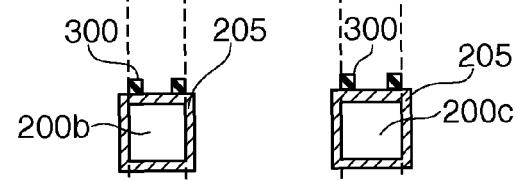
Figure 20H:
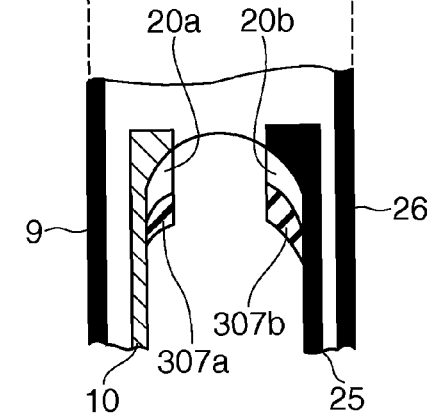
Figure 20E:
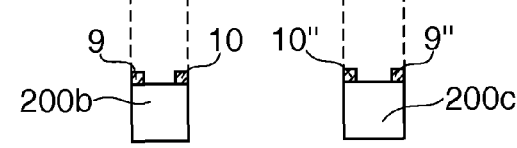

In FIG. 20B, a conducting film 205 is formed, in FIG. 20C, a resist film 305 is formed, in FIG. 20D, a resist pattern 300 is formed by patterning the resist film 305, and, in FIG. 20E, the conducting film 205 is patterned, and then, the resist pattern 300 is removed. Thereby, the structure shown in FIG. 20A is formed.

FIGS. 20F to 20H show the case where the first electrodes and the second electrodes are not line-symmetric.

It is assumed that the electrode arrangement of the adjacent second vibrating arm 200b and third vibrating arm 200c in the plan view is such that the first electrode 9, the second electrode 10, the through hole GL2 (the penetration via 20), the first electrode 25, and the second electrode 26 in this order in the positive second direction as shown in FIG. 20G.

Thereby, a problem that the second electrode 10 of the second vibrating arm 200b and the first electrode 25 of the third vibrating arm 200c at the different potentials are connected to the common penetration via 20 arises.

To avoid the problem, as shown in FIG. 20F, it is necessary to pattern the penetration via 20 and separate the penetration via 20 into a first part 20a connected to the second electrode 10 of the second vibrating arm 200b and a second part 20b connected to the first electrode 25 of the third vibrating arm 200c.

In this case, as shown in FIG. 20H, the patterning step of the penetration via 20 (application of the resist film 307, formation of the resist patterns 307a, 307b by the patterning of the resist film 307, patterning of the penetration via 20, and removal of the resist patterns 307a, 307b) is added, and the manufacturing load is increased.

On the other hand, by employing the electrode arrangement in FIG. 20A, the electrode arrangement of the first electrodes and the second electrodes of the adjacent second vibrating arm 200b and third vibrating arm 200c in the plan view is such that the first electrode 9, the second electrode 10, the through hole GL2 (the penetration via 20), the second electrode 10", and the first electrode 9" in this order in the positive second direction.

Thereby, the second electrode 10 of the second vibrating arm 200b and the second electrode 10" of the third vibrating arm 200c may be connected to the common penetration via 20, and thus, the patterning for dividing the penetration via 20 into two is unnecessary.

Therefore, compared to the case of employing the electrode pattern in FIG. 20F, the manufacturing load may be reduced.

Fifth Embodiment

Figure 21A:
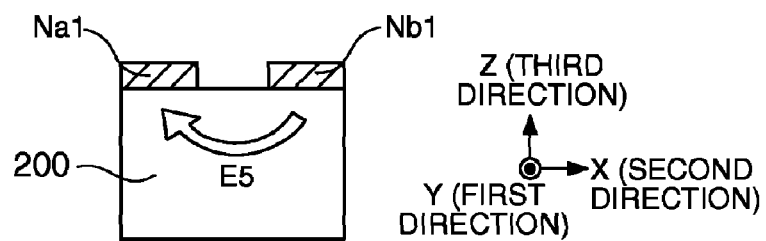
FIG. 21A and FIG. 21B are diagrams for explanation of an effect in the case where a groove (recess part) is provided at least on one of a front surface (the first surface) and a rear surface (the second surface) of one vibrating arm.
Figure 21B:
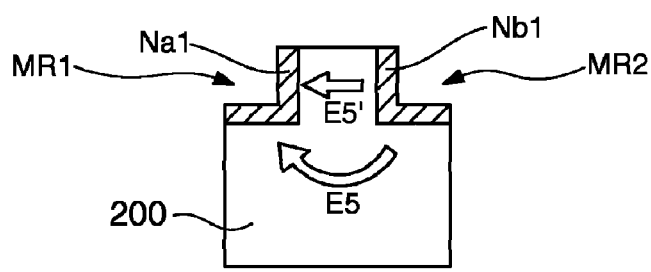

In the embodiment, a groove (recess part) is provided on at least one of the front surface (the first surface) and the rear surface (the second surface) of one vibrating arm. FIG. 21A and FIG. 21B are diagrams for explanation of an effect in the case where a groove is provided at least on the front surface and the rear surface of one vibrating arm.

FIG. 21A shows a cross-section of the vibrating arm 200 in the above embodiment. In FIG. 21A, an electric field E5 is generated from a second electrode Nb1 to a first electrode Na1 of the first region ZA. The electric field E5 contains an electric field component in the second direction (the horizontal electric field component: effective electric field) and an electric field component in the third direction (the vertical electric field component: ineffective electric field).

In the example of FIG. 21B, groove parts MR1, MR2 are formed on the left side surface side and the right side surface side of the front surface of the one vibrating arm. In the example of FIG. 21B, an electric field E5' (a horizontal electric field: an effective electric field) is additionally generated other than the electric field E5.

Therefore, by employing the structure of the vibrating arm shown in FIG. 21B, more horizontal electric fields (effective electric fields) may be applied to the quartz crystal (the piezoelectric material) forming the vibrating arm. This contributes to increase in the amplitude of the vibration.

FIGS. 22A to 22D show an example of a manufacturing method of a structure of the vibrating arm shown in FIG. 21B.

Figure 22A:
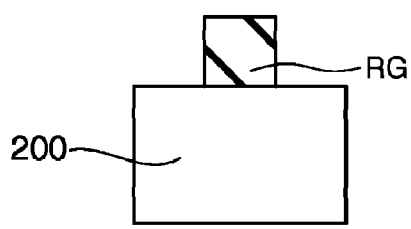
FIGS. 22A to 22D show an example of a manufacturing method of a structure of the vibrating arm shown in FIG. 21B.

As shown in FIG. 22A, a resist pattern RG is formed on a piezoelectric material (a material forming the vibrating arm 200) of quartz crystal or the like.

Figure 22C:
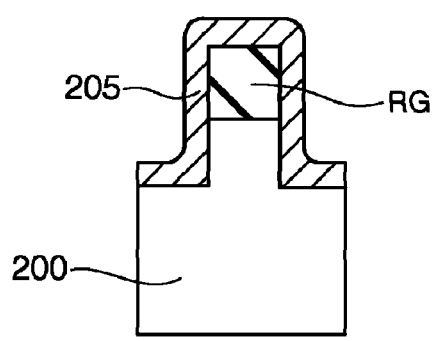
Figure 22B:
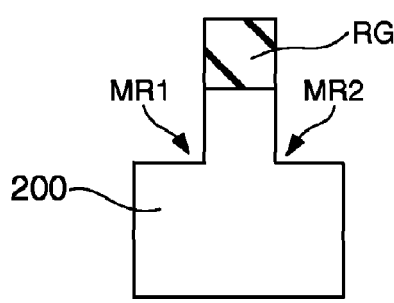

Then, as shown in FIG. 22B, groove parts MR1, MR2 are formed by selectively etching the piezoelectric material of quartz crystal or the like using the resist pattern RG as a mask.

Then, as shown in FIG. 22C, a conducting film 205 is formed on the piezoelectric material of quartz crystal or the like. Then, the resist pattern RG is removed (lifted off).

Figure 22D:
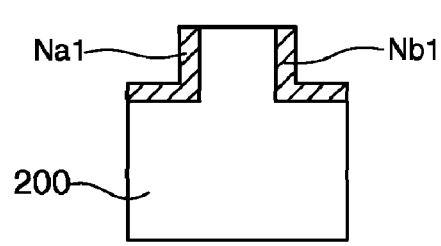

Thereby, the structure of the vibrating arm 200 as shown in FIG. 22D is formed.

Sixth Embodiment

Figure 23A:
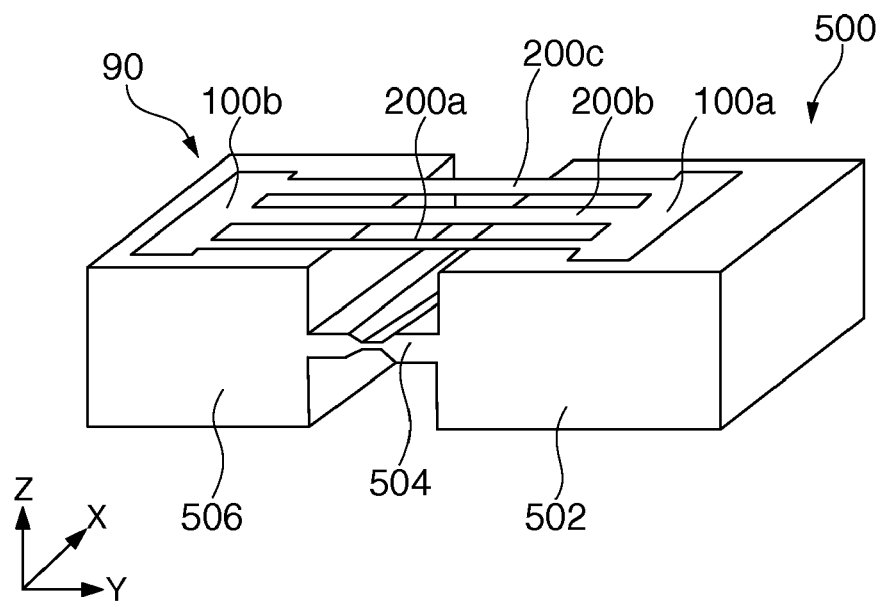
FIGS. 23A and 23B show configurations of an acceleration sensor device and an acceleration sensor apparatus using the vibrator element.
Figure 23B:
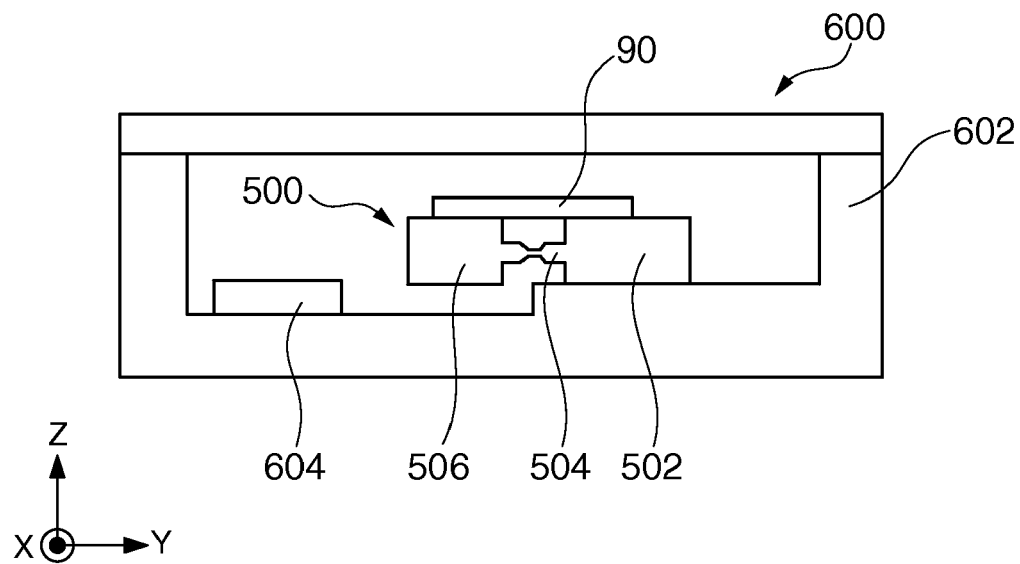

FIGS. 23A and 23B show configurations of an acceleration sensor device and an acceleration sensor apparatus (an acceleration sensor) using a double-tuning-fork vibrator element.

FIG. 23A is a perspective view of the acceleration sensor device using the double-tuning-fork vibrator element, and FIG. 23B is a sectional view of the acceleration sensor apparatus containing the acceleration sensor device within a package thereof.

An acceleration sensor device 500 (an example of the sensor device) in FIG. 23A is formed using a double-tuning-fork vibrator element 90 (the example shown in FIG. 17) having three vibrating arms (200a to 200c).

A first base part 100a of the double-tuning-fork vibrator element 90 is fixed to the first surface of a base part 502 using an adhesive agent, for example. Further, a second base part 100b of the double-tuning-fork vibrator element 90 is fixed to the first surface of a weight part (a mass part) 506 using an adhesive agent, for example. The respective vibrating arms 200a to 200c vibrate in the Z-axis direction at a predetermined frequency in the walk mode.

The weight part 506 is connected (coupled) to the base part 502 via an elastic part (including an elastic beam, a spring, or the like) 504, for example. When an acceleration is applied in the Z-axis direction, the weight part 506 displaces in the Z-axis direction. As a result, the frequency of the vibration in the respective vibrating arms 200a to 200c changes, and the magnitude of the acceleration may be detected (specified) by detecting the change of the frequency.

An acceleration sensor apparatus 600 shown in FIG. 23B has the acceleration sensor device 500 shown in FIG. 23B, an air-tight-sealed package (container) 602 containing the acceleration sensor device 500, and a physical quantity detection circuit 604. The pressure within the package is reduced (for example, in a vacuum state).

Figure 24:
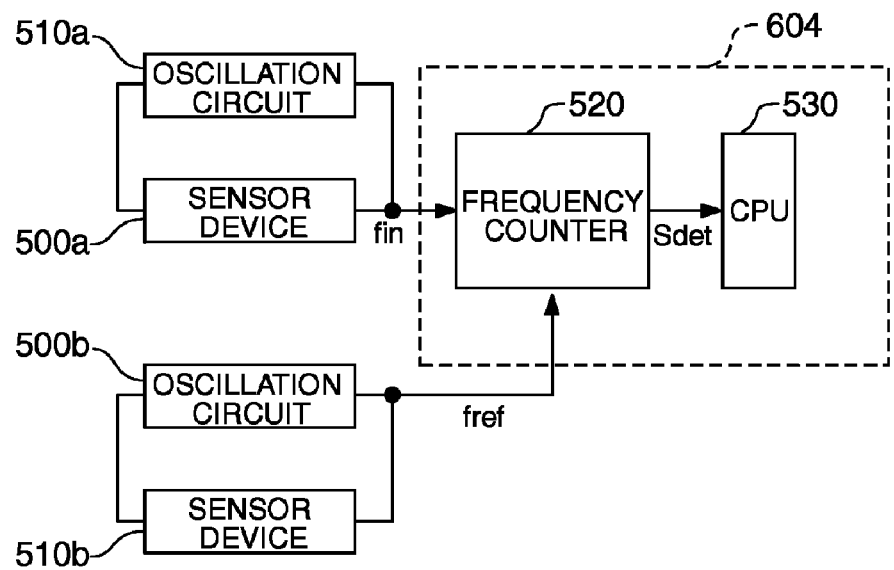
FIG. 24 shows a configuration example of a physical quantity detection circuit.
Figure 25:
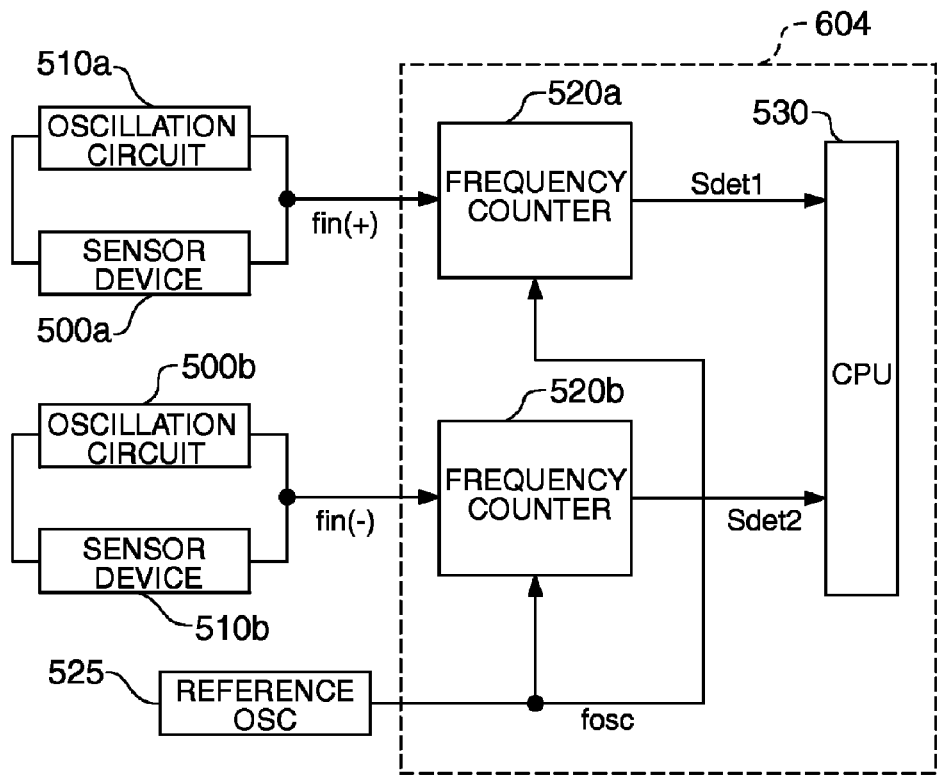
FIG. 25 shows another configuration example of the physical quantity detection circuit.

FIGS. 24 and 25 show configuration examples of a physical quantity detection circuit 604. The physical quantity detection circuit 604 shown in FIG. 24 has a frequency counter 520 and a CPU 530.

A first oscillation circuit 510a is connected to a sensor device 500a to form a first oscillation loop. A second oscillation circuit 510b is connected to a sensor device (oscillator) 500b to form a second oscillation loop.

To the frequency counter 520 forming the physical quantity detection circuit 604, a frequency signal fin from the sensor device 500a (the vibration frequency shifts from the reference frequency due to the change in acceleration), and a reference frequency signal fref from the sensor device (oscillator) 500b are input.

The frequency counter 520 measures (counts) a time length of one period, for example, of the frequency signal fin from the sensor device 500a using the reference frequency signal fref as a reference clock.

The frequency counter 520 outputs the measured count value as frequency shift information (Sdet), and the frequency shift information (Sdet) is input to the CPU 530.

The physical quantity detection circuit 604 shown in FIG. 25 has frequency counters 520a, 520b, and a CPU 530.

A first oscillation circuit 510a is connected to a sensor device 500a to form a first oscillation loop. A second oscillation circuit 510b is connected to a sensor device (oscillator) 500b to form a second oscillation loop.

To the frequency counter 520a forming the physical quantity detection circuit 604, a first frequency signal fin (+) from the sensor device 500a (the vibration frequency shifts from the reference frequency to the (+) side due to the change in acceleration), a second frequency signal fin (−) from the sensor device (oscillator) 500b (the vibration frequency shifts from the reference frequency to the (−) side due to the change in acceleration), and a reference oscillation signal fosc from a reference oscillation circuit (the reference OSC) 525 are input.

The frequency counter 520a measures (counts) a time length of one period, for example, of the frequency signal fin (+) from the sensor device 500a using the reference frequency signal fosc as a reference clock.

The frequency counter 520a outputs the measured count value as frequency shift information (Sdet1), and the frequency shift information (Sdet1) is input to the CPU 530.

Similarly, the frequency counter 520b measures (counts) a time length of one period, for example, of the frequency signal fin (−) from the sensor device (oscillator) 500b using the reference frequency signal fosc as a reference clock.

The frequency counter 520b outputs the measured count value as frequency shift information (Sdet2), and the frequency shift information (Sdet2) is input to the CPU 530.

In the circuit configuration example shown in FIG. 25, two acceleration sensor devices that output the frequency signals (fin (+), fin (−)) with different polarities are used.

On the other hand, the frequency signals (fin (+), fin (−)) with different polarities may be output by one acceleration sensor device. In this case, the acceleration sensor device having a structure as shown in FIG. 26 is used.

Figure 26:
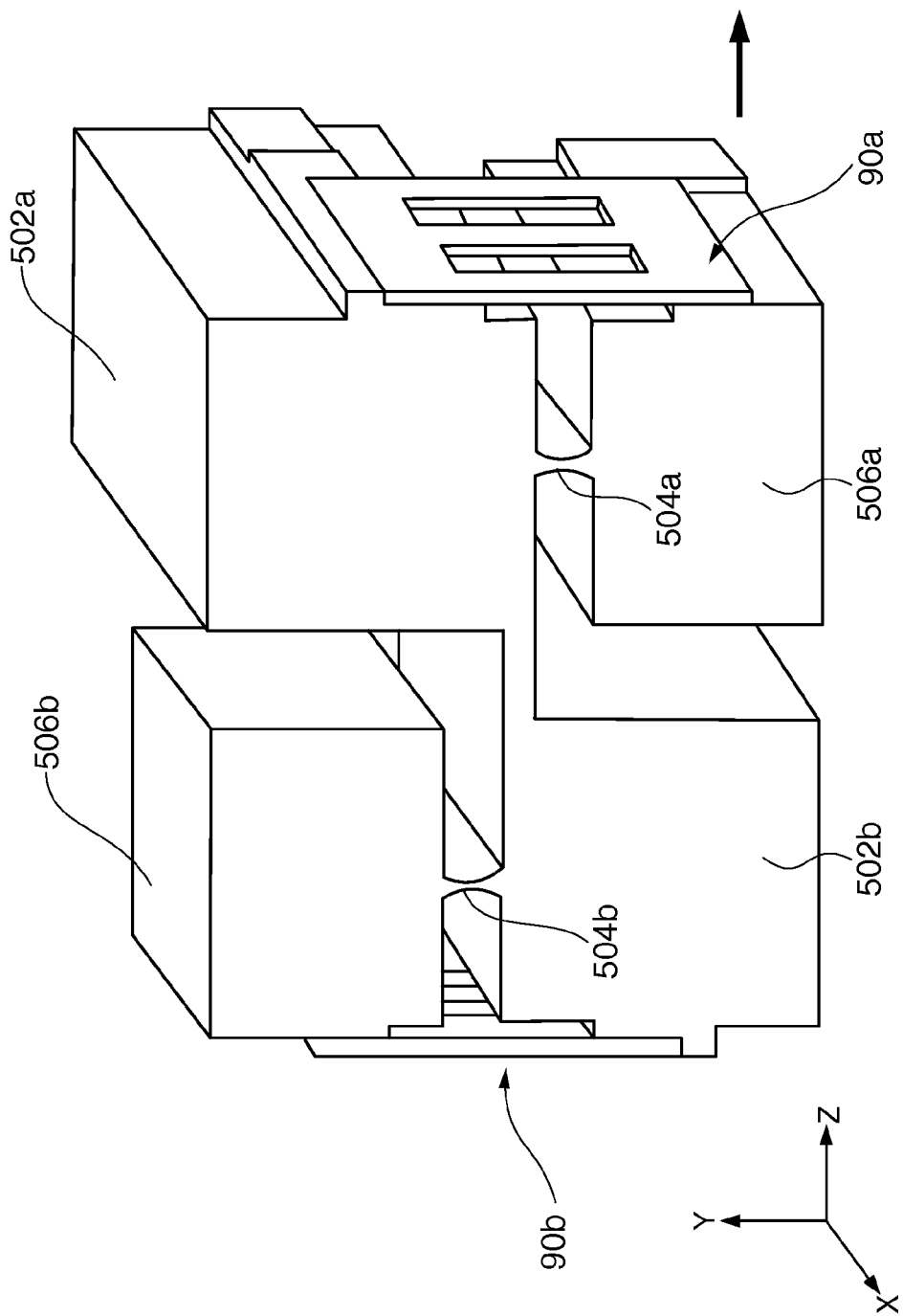
FIG. 26 is a perspective view showing an example of an acceleration sensor device including two vibrator elements.

FIG. 26 is a perspective view showing an example of an acceleration sensor device including two double-tuning-fork vibrator elements.

In the acceleration sensor device shown in FIG. 26, a first weight part 506a (a first mass part) is connected to a first base part 502a via a first elastic part (an elastic deformation part) 504a, and a second weight part 506b (a second mass part) is connected to a second base part 502b via a second elastic part (an elastic deformation part) 504b.

The respective base parts of a first double-tuning-fork vibrator element 90a are fixed to the respective first base part 502a and first weight part 506a. The respective base parts of a second double-tuning-fork vibrator element 90b are fixed to the respective second base part 502b and second weight part 506b.

Seventh Embodiment

Figure 27A:
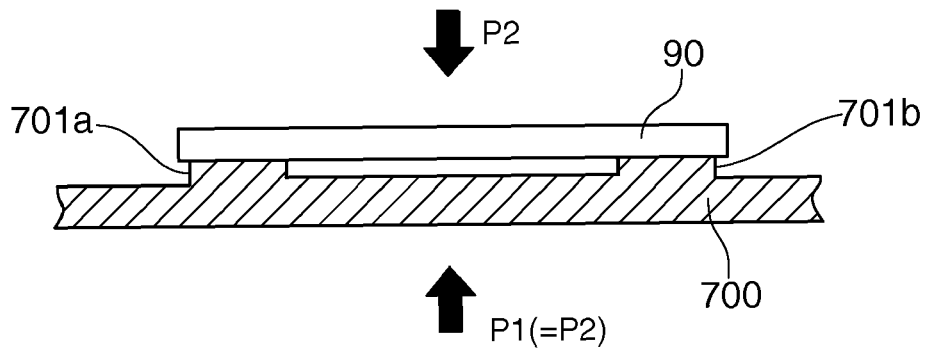
FIGS. 27A to 27C are diagrams for explanation of a principle of pressure detection of a pressure sensor device using the vibrator element.
Figure 27B:
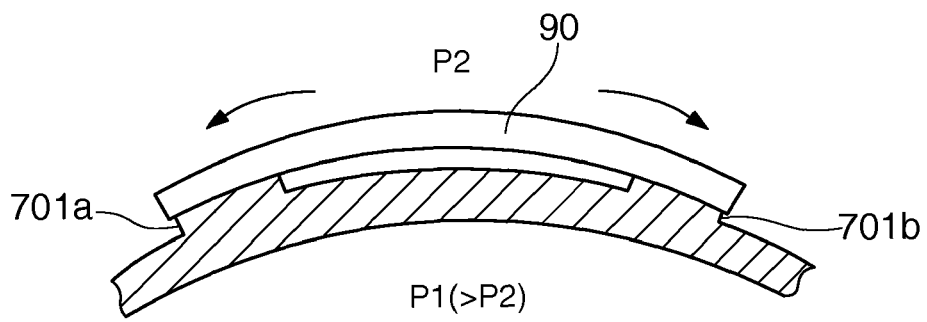
Figure 27C:
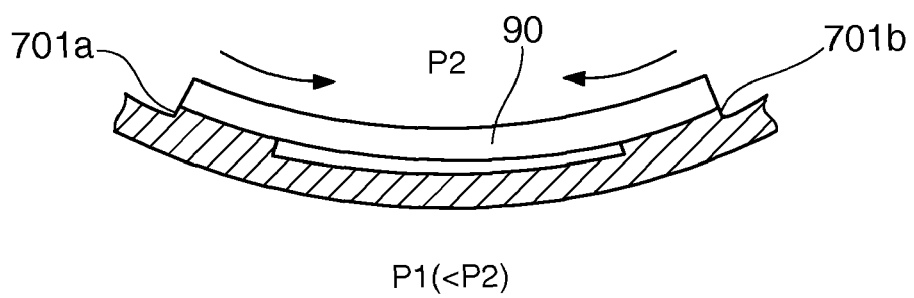

FIGS. 27A to 27C are diagrams for explanation of a principle of pressure detection of a pressure sensor device using a double-tuning-fork vibrator element (a vibrator element having a dual-support structure, may be a single beam structure).

FIG. 27A shows a state of a pressure sensor device with no pressure change, FIG. 27B shows a state of the pressure sensor device with a pressure change of P1>P2, and FIG. 27C shows a state of the pressure sensor device with a pressure change of P1<P2.

As shown in FIG. 27A, on a diaphragm (a partition wall formed by an elastic material of silicon or the like) 700, support parts 701a, 701b projected from a bottom surface are provided. The base parts (the respective first base part and second base part) of the double-tuning-fork vibrator element 90 are fixed onto the respective support parts 701a, 701b. The double-tuning-fork vibrator element 90 vibrates in vertical directions on the paper at a predetermined frequency in the walk mode.

Here, two spaces partitioned by the diaphragm 700 are an upper space and a lower space, and the pressure in the lower space is P1 and the pressure in the upper space is P2.

In the state of FIG. 27A, since P1=P2, no warpage is produced in the diaphragm 700.

In the state of FIG. 27B, since P1>P2, warpage is produced in the diaphragm 700, and the expansion force shown by the arrows in the drawing is generated in the double-tuning-fork vibrator element 90.

In the state of FIG. 27C, since P1<P2, warpage is produced in the diaphragm 700 in the opposite direction to that in FIG. 27B, and the contraction force shown by the arrows in the drawing is generated in the double-tuning-fork vibrator element 90.

In the state of FIG. 27B, from the double-tuning-fork vibrator element 90, for example, the frequency signal fin (+) shown in FIG. 24 is output. Further, in the state of FIG. 27C, the frequency signal fin (−) shown in FIG. 24 is output.

Therefore, using the detection circuit 604 in FIG. 24, a pressure change (given that the pressure as a target of detection is P1, the difference of the pressure P1 from the reference pressure P2) may be detected.

Figure 28A:
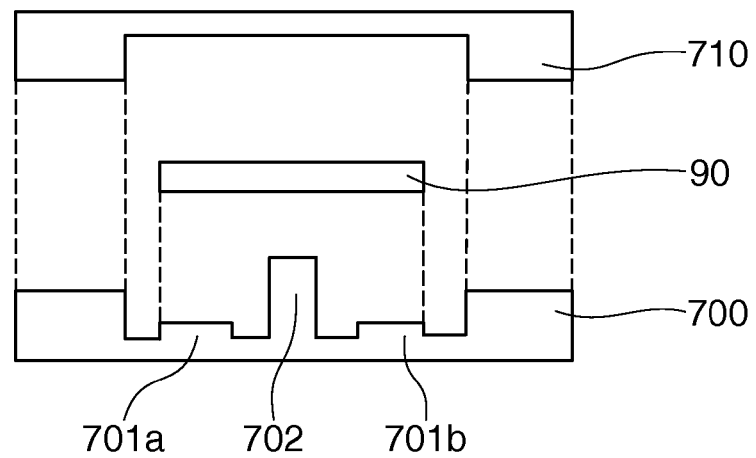
FIGS. 28A and 28B show a structure example of the pressure sensor device.
Figure 28B:
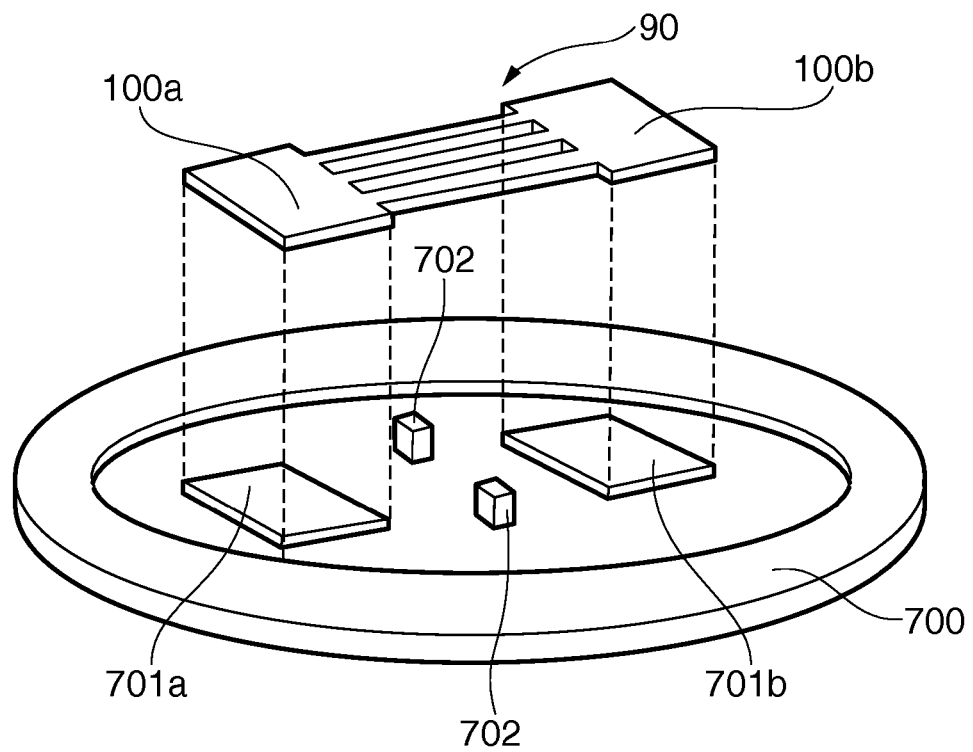

FIGS. 28A and 28B show a structure example of a pressure sensor device. FIG. 28A is a sectional view of the pressure sensor device, and FIG. 28B is a perspective view of the pressure sensor device.

As shown in FIG. 28B, the respective first base part 100*a* and second base part 100*b* of the double-tuning-fork vibrator element 90 are fixed to the respective support parts 701*a*, 701*b* provided on the diaphragm 700.

The double-tuning-fork vibrator element 90 is accurately positioned in a predetermined position by positioning lug parts 702. After the double-tuning-fork vibrator element 90 is fixed to the diaphragm 700, for example, as shown in FIG. 28A, a lid 710 is attached thereto.

Figure 29:
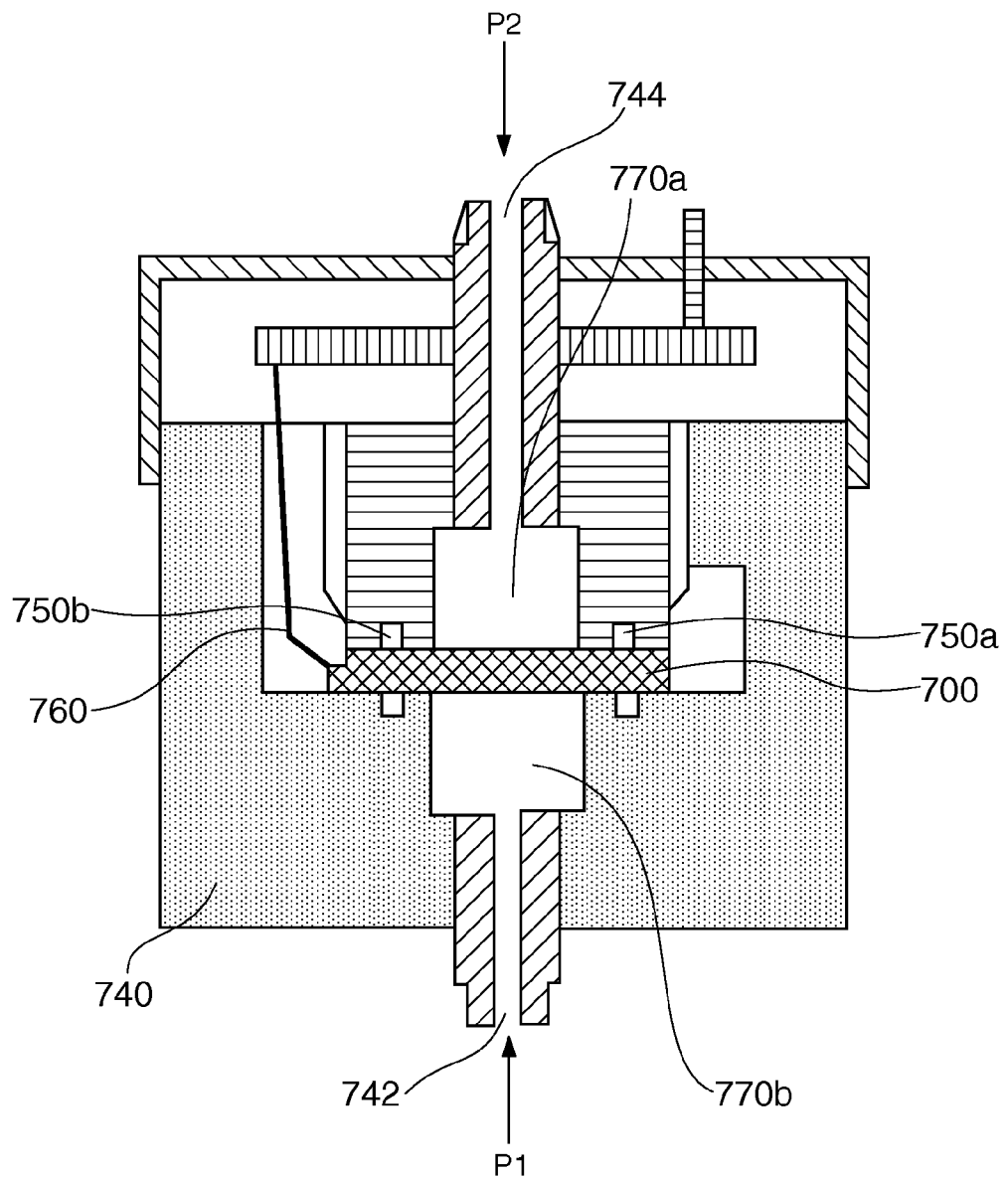
FIG. 29 is a sectional view of an example of a pressure sensor apparatus.
Figure 30A:
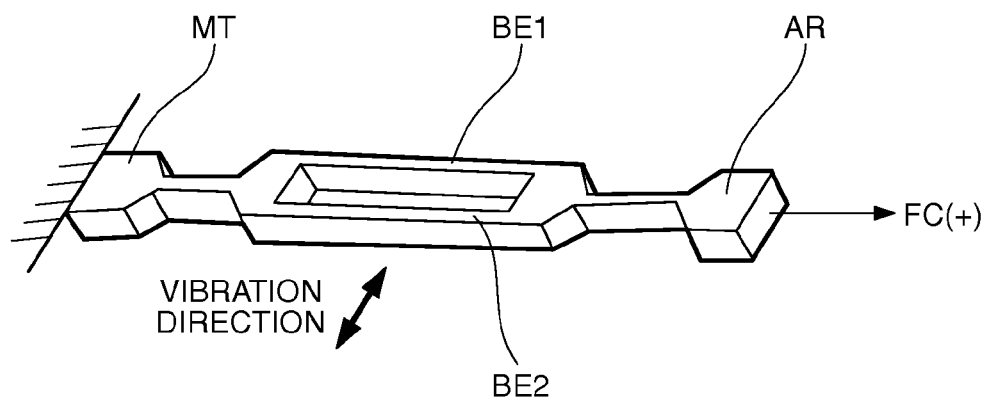
FIGS. 30A and 30B are diagrams for explanation of the configuration and the principle of the force sensing device described in Non-Patent Document 1.
Figure 30B:
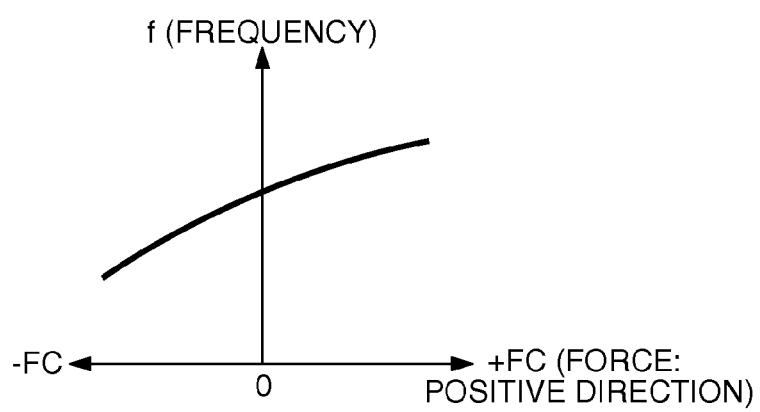

FIG. 29 is a sectional view of an example of a pressure sensor apparatus. As shown in FIG. 29, the diaphragm 700 is fixed to a main body part 740 using screws 750*a*, 750*b*, for example.

A pressure chamber (a space into which a gas is introduced) is separated into an upper chamber 770*a* and a lower chamber 770*b* by the diaphragm 700. An introduction path 744 for introducing a first gas (pressure P2) communicates with the upper chamber 770*a*. An introduction path 742 for introducing a second gas (pressure P1) communicates with the lower chamber 770*b*.

Note that the reference sign 760 denotes electric wiring (power supply wiring and signal wiring) connected to a pressure sensor device (not shown) attached to the diaphragm 700.

In this manner, using the vibrator element according to the invention, a force sensing sensor device (for example, an acceleration sensor device or a pressure sensor device) may be realized.

In the case of the pressure sensor device, at least one base part of a vibrator element is connected (fixed) to a diaphragm (a diaphragm that deforms in response to pressure) as an elastic material. Further, in the case of an acceleration sensor, a mass part (a weight part) is connected (fixed) to an elastic material (for example, an elastic beam, a spring, or the like), for example, and at least one base part of a vibrator element is connected (fixed) to the mass part.

In a state in which the vibrator element is excited in the walk mode, when a physical quantity (pressure or acceleration) of a target of measurement changes, and accordingly, if the mass part connected to the elastic part (for example, the diaphragm) or the elastic material displaces, in at least one vibrating arm, expansion and contraction along the extension direction of the vibrating arm are generated, and the frequency of the resonance vibration changes.

The change in the frequency of the vibration is converted into an electric signal and detected as a change in direct-current level of the detection signal or the like using a detection circuit, for example, and thereby, the physical quantity may be measured.

Since the vibrator element is small as described above, and designed to effectively improve the detection sensitivity, a small sensor device with high sensitivity (high resolution) may be realized.

Further, the sensor (sensor apparatus) has at least one sensor device and a container (package) containing the sensor device.

For example, an acceleration sensor is realized by placing an acceleration sensor device (including a mass part, an elastic part, and a vibrator element with a base part fixed to the mass part) within the package (container), reducing the pressure within the package, and air-tightly sealing it.

Further, for example, a pressure sensor is realized by placing a pressure sensor device (a diaphragm as an elastic material (including a vibrator element with a base part fixed to the diaphragm)) within a container and partitioning a hollow part within the container into two regions (a first hollow region and a second hollow region) by the diaphragm.

As described above, the invention has been explained using some embodiments, however, the invention is not limited to those, but persons skilled in the art could easily understand that various modifications may be made without departing from the technical idea of the invention. Therefore, all of the modified examples fall within the scope of the invention. For example, in the specifications and drawings, terms described with terms in broader senses or synonyms at least at once may be replaced by the different terms in any part of the specifications or drawings.

The vibrator element of the embodiment of the invention may be used as an oscillator, for example. The oscillator is manufactured by containing the vibrator element in a package and air-tightly sealing the package in a vacuum state, for example. The oscillator may be used as a component part of an oscillation circuit, for example.

Further, the vibrator element of the embodiment of the invention may be used as various sensor devices or sensors.

Electronic Apparatus

Subsequently, an electronic apparatus including the above described vibrator element will be explained. Note that its illustration will be omitted.

The vibrator element may preferably be used as a sensing device or a timing device for an electronic apparatus such as a digital still camera, a video camera, a navigation system, a pointing device, a game controller, a cellular phone, an electronic book, a personal computer, a television, a video recorder, a pager, an electronic organizer, a calculator, a word processor, a work station, a video phone, a POS terminal, and equipment having a touch panel as a sensing device or a timing device, and an electronic apparatus that exerts effects explained in the above described embodiments may be provided in any case.

As an example, the vibrator element may provide an electronic apparatus including a small sensor with good detection sensitivity.

The entire disclosure of Japanese Patent Application No. 2010-060336, filed Mar. 17, 2010 and No. 2010-248165, filed Nov. 5, 2010 are expressly incorporated by reference herein.

What is claimed is:

1. A vibrator element comprising:
    a base part; and
    a vibrating arm extended from the base part in a first direction,
    the vibrating arm including a first region, a second region, and a third region sequentially arranged from the base part side in the first direction,
    the first region to the third region including first electrodes and second electrodes that generate electric fields in second directions perpendicular to the first direction in a plan view and are electrically independent from each other,
    wherein electric field directions of the first region and the third region and an electric field direction of the second region are opposite to each other, and
    the vibrating arm is expanded and contracted in the first direction by the electric fields in the second directions, and the vibrating arm is vibrated in third directions as directions perpendicular to the respective first direction and second directions.

2. The vibrator element according to claim 1, wherein, given that a width in the second directions in the vibrating arm is w and a thickness in the third directions is t, w>t is satisfied.

3. The vibrator element according to claim 1, wherein the vibrating arm has a first surface perpendicular to the third direction, a second surface opposed to the first surface, a third surface perpendicular to the second direction, and a fourth surface opposed to the third surface,
  in the vibrating arm, the first electrodes of the first region and the third region are provided at the third surface side on the first surface and the second electrodes of the first region and the third region are provided at the fourth surface side on the first surface, and
  in the vibrating arm, the first electrode of the second region is provided at the fourth surface side on the first surface and the second electrode of the second region is provided at the third surface side on the first surface.

4. The vibrator element according to claim 3, wherein a first wiring for connecting the first electrode of the first region and the first electrode of the second region is provided on the first surface,
  a second wiring for connecting the second electrode of the first region and the second electrode of the second region is provided via the fourth surface, the second surface, and the third surface,
  a third wiring for connecting the first electrode of the second region and the first electrode of the third region is provided via the fourth surface, the second surface, and the third surface, and
  a fourth wiring for connecting the second electrode of the second region and the second electrode of the third region is provided on the first surface.

5. The vibrator element according to claim 4, wherein the first wiring is diagonally extracted and extends on the first surface,
  a wiring part provided on the second surface in the second wiring is diagonally extracted and extends,
  the first wiring and the wiring part provided on the second surface in the second wiring partially cross in a plan view seen from the third direction,
  a wiring part provided on the second surface in the third wiring is diagonally extracted and extends,
  the fourth wiring is diagonally extracted and extends on the first surface, and
  the wiring part provided on the second surface of the third wiring and the fourth wiring partially cross in the plan view seen from the third direction.

6. The vibrator element according to claim 1, wherein a first node region containing a node of the vibration is provided between the first region and the second region, and a second node region containing a node of the vibration is provided between the second region and the third region.

7. The vibrator element according to claim 1, further comprising a first base part and a second base part as the base part,
  wherein one end of the vibrating arm is connected to the first base part and the other end is connected to the second base part.

8. The vibrator element according to claim 1, using quartz crystal.

9. A sensor device including the vibrator element according to claim 1.

10. A sensor comprising:
  the sensor device according to claim 9; and
  a container that contains the sensor device.

11. An electronic apparatus comprising the vibrator element according to claim 1.

* * * * *